(12) United States Patent
Lee et al.

(10) Patent No.: US 12,342,545 B2
(45) Date of Patent: Jun. 24, 2025

(54) SWITCHING ELEMENT

(71) Applicant: SK hynix Inc., Icheon-si (KR)

(72) Inventors: Dong Uk Lee, Icheon-si (KR); Hae Chang Yang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 18/631,560

(22) Filed: Apr. 10, 2024

(65) Prior Publication Data

US 2024/0260273 A1 Aug. 1, 2024

Related U.S. Application Data

(62) Division of application No. 17/183,290, filed on Feb. 23, 2021, now Pat. No. 11,985,829.

(30) Foreign Application Priority Data

Mar. 2, 2020 (KR) .................. 10-2020-0025786
Sep. 29, 2020 (KR) .................. 10-2020-0126547

(51) Int. Cl.
*H10D 30/00* (2025.01)
*H10B 43/35* (2023.01)
(Continued)

(52) U.S. Cl.
CPC ............. *H10B 43/35* (2023.02); *H10B 51/20* (2023.02); *H10D 30/0415* (2025.01); *H10D 30/701* (2025.01)

(58) Field of Classification Search
CPC .......... H01L 29/78391; H01L 29/6684; H10B 51/20; H10B 43/35; H10D 30/0415; H10D 30/701
See application file for complete search history.

(56) References Cited

U.S. PATENT DOCUMENTS 10,068,912 B1 * 9/2018 Singh ................ H01L 29/40117
10,096,619 B2 10/2018 Ino et al.
(Continued)

FOREIGN PATENT DOCUMENTS

CN 105702738 A 6/2016
CN 106057873 A 10/2016
(Continued)

OTHER PUBLICATIONS

Asif Islam Khan et al., Negative capacitance in a ferroelectric capacitor, Dec. 15, 2014, pp. 1-18, Nature Materials, Nature Materials ISSN 1476-4660 (online), https://www.nature.com/articles/nmat4148, Springer Nature Limited.
(Continued)

*Primary Examiner* — Reema Patel
(74) *Attorney, Agent, or Firm* — WILLIAM PARK & ASSOCIATES LTD.

(57) ABSTRACT

A switching element comprising: a first gate dielectric layer formed over a substrate; a second gate dielectric layer formed over the first gate dielectric layer to overlap a part of the first gate dielectric layer, and including a ferroelectric material; a second gate electrode formed over the second gate dielectric layer; and a first gate electrode located
(Continued)

between the first and second gate dielectric layers, and configured to control the second gate dielectric layer to selectively have negative capacitance.

7 Claims, 38 Drawing Sheets

(51) Int. Cl.
  *H10B 51/20* (2023.01)
  *H10D 30/01* (2025.01)
  *H10D 30/69* (2025.01)

(56) References Cited

U.S. PATENT DOCUMENTS

| | | | |
|---|---|---|---|
| 10,210,921 B1 | 2/2019 | Hwang | |
| 2017/0062471 A1 | 3/2017 | Son et al. | |
| 2017/0141118 A1* | 5/2017 | Naito | G11C 16/0483 |
| 2019/0198525 A1 | 6/2019 | Arreghini | |

FOREIGN PATENT DOCUMENTS

| | | |
|---|---|---|
| CN | 108231873 A | 6/2018 |
| CN | 109994477 A | 7/2019 |
| CN | 110010688 A | 7/2019 |
| JP | 200185542 A | 3/2001 |
| KR | 101909071 B1 | 12/2018 |
| KR | 1020190105179 A | 9/2019 |
| KR | 1020200005419 A | 1/2020 |

OTHER PUBLICATIONS

Chang-Hwan Shin et al., Introduction to Negative Capacitance FET and development trend, Feb. 2017, pp. 9-12, vol. 236, IDEC.

Giovanni A. Salvatore et al., Experimental confirmation of temperature dependent negative capacitance in ferroelectric field effect transistor, Applied Physics Letters 100, 163504, https://doi.org/10.1063/1.4704179; Apr. 20, 2012, p. 1-4, American Institute of Physics.

H. W. Then et al., Experimental Observation and Physics of "Negative" Capacitance and Steeper than 40mV/decade Subthreshold Swing in Al0.83In0. 17N/AlN/GaN MOS-HEMT on SiC Substrate, IEDM13, Jan. 30, 2014, pp. 691-694, IEEE Xplore, Washington, DC, USA.

Hyunjae Lee et al., Current-Voltage Model for Negative Capacitance Field-Effect Transistors, IEEE Electron Device Letters, vol. 38, No. 5, May 2017; p. 669-p. 672, IEEE.

Sayeef Salahuddin et al., Use of Negative Capacitance to Provide Voltage Amplification for Low Power Nanoscale Devices, Nano Letters 2008, Dec. 6, 2007, pp. 405-410, vol. 8, No. 2, American Chemical Society.

Y. G. Xiao et al., Simulation of electrical characteristics in negative capacitance surrounding-gate ferroelectric field-effect transistors, Applied Physics Letters 101, 253511, https://doi.org/10.1063/1.4772982, Dec. 19, 2012, pp. 1-4, American Institute of Physics.

* cited by examiner

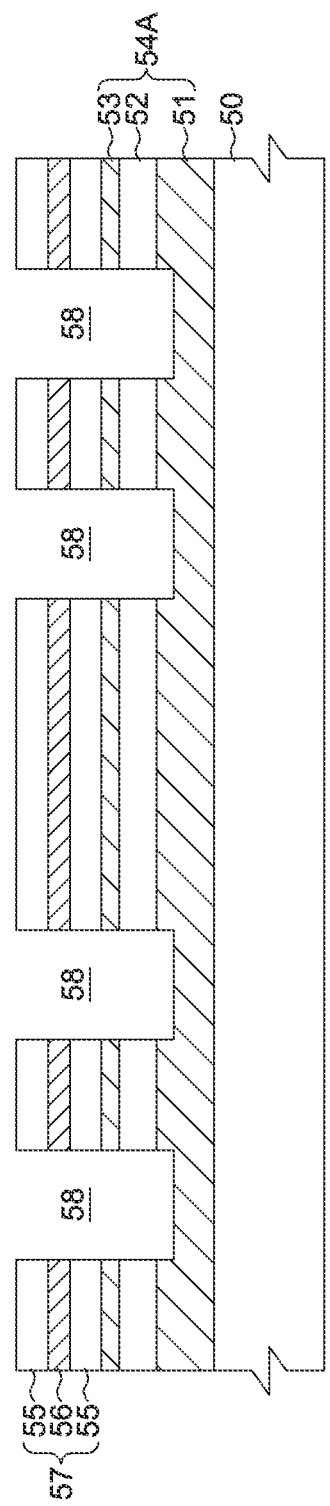

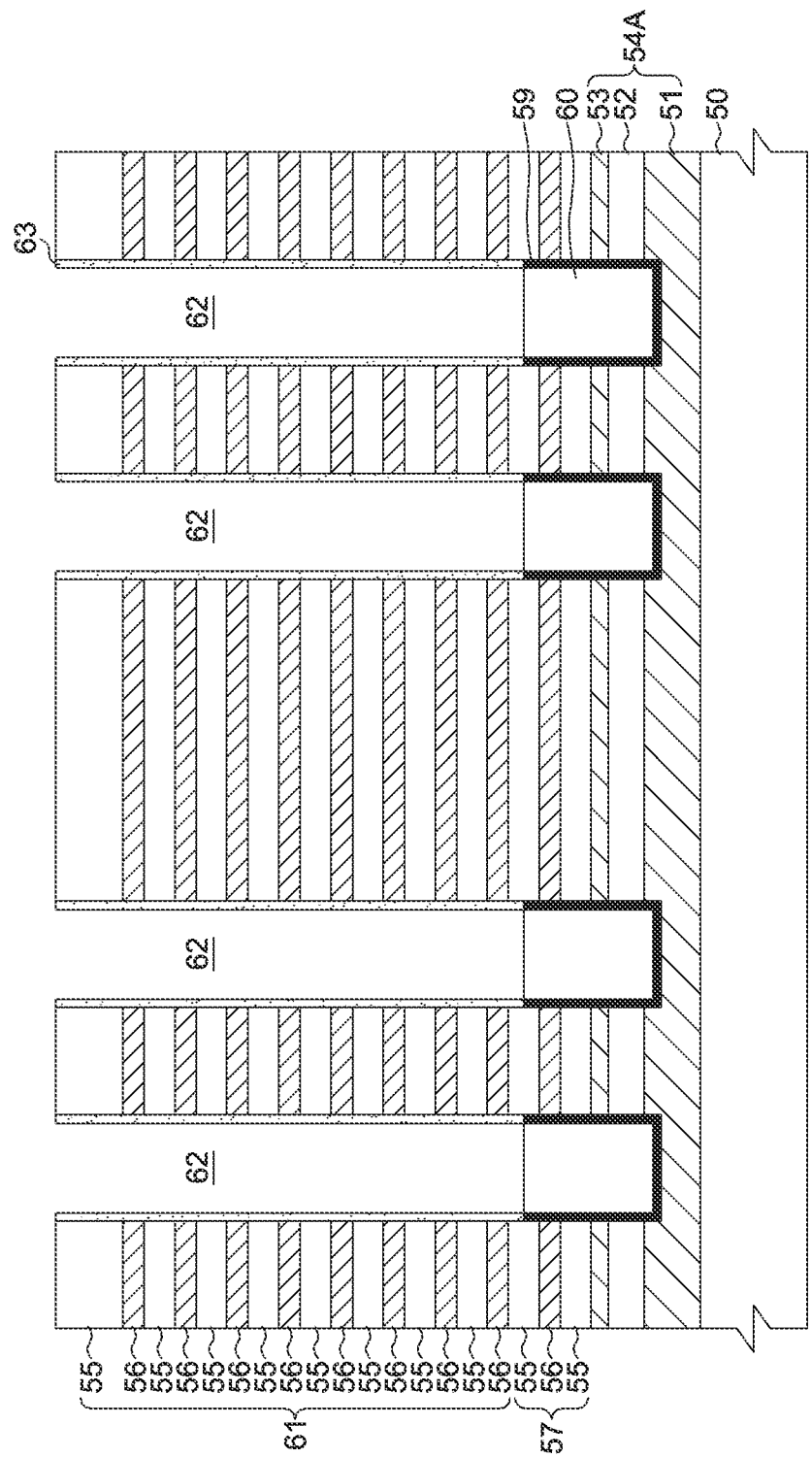

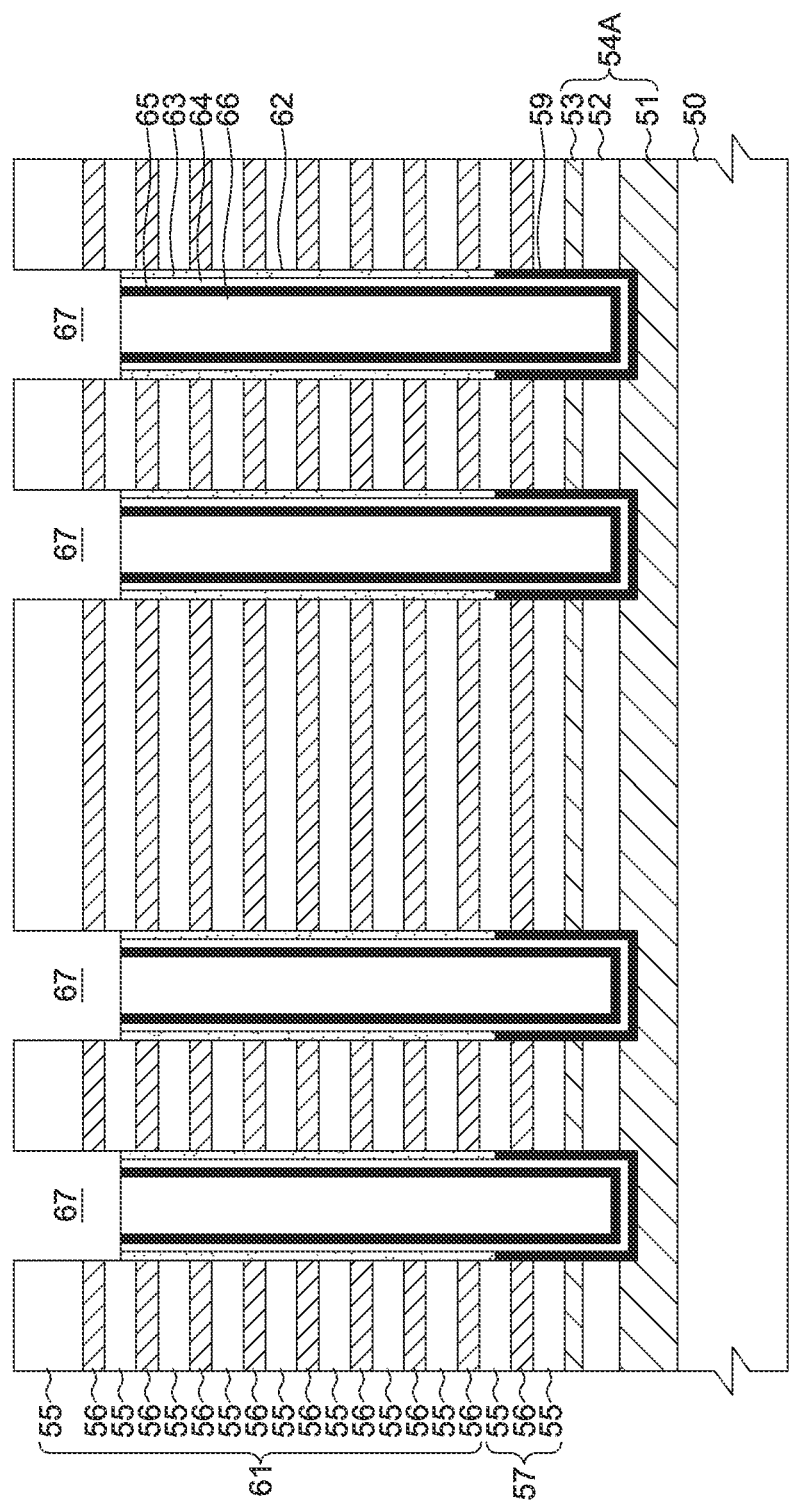

SWITCHING ELEMENT

CROSS-REFERENCES TO RELATED APPLICATION

The present application is a divisional application of U.S. patent application Ser. No. 17/183,290, filed on Feb. 23, 2021 which claims priority under 35 U.S.C. § 119(a) to Korean application number 10-2020-0025786, filed on Mar. 2, 2020, and 10-2020-0126547, filed on Sep. 29, 2020, in the Korean Intellectual Property Office, which applications are incorporated herein by reference in their entirety.

BACKGROUND

1. Technical Field

Various embodiments generally relate to an electronic device, and more particularly, to a switching element including a negative capacitor, a semiconductor memory device including the switching element, and a method for fabricating the semiconductor memory device.

2. Related Art

In order to satisfy excellent performance and a low price, which are demanded by consumers, the degree of integration of a semiconductor device needs to be improved. In particular, since the degree of integration of the semiconductor memory device is an important factor to decide the performance and price of a product, various attempts are being made to improve the degree of integration. For example, in the semiconductor memory device including a plurality of memory cells, research is being actively conducted on a 3D semiconductor memory device which includes memory cells arranged in a 3D manner, and thus can reduce an area occupied by memory cells per unit area of a substrate.

SUMMARY

In an embodiment, a switching element may include: a first gate dielectric layer formed over a substrate; a second gate dielectric layer formed over the first gate dielectric layer to overlap a part of the first gate dielectric layer, and including a ferroelectric material; a second gate electrode formed over the second gate dielectric layer; and a first gate electrode located between the first and second gate dielectric layers, and configured to control the second gate dielectric layer to selectively have negative capacitance.

In an embodiment, a switching element may include: a first gate stack formed over a substrate; and one or more second gate stacks formed over the substrate and neighboring the first gate stack. The first gate stack may include a first gate dielectric layer, a first gate electrode, a second gate dielectric layer and a second gate electrode, which are sequentially stacked over the substrate, the second gate dielectric layer including a ferroelectric material having negative capacitance in response to a bias applied to the first gate electrode, and the second gate stack may include a third gate dielectric layer, a fourth gate dielectric layer and a third gate electrode, which are sequentially stacked over the substrate, the fourth gate dielectric layer including a ferroelectric material having self-induced negative capacitance.

In an embodiment, a switching element may include: a first gate stack formed over a substrate; and a second gate stack formed over the substrate and neighboring the first gate stack. The first gate stack may include a first gate dielectric layer, a second gate dielectric layer and a first gate electrode, which are sequentially stacked over the substrate, the second gate dielectric layer including a ferroelectric material having self-induced negative capacitance, and the second gate stack may include a memory layer and a second gate electrode, which are sequentially stacked over the substrate, the memory layer including a charge trapping layer.

In an embodiment, a semiconductor memory device may include: a plurality of memory cells configured to share a channel structure; and a first switching element configured to share the channel structure and coupled to one sides of the memory cells. The first switching element may include: a first gate dielectric layer surrounding the channel structure; a first gate electrode surrounding the first gate dielectric layer; a second gate dielectric layer surrounding a part of the first gate electrode, and including a ferroelectric material having negative capacitance in response to a bias applied to the first gate electrode; and a second gate electrode surrounding the second gate dielectric layer and having a planar shape.

In an embodiment, a semiconductor memory device may include: a plurality of memory cells configured to share a channel structure; and a first switching element configured to share the channel structure and coupled to one sides of the memory cells. The first switching element may include a first gate structure and a second gate structure which are stacked to be spaced apart from each other. The first gate structure may include a first gate dielectric layer surrounding the channel structure, a second gate dielectric layer surrounding the first gate dielectric layer and including a ferroelectric material having self-induced negative capacitance, and a first gate electrode surrounding the second gate dielectric layer and having a planar shape, and the second gate structure may include a memory layer surrounding the channel structure and including a charge trapping layer and a second gate electrode surrounding the memory layer and having a planar shape.

In an embodiment, a method for fabricating a semiconductor memory device may include: forming a first stacked body over a substrate, the first stacked body including one or more first material layers and one or more second material layers, which are alternately stacked therein; forming a first opening through the first stacked body; forming a second gate dielectric layer on a sidewall of the first opening, the second gate dielectric layer including a ferroelectric material; forming the second material layer on the first stacked body and the sidewall of the first opening having the second gate dielectric layer formed thereon; sequentially forming a first gate dielectric layer and a channel layer on a sidewall of the second material layer within the first opening; removing the second material layer; and forming a first gate electrode and a second gate electrode by gap-filling the space, from which the second material layer is removed, with a conductive material, wherein the first gate electrode is located between the first and second gate dielectric layers, and the second gate electrodes abuts on the second gate dielectric layer.

In an embodiment, a method for fabricating a semiconductor memory device may include the steps of: forming a first stacked body over a substrate, the first stacked body including one or more first material layers and one or more second material layers, which are alternately stacked therein; forming a first opening through the first stacked body; forming a second gate dielectric layer along the surface of the first opening, the second gate dielectric layer including a ferroelectric material; forming a second stacked body over the first stacked body, the second stacked body including the plurality of first material layers and the plurality of second material layers, which are alternately stacked therein; forming a second opening through the second stacked body such that the second opening is connected to the first opening; forming a memory layer on a sidewall of the second opening; sequentially forming a first gate dielectric layer and a channel layer along the surfaces of the first and second openings; removing the second material layer; and forming a gate electrode and a control gate by gap-filling the space, from which the second material layer is removed, with a conductive material, wherein the gate electrode abuts on the second gate dielectric layer, and the control gate abuts on the memory layer.

BRIEF DESCRIPTION OF THE DRAWINGS

FIGS. 15A, 15B, 15C, 15D, 15E, 15F, 15G, 15H, and 15I are cross-sectional views illustrating a method for fabricating a semiconductor memory device in accordance with an embodiment.

DETAILED DESCRIPTION

Figure 1:
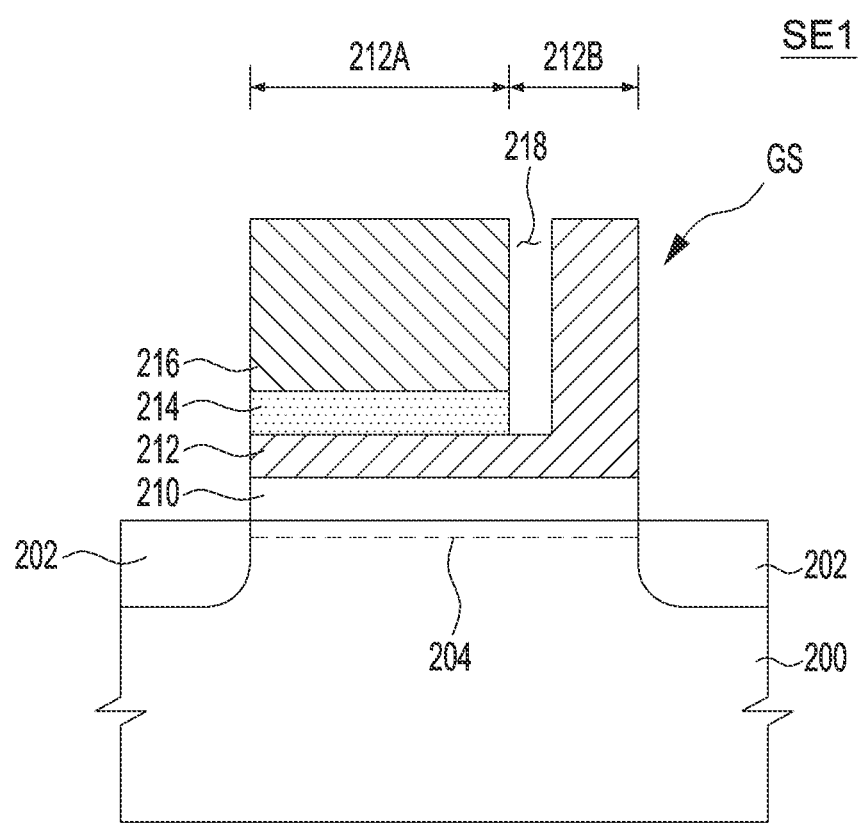
FIG. 1 is a cross-sectional view illustrating a switching element in accordance with an embodiment.

The advantages and characteristics of the present disclosure and a method for achieving the advantages and characteristics will be apparent through embodiments described below with reference to the accompanying drawings. However, the present disclosure may be embodied in different forms and should not be construed as limited to the embodiments set forth herein. The present disclosure is only defined by the scope of claims. In the drawings, the sizes and relative sizes of layers and regions may be exaggerated in order to clarify the description. Through the specification, like reference numerals represent the same components. It is also understood that when a layer is referred to as being "on" another layer or substrate, it can be directly on the other layer or substrate, or intervening layers may also be present. In the description of the present disclosure, the terms "first" and "second" may be used to describe various components, but the components are not limited by the terms. The terms may be used to distinguish one component from another component. For example, a first component may be called a second component and a second component may be called a first component without departing from the scope of the present disclosure.

The following embodiments intend to provide a switching element capable of improving operation speed, a semiconductor memory device including the switching element and capable of improving operation reliability, and a method for fabricating the same.

To this end, the switching element in accordance with an embodiment may include an NCFET (Negative Capacitor Field Effect Transistor). For reference, the NCFET may be implemented to have a subthreshold swing (SS) of 60 mV/dec (Boltzmann tyranny) or less, which is known as a physical limit. It is known that the NCFET can lower the subthreshold swing to about 10 mV/dec.

Various embodiments are directed to a switching element capable of improving operation speed and operation reliability, a semiconductor memory device including the switching element, and a method for fabricating the same.

In accordance with the present embodiments, it may be possible to provide the gate structure including the negative capacitor and capable of easily controlling negative capacitance, thereby improving the operation speeds and the operation reliabilities of the switching element and the semiconductor memory device including the same.

Hereafter, the switching element in accordance with the present embodiment will be described in detail with reference to the drawings.

FIG. 1 is a cross-sectional view illustrating a switching element in accordance with an embodiment.

As illustrated in FIG. 1, a switching element SE1 in accordance with an embodiment may include a gate stack GS and junction regions 202. The gate stack GS may include a first gate dielectric layer 210, a first gate electrode 212, a second gate dielectric layer 214 and a second gate electrode 216, which are sequentially stacked thereon. The second gate dielectric layer 214 may include a ferroelectric material which selectively has negative capacitance. The junction regions 202 may be formed in a substrate 200 on both sides of the gate stack GS. The substrate 200 may have a channel 204 formed at the surface thereof under the gate stack GS, and the channel 204 may electrically couple the junction regions 202 in response to a bias applied to the gate stack GS.

The gate stack GS of the switching element SE1 may include a negative capacitor. At this time, the negative capacitor may include the first gate electrode 212, the second gate dielectric layer 214 and the second gate electrode 216, which overlap one another. The first gate dielectric layer 210 may be formed on the substrate 200, and include oxide or nitride. For example, the first gate dielectric layer 210 may include a single layer formed of any one element selected from the group consisting of silicon oxide ($SiO_2$), silicon nitride ($Si_3N_4$), hafnium oxide ($HfO_2$), zirconium oxide ($ZrO_2$), lanthanum oxide ($La_2O_3$), aluminum oxide ($Al_2O_3$) and titanium oxide ($TiO_2$), or a multilayer in which two or more elements selected from the group are stacked.

The first gate electrode 212 may serve to implement a negative capacitor by varying capacitance of the second gate dielectric layer 214 including a ferroelectric material. For example, the second gate dielectric layer 214 may have positive capacitance in a thermal equilibrium state. The thermal equilibrium state indicates a state in which no external force is applied to the second gate dielectric layer 214. For example, the thermal equilibrium state may indicate a state in which no bias is applied to the first gate electrode 212. On the other hand, the second gate dielectric layer 214 may have negative capacitance in response to a bias applied to the first gate electrode 212. For this structure, the first gate electrode 212 may include a first region 212A and a second region 212B. The first region 212A may be inserted between the first gate dielectric layer 210 and the second gate dielectric layer 214, and the second region 212B may be extended from the first region 212A so as to neighbor on one sidewall of the second gate electrode 216 with a gap 218 provided therebetween.

In the first gate electrode 212, the first region 212A may serve to vary the capacitance of the second gate dielectric layer 214. The second region 212B of the first gate electrode 212 may serve to receive, from the outside of the second region 212B, a bias for varying the capacitance of the second gate dielectric layer 214. Although not illustrated in the drawings, the space between the second region 212B of the first gate electrode 212 and the second gate electrode 216 may be gap-filled with a dielectric layer.

The line width of the gap 218 in the longitudinal direction of the channel may be larger than at least the thickness of the first gate dielectric layer 210. This is in order to prevent interference between the first and second gate electrodes 212 and 216 facing each other through sidewalls thereof. The line width of the gap 218 may be set in such a range that can form the gate stack GS in a limited area while preventing a leakage current from being generated by biases applied to the first and second gate electrodes 212 and 216, respectively. For reference, when the distance between the first and second gate electrodes 212 and 216, i.e. the line width of the gap 218, becomes smaller than a preset range, a leakage current may be generated in the junction region 202 by the bias applied to the first gate electrode 212. The preset range may indicate the thickness of the first gate dielectric layer 210. This is because, with a bias applied to the second gate electrode 216 to form the channel 204, a bias is applied to the first gate electrode 212 to additionally induce negative capacitance. The leakage current generated by the gap 218 having a small line width may reduce the potential level control efficiency of the channel 204 during an operation process of the switching element SE1.

Since the first gate electrode 212 is inserted between the first and second gate dielectric layers 210 and 214, the first gate electrode 212 may include metal oxide, metal nitride or metal oxynitride in consideration of an interfacial characteristic between the first and second gate dielectric layers 210 and 214. The metal oxide, metal nitride or metal oxynitride may include one or more of gold (Au), gadolinium scandate ($GdScO_3$), silicon (Si), poly Si, copper (Cu), silver (Ag), molybdenum (Mo), nickel (Ni), platinum (Pt), titanium (Ti), tantalum (Ta) and ruthenium (Ru).

In the present embodiment, the case in which the second region 212B of the first gate electrode 212 is formed to face one sidewall of the second gate electrode 216 and has an 'L'-shaped cross-section has been taken as an example. However, the present embodiment is not limited thereto. In a modification, the second region 212B of the first gate electrode 212 may be formed to face both of one sidewall and the other sidewall of the second gate electrode 216, and thus have a 'U'-shaped cross-section.

The second gate dielectric layer 214 may serve as a dielectric layer of the negative capacitor, and include a ferroelectric material. For example, the capacitance of the second gate dielectric layer 214 may be changed from positive capacitance to negative capacitance in response to a bias applied to the first gate electrode 212. For this structure, the second gate dielectric layer 214 may include metal oxide with a fluorite structure, which has one or more stable composition regions selected from a cubic system, a tetragonal system and a monoclinic system. For example, hafnium oxide ($HfO_x$) or zirconium oxide ($ZrO_x$) may be used as the metal oxide with a fluorite structure. Furthermore, hafnium oxide ($HfO_x$) or zirconium oxide ($ZrO_x$) doped with one or more elements selected from the group consisting of silicon (Si), aluminum (Al), lanthanum (La) and gadolinium (Gd) may be used as the metal oxide with a fluorite structure. At this time, the second gate dielectric layer 214 may have a thickness of about 1 nm to about 20 nm, in order to stably maintain the fluorite structure while easily varying the capacitance in response to the bias applied to the first gate electrode 212.

For example, the second gate dielectric layer 214 may include any one selected from the group consisting of hafnium oxide ($HfO_x$), hafnium zirconium oxide ($Hf_{1-x}Zr_xO_2$), hafnium aluminum oxide ($Hf_{1-x}Al_xO_2$) and hafnium silicon oxide ($Hf_{1-x}Si_xO_2$). At this time, the second gate dielectric layer 214 may be configured as a single layer or a multilayer including two or more metal oxides stacked therein and having different crystalline structures or compositions. For example, the second gate dielectric layer 214 may be a single layer formed of hafnium oxide or a multilayer having hafnium oxide and hafnium zirconium oxide stacked therein.

Furthermore, both of a ferroelectric organic matter and a ferroelectric inorganic matter, which can implement a negative capacitor, may be applied as the second gate dielectric layer 214. Examples of the ferroelectric inorganic matter may include a perovskite ferroelectric material such as PZT ($PbZr_xTi_{1-x}O_3$), $BaTiO_3$ or $PbTiO_3$, a pseudo-ilmenite ferroelectric material such as $LiNbO_3$ or $LiTaO_3$, a tungsten-bronze (TB) ferroelectric material such as $PbNb_3O_6$ or $Ba_2NaNb_5O_{15}$, a bismuth ferroelectric material such as SBT ($SrBi_2Ta_2O_9$), BLT (($Bi,La)_4Ti_3O_{12}$) or $Bi_4Ti_3O_{12}$, and a pyrochlore ferroelectric material such as $La_2Ti_2O_7$. The examples of the ferroelectric inorganic matter may further include solid solutions of the ferroelectric materials, $RMnO_3$ including a rare earth element (R) such as Y, Er, Ho, Tm, Yb or Lu, PGO ($Pb_5Ge_3O_{11}$) and BFO ($BiFeO_3$). In addition, the examples of the ferroelectric inorganic matter may further include II-VI group compounds such as CdZnTe, CdZnS, CdZnSe, CdMnS, CdFeS, CdMnSe and CdFeSe. Furthermore, examples of the ferroelectric organic matter may include one or more of polyvinylidene fluoride (PVDF), polymer including PVDF, copolymer including PVDF, terapolymer including PVDF, an odd number of nylons, cyanopolymer, and polymers or copolymers thereof.

The second gate dielectric layer 214 may be formed through ALD (Atomic Layer Deposition). This is in order to implement a stable crystalline structure and composition, and to prevent a reduction in negative capacitor effect, caused by traps formed at an interface abutting on the second gate dielectric layer 214.

The second gate electrode 216 may serve to control on/off of the switching element SE1. In other words, the channel 204 may be formed in the substrate 200 under the gate stack GS in response to a bias applied to the second gate electrode 216. The second gate electrode 216 may include one or more kinds of metals selected from the group consisting of platinum (Pt), ruthenium (Ru), iridium (Ir), silver (Ag), aluminum (Al), titanium (Ti), tantalum (Ta), tungsten (W), copper (Cu), nickel (Ni), cobalt (Co) and molybdenum (Mo), in consideration of the characteristics of the interface abutting on the second gate dielectric layer 214. For example, the second gate electrode 216 may include conductive nitride (for example, TiN or MoN) or conductive oxynitride (for example, TiON) of the above-described metals or a combination thereof (for example, TiSiN or TiAlON).

In the present embodiment, the case in which the gate stack GS is formed in a planar type with a horizontal channel has been taken as an example. However, the present embodiment is not limited thereto. In a modification, the gate stack GS may have a recess-type or fin-type channel structure.

As described above, the switching element SE1 in accordance with the embodiment may include the second gate dielectric layer 214 having negative capacitance in response to a bias applied to the first gate electrode 212, thereby improving the operation speed of the switching element SE1.

Furthermore, as the first gate electrode 212 including the first and second regions 212A and 212B is integrated in the gate stack GS, it may be possible to provide the switching element SE1 including a negative capacitor within a limited area.

Furthermore, since the capacitance polarity and capacity of the second gate dielectric layer 214 and the potential level of the channel 204 can be selectively controlled through a bias applied to the first gate electrode 212, it may be possible to improve the operation reliability of the switching element SE1.

Figure 2:
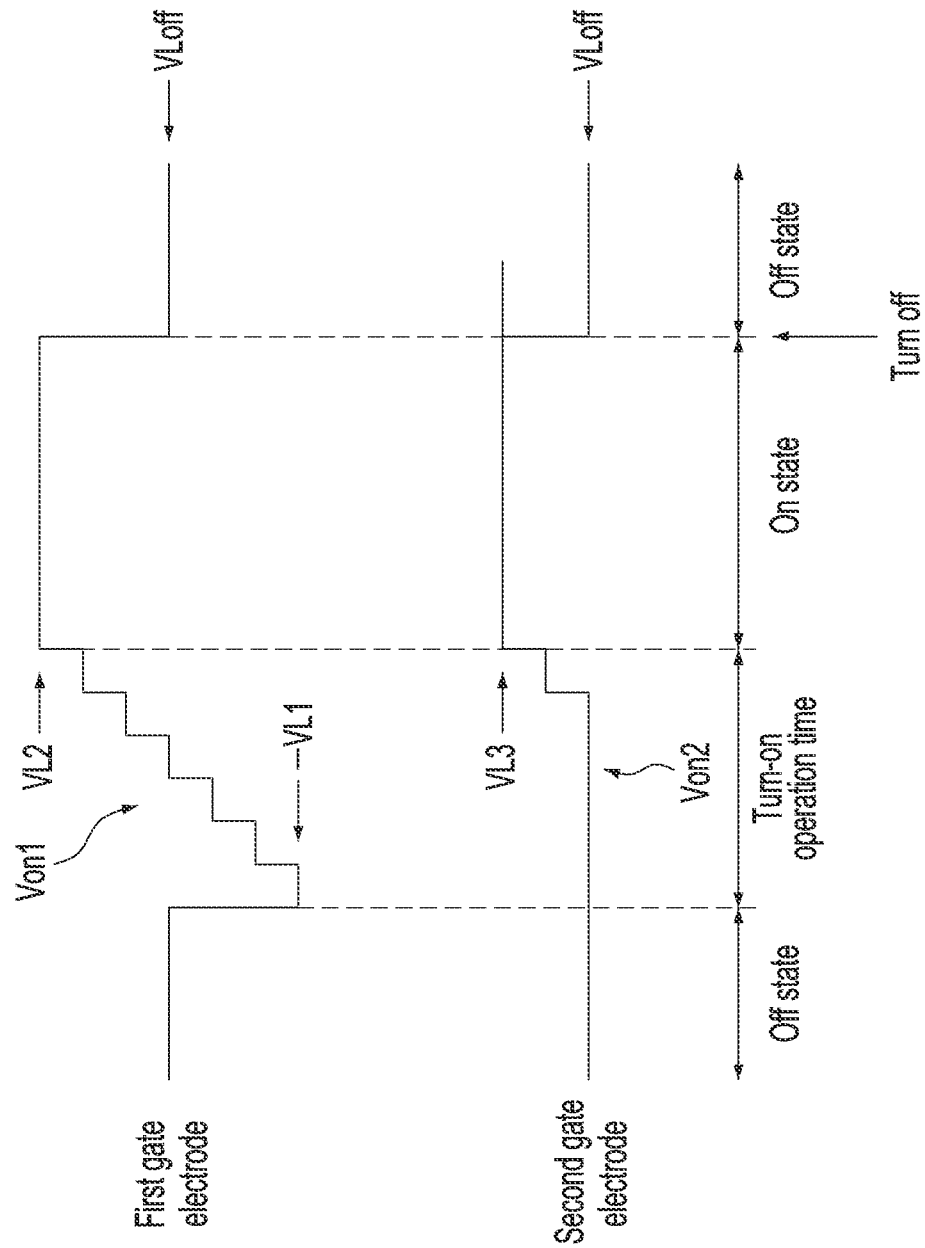
FIG. 2 is a diagram for describing a turn-on operation and turn-off operation of the switching element illustrated in FIG. 1.

FIG. 2 is a diagram for describing a turn-on operation and turn-off operation of the switching element illustrated in FIG. 1.

As illustrated in FIGS. 1 and 2, the first gate electrode 212 and the second gate electrode 216 may have an off-voltage level VLoff, while the switching element is turned off. The off-voltage level VLoff may be a ground potential. Therefore, while the switching element SE1 is turned off, the ground voltage may be applied to the first gate electrode 212 and the second gate electrode 216.

In a turn-on operation time for turning on the switching element SE1, a first turn-on voltage Von1 and a second turn-on voltage Von2 may be applied to the first gate electrode 212 and the second gate electrode 216, respectively.

The first turn-on voltage Von1 may sweep from the off-voltage level VLoff to a first voltage level VL1. Here, the sweep may that the voltage value is varied within a predetermined time. The sweep from the off-voltage level VLoff to the first voltage level VL1 may be performed at the start point of the turn-on operation time, and have a vertical profile. The first voltage level VL1 may be lower than the off-voltage level VLoff. That is, the first voltage level VL1 may have a negative polarity.

Continuously, the first turn-on voltage Von1 may sweep from the first voltage level VL1 to a second voltage level VL2. At this time, the voltage level may be sequentially raised from the first voltage level VL1 to the second voltage level VL2 for a predetermined time. That is, the voltage level may be sequentially raised to have a stepwise profile or linear profile from the first voltage level VL1 to the second voltage level VL2 for the predetermined time. The predetermined time may correspond to the turn-on operation time. The second voltage level VL2 may be higher than the off-voltage level VLoff and have a different level from the first voltage level VL1. Therefore, the second voltage level VL2 may be a voltage having a positive polarity. The word "predetermined" as used herein with respect to a parameter, such as a predetermined time, predetermined range, or predetermined thickness, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The reason why the first turn-on voltage Von1 sweeps from the off-voltage level VLoff to the first voltage level VL1 having a negative polarity and continuously sweeps from the first voltage level VL1 to the second voltage level VL2 having a positive polarity is in order to induce a negative capacitor effect. That is, the reason is in order to vary the voltage level such that the second gate dielectric layer 214 has negative capacitance. At this time, the reason to sequentially raise the voltage level from the first voltage level VL1 to the second voltage level VL2 for the predetermined time is in order to secure operation reliability. Therefore, the magnitudes of the first and second voltage levels VL1 and VL2 and the time during which the voltage level sweeps from the first voltage level VL1 to the second voltage level VL2 may be adjusted to control the negative capacitance of the second gate dielectric layer 214.

The second turn-on voltage Von2 may sweep from the off-voltage level VLoff to the third voltage level VL3. At this time, the voltage level may be sequentially raised from the off-voltage level VLoff to a third voltage level VL3 for a predetermined time. That is, the voltage level may be sequentially raised to have a stepwise profile or linear profile from the off-voltage level VLoff to the third voltage level VL3 for the predetermined time. The predetermined time may be shorter than the turn-on operation time. Therefore, the point of time that the first turn-on voltage Von1 sweeps from the off-voltage level VLoff to the first voltage level VL1 may be earlier than the point of time that the second turn-on voltage Von2 sweeps from the off-voltage level VLoff to the third voltage level VL3. The third voltage level VL3 may be higher than the off-voltage level VLoff and have a polarity different from the first voltage level VL1. Therefore, the third voltage level VL3 may be a voltage having a positive polarity.

In the present embodiment, the case in which the voltage level is sequentially raised for the predetermined time, when the second turn-on voltage Von2 sweeps from the off-voltage level VLoff to the third voltage level VL3, has been taken as an example. However, the present embodiment is not limited thereto. In a modification, the second turn-on voltage Von2 may sweep from the off-voltage level VLoff to the third voltage level VL3. In this case, however, the second turn-on voltage Von2 may be raised within a short time to have a vertical profile.

While the switching element SE1 is turned on, the first and second gate electrodes 212 and 216 may retain the second and third voltage levels VL2 and VL3, respectively. Then, when the first and second turn-on voltages Von1 and Von2 applied to the first and second gate electrodes 212 and 216, respectively, are cut off at the same time, the switching element SE1 may be turned off. Then, while the switching element SE1 is turned off, each of the first gate electrode 212 and the second gate electrode 216 may have the off-voltage level VLoff.

In the present embodiment, the turn-on operation time has been separated and described. However, since the switching element SE1 has a negative capacitor, the switching element SE1 can implement a subthreshold voltage swing value of 60 mV/dec (Boltzmann tyranny) or less, which is a theoretical limit. Therefore, the switching element SE1 may shorten the time required for the turn-on operation, compared to a typical switching element, for example, a transistor.

Figure 3:
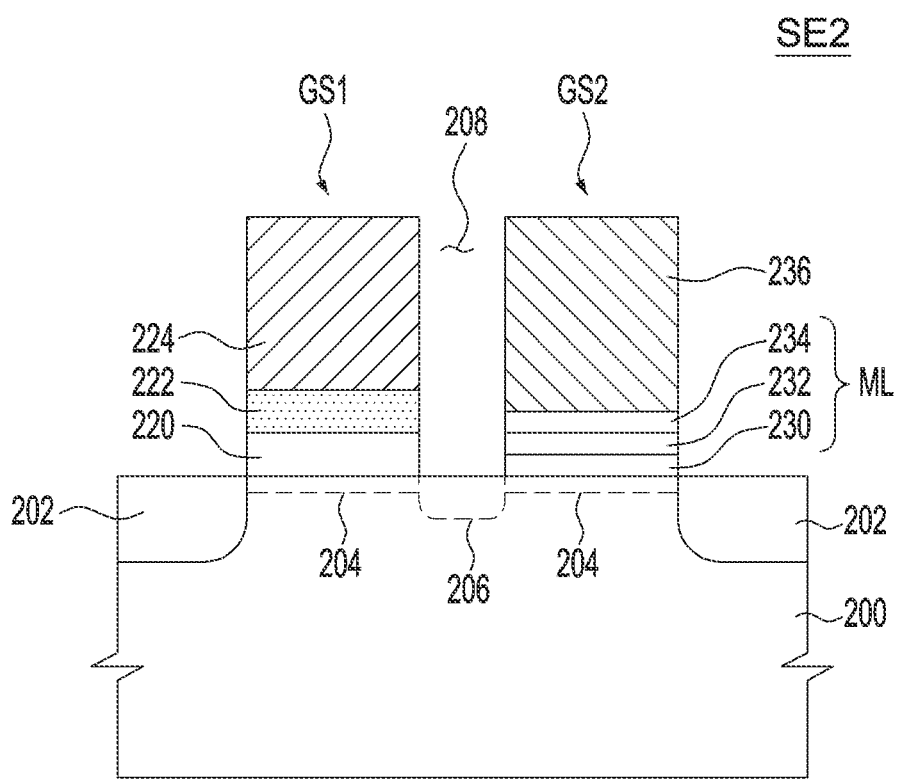
FIG. 3 is a cross-sectional view illustrating a switching element in accordance with an embodiment.

FIG. 3 is a cross-sectional view illustrating a switching element in accordance with an embodiment.

As illustrated in FIG. 3, a switching element SE2 in accordance with an embodiment may include a first gate stack GS1, a second gate stack GS2 and junction regions 202. The first gate stack GS1 may be formed on a substrate 200. The second gate stack GS2 may be formed on the substrate 200 to neighbor on the first gate stack GS1 with a gap 208 provided therebetween. The junction regions 202 may be formed in the substrate 200 to be adjacent to one side of the first gate stack GS1 and the other side of the second gate stack GS2, respectively. The substrate 200 may have a channel 204 formed at the surface thereof under the first and second gate stacks GS1 and GS2. The channel 204 may electrically couple the junction regions 202 in response to biases applied to the first and second gate stacks GS1 and GS2, respectively.

The first gate stack GS1 of the switching element SE2 may include a negative capacitor. The negative capacitor may include the substrate 200 or the channel 204, a second gate dielectric layer 222 and a first gate electrode 224, which overlap one another.

The switching element SE2 may further include a coupling region 206 which is formed in the substrate 200 between the first and second gate stacks GS1 and GS2, and couples the channel 204 induced by the first gate stack GS1 to the channel 204 induced by the second gate stack GS2. The junction regions 202 and the coupling region 206 may be impurity regions formed by implanting impurities into the substrate 200. The coupling region 206 may be omitted when the channel 204 induced by the first gate stack GS1 to the channel 204 induced by the second gate stack GS2 can be electrically coupled to each other because the distance between the first and second gate stacks GS1 and GS2, i.e. the line width of the gap 208, is small.

The first gate stack GS1 may serve to improve the operation speed of the switching element SE2 using the negative capacitor effect. The second gate stack GS2 adjacent to the first gate stack GS1 may be a memory stack, and serve to control the surface potential level of the substrate 200 having the channel 204 formed therein, thereby improving the operation reliability of the switching element SE2. The second gate stack GS2 may also serve to vary the threshold voltage of the switching element SE2 within a predetermined range. The line width of the first gate stack GS1 in the longitudinal direction of the channel may be equal to or larger than the line width of the second gate stack GS2. Furthermore, the distance between the first and second gate stacks GS1 and GS2 in the longitudinal direction of the channel, i.e. the line width of the gap 208, may be set so that a bias applied to the first gate stack GS1 has no influence on the threshold voltage of the second gate stack GS2.

The first gate stack GS1 may include a first gate dielectric layer 220 formed on the substrate 200, the second gate dielectric layer 222 formed on the first gate dielectric layer 220 and including a ferroelectric material, and the first gate electrode 224 formed on the second gate dielectric layer 222.

The first gate dielectric layer 220 may be formed on the substrate 200, and include oxide or nitride. For example, the first gate dielectric layer 220 may include a single layer formed of any one element selected from the group consisting of silicon oxide ($SiO_2$), silicon nitride ($Si_3N_4$), hafnium oxide ($HfO_2$), zirconium oxide ($ZrO_2$), lanthanum oxide ($La_2O_3$), aluminum oxide ($Al_2O_3$) and titanium oxide ($TiO_2$), or a multilayer in which two or more elements selected from the group are stacked.

The second gate dielectric layer 222 may serve as a dielectric layer of the negative capacitor, and include a ferroelectric material having self-induced negative capacitance. That is, the second gate dielectric layer 222 may have negative capacitance in a thermal equilibrium state. For this structure, the second gate dielectric layer 222 may include metal oxide with a fluorite structure, which has one or more stable composition regions selected from a cubic system, a tetragonal system and a monoclinic system. For example, hafnium oxide or zirconium oxide may be used as the metal oxide with a fluorite structure. Furthermore, hafnium oxide or zirconium oxide doped with one or more elements selected from the group consisting of silicon (Si), aluminum (Al), lanthanum (La) and gadolinium (Gd) may be used as the metal oxide with a fluorite structure. At this time, in order to maintain a stable fluorite structure having self-induced negative capacitance, the second gate dielectric layer 222 may have a thickness of about 1 nm to about 10 nm.

For example, the second gate dielectric layer 222 may include any one selected from the group consisting of hafnium oxide ($HfO_x$), hafnium zirconium oxide ($Hf_{1-x}Zr_xO_2$), hafnium aluminum oxide ($Hf_{1-x}Al_xO_2$) and hafnium silicon oxide ($Hf_{1-x}Si_xO_2$). At this time, the second gate dielectric layer 222 may be configured as a single layer or a multilayer in which two or more metal oxides having different crystalline structures or compositions are stacked. For example, the second gate dielectric layer 222 may be a single layer formed of hafnium oxide or a multilayer having hafnium oxide and hafnium zirconium oxide stacked therein.

Furthermore, both of a ferroelectric organic matter and a ferroelectric inorganic matter, which can implement a negative capacitor, may be applied as the second gate dielectric layer 222. Examples of the ferroelectric inorganic matter may include a perovskite ferroelectric material such as PZT ($PbZr_xTi_{1-x}O_3$), $BaTiO_3$ or $PbTiO_3$, a pseudo-ilmenite ferroelectric material such as $LiNbO_3$ or $LiTaO_3$, a tungsten-bronze (TB) ferroelectric material such as $PbNb_3O_6$ or $Ba_2NaNb_5O_{15}$, a bismuth ferroelectric material such as SBT ($SrBi_2Ta_2O_9$), BLT (($Bi,La)_4Ti_3O_{12}$) or $Bi_4Ti_3O_{12}$, and a pyrochlore ferroelectric material such as $La_2Ti_2O_7$. The examples of the ferroelectric inorganic matter may further include solid solutions of the ferroelectric materials, RMnO3 including a rare earth element (R) such as Y, Er, Ho, Tm, Yb or Lu, PGO ($Pb_5Ge_3O_{11}$) and BFO ($BiFeO_3$). In addition, the examples of the ferroelectric inorganic matter may further include II-VI group compounds such as CdZnTe, CdZnS, CdZnSe, CdMnS, CdFeS, CdMnSe and CdFeSe. Furthermore, examples of the ferroelectric organic matter may include one or more of polyvinylidene fluoride (PVDF), polymer including PVDF, copolymer including PVDF, terapolymer including PVDF, an odd number of nylons, cyanopolymer, and polymers or copolymers thereof.

The second gate dielectric layer 222 may be formed through ALD (Atomic Layer Deposition). This is in order to implement a stable crystalline structure and composition, and to prevent a reduction in negative capacitor effect, caused by traps formed at an interface abutting on the second gate dielectric layer 222.

In the present embodiment, the case in which the second gate dielectric layer 222 is formed on the first gate dielectric layer 220 has been taken as an example. However, the present embodiment is not limited thereto. In a modification, a floating electrode (not illustrated) may be inserted between the first and second gate dielectric layers 220 and 222. The floating electrode (not illustrated) may serve to improve the characteristic of the interface abutting on the second gate dielectric layer 222. The floating electrode (not illustrated) may also serve to distribute the bias applied to the first gate electrode 224 due to the coupling effect, thereby improving the operation reliability. Since the floating electrode is inserted between the first and second gate dielectric layers 220 and 222, the floating electrode may include metal oxide, metal nitride or metal oxynitride in consideration of an interfacial characteristic between the first and second gate dielectric layers 220 and 214, the metal oxide, metal nitride or metal oxynitride including one or more of gold (Au), gadolinium scandate ($GdScO_3$), silicon (Si), poly Si, copper (Cu), silver (Ag), molybdenum (Mo), nickel (Ni), platinum (Pt), titanium (Ti), tantalum (Ta) and ruthenium (Ru).

The first gate electrode 224 may include one or more kinds of metals selected from the group consisting of platinum (Pt), ruthenium (Ru), iridium (Ir), silver (Ag), aluminum (Al), titanium (Ti), tantalum (Ta), tungsten (W), copper (Cu), nickel (Ni), cobalt (Co) and molybdenum (Mo), in consideration of the characteristic of the interface abutting on the second gate dielectric layer 222. For example, the first gate electrode 224 may include conductive nitride (for example, TiN or MoN) or conductive oxynitride (for example, TiON) of the above-described metals or a combination thereof (for example, TiSiN or TiAlON).

The second gate stack GS2 may include a memory layer ML and a second gate electrode 236. The memory layer ML may be formed on the substrate 200, and include a tunnel dielectric layer 230, a charge trapping layer 232 and a blocking layer 234, which are sequentially stacked, and the second gate electrode 236 may be formed on the memory layer ML. That is, the second gate stack GS2 may be a memory stack.

The tunnel dielectric layer 230 and the blocking layer 234 may include oxide, and the charge trapping layer 232 may include nitride. Here, charges may be injected into the charge trapping layer 232 or the charges injected into the charge trapping layer 232 may be removed, in order to vary the threshold voltage value of the second gate stack GS2 within a predetermined range. Through this operation, the threshold voltage of the switching element SE2 may be varied.

The second gate electrode 236 may include one or more kinds of metals selected from the group consisting of platinum (Pt), ruthenium (Ru), iridium (Ir), silver (Ag), aluminum (Al), titanium (Ti), tantalum (Ta), tungsten (W), copper (Cu), nickel (Ni), cobalt (Co) and molybdenum (Mo), in consideration of the characteristic of the interface abutting on the memory layer ML. For example, the second gate electrode 236 may include a conductive nitride or conductive oxynitride of the above-described metals or a combination thereof.

In the present embodiment, the case in which each of the first and second gate stacks GS1 and GS2 is formed in a planar type with a horizontal channel has been taken as an example. However, the present embodiment is not limited thereto. In a modification, each of the first and second gate stacks GS1 and GS2 may have a recess-type or fin-type channel structure.

As described above, the switching element SE2 in accordance with the present embodiment may include the second gate dielectric layer 222 having self-induced negative capacitance, and thus improve the operation speed of the switching element SE1. Furthermore, since the second gate dielectric layer 222 has self-induced negative capacitance, the time of the turn-on operation time can be shortened to further improve the operation speed of the switching element SE2.

Furthermore, the second gate stack GS2 including the memory layer ML may be provided to improve the operation reliability of the switching element SE2.

Furthermore, since each of the first and second gate stacks GS1 and GS2 can be independently controlled, it may be possible to provide the switching element SE2 capable of performing various operation modes.

Figure 4:
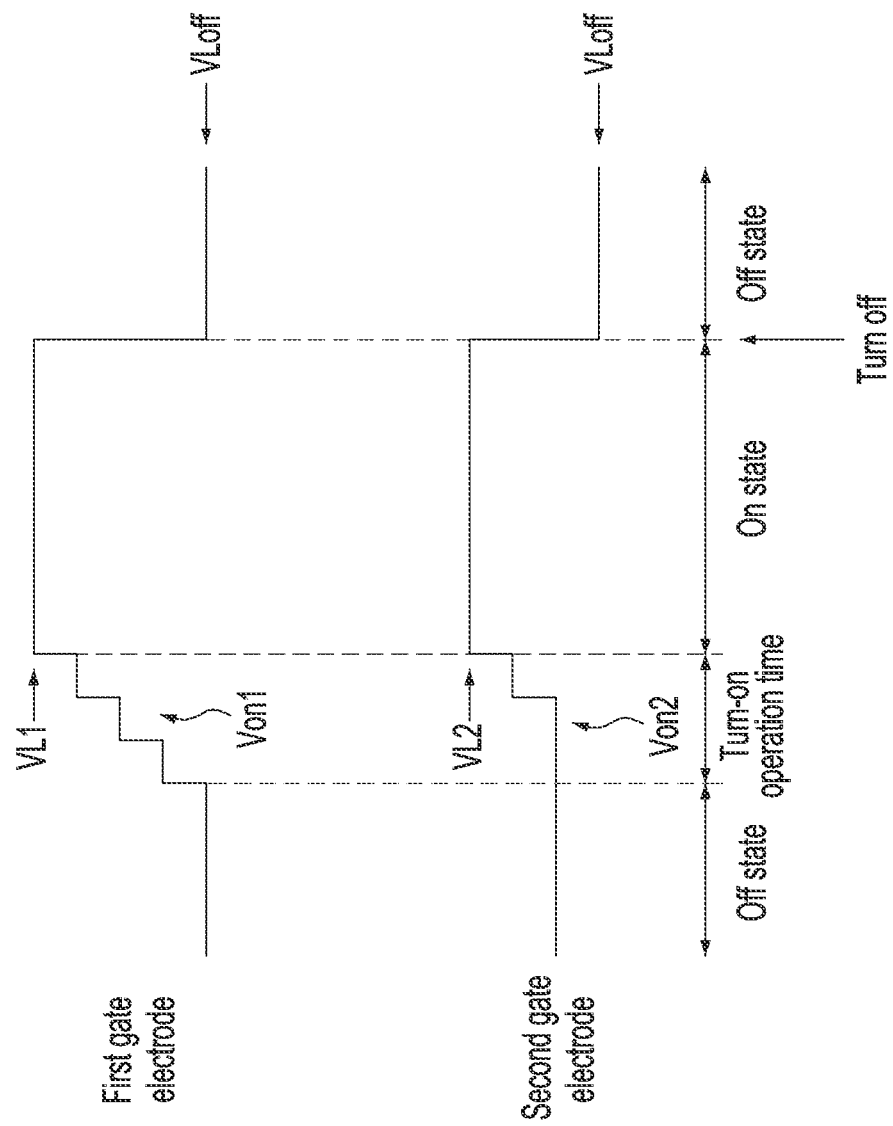
FIG. 4 is a diagram for describing a turn-on operation and turn-off operation of the switching element illustrated in FIG. 3.

FIG. 4 is a diagram for describing a turn-on operation and turn-off operation of the switching element illustrated in FIG. 3.

As illustrated in FIGS. 3 and 4, the first gate electrode 224 and the second gate electrode 236 may have an off-voltage level VLoff, while the switching element is turned off. The off-voltage level VLoff may be a ground potential. Therefore, while the switching element is turned off, the ground voltage may be applied to the first gate electrode 224 and the second gate electrode 236.

In a turn-on operation time for turning on the switching element SE2, a first turn-on voltage Von1 and a second turn-on voltage Von2 may be applied to the first gate electrode 224 and the second gate electrode 236, respectively.

The first turn-on voltage Von1 may sweep from the off-voltage level VLoff to a first voltage level VL1. At this time, the voltage level may be sequentially raised from the off-voltage level VLoff to the first voltage level VL1 for a predetermined time. That is, the voltage level may be sequentially raised to have a stepwise profile or linear profile from the off-voltage level VLoff to the first voltage level VL1 for the predetermined time. The predetermined time may correspond to the turn-on operation time, and the reason to sequentially raise the voltage level from the off-voltage level VLoff to a second voltage level VL2 for the predetermined time is in order to secure the operation reliability. The first voltage level VL1 may be higher than the off-voltage level VLoff. That is, the first voltage level VL1 may have a positive polarity.

The second turn-on voltage Von2 may sweep from the off-voltage level VLoff to the second voltage level VL2. At this time, the voltage level may be sequentially raised from the off-voltage level VLoff to the second voltage level VL2 for a predetermined time. That is, the voltage level may be sequentially raised to have a stepwise profile or linear profile from the off-voltage level VLoff to the second voltage level VL2 for the predetermined time. The predetermined time may be shorter than the turn-on operation time. The second voltage level VL2 may be higher than the off-voltage level VLoff. That is, the second voltage level VL2 may have a positive polarity.

In the present embodiment, the case in which the voltage level is sequentially raised for the predetermined time, when the second turn-on voltage Von2 sweeps from the off-voltage level VLoff to the second voltage level VL2, has been taken as an example. However, the present embodiment is not limited thereto. In a modification, the second turn-on voltage Von2 may sweep from the off-voltage level VLoff to the second voltage level VL2. However, the second turn-on voltage Von2 may be raised within a short time so as to have a vertical profile.

While the switching element SE2 is turned on, the first and second gate electrodes 224 and 236 may retain the first and second voltage levels VL1 and VL2, respectively. Then, when the first and second turn-on voltages Von1 and Von2 applied to the first and second gate electrodes 224 and 236, respectively, are cut off at the same time, the switching element SE2 may be turned off. Then, while the switching element SE2 is turned off, each of the first and second gate electrodes 224 and 236 may have the off-voltage level VLoff.

In the present embodiment, the turn-on operation time has been separated and described. However, since the switching element SE2 includes a negative capacitor, the switching element SE2 may implement the subthreshold voltage swing value of 60 mV/dec or less, which is a theoretical limit. Therefore, the switching element SE1 may shorten the time required for the turn-on operation, compared to a typical switching element, for example, a transistor.

Figure 5:
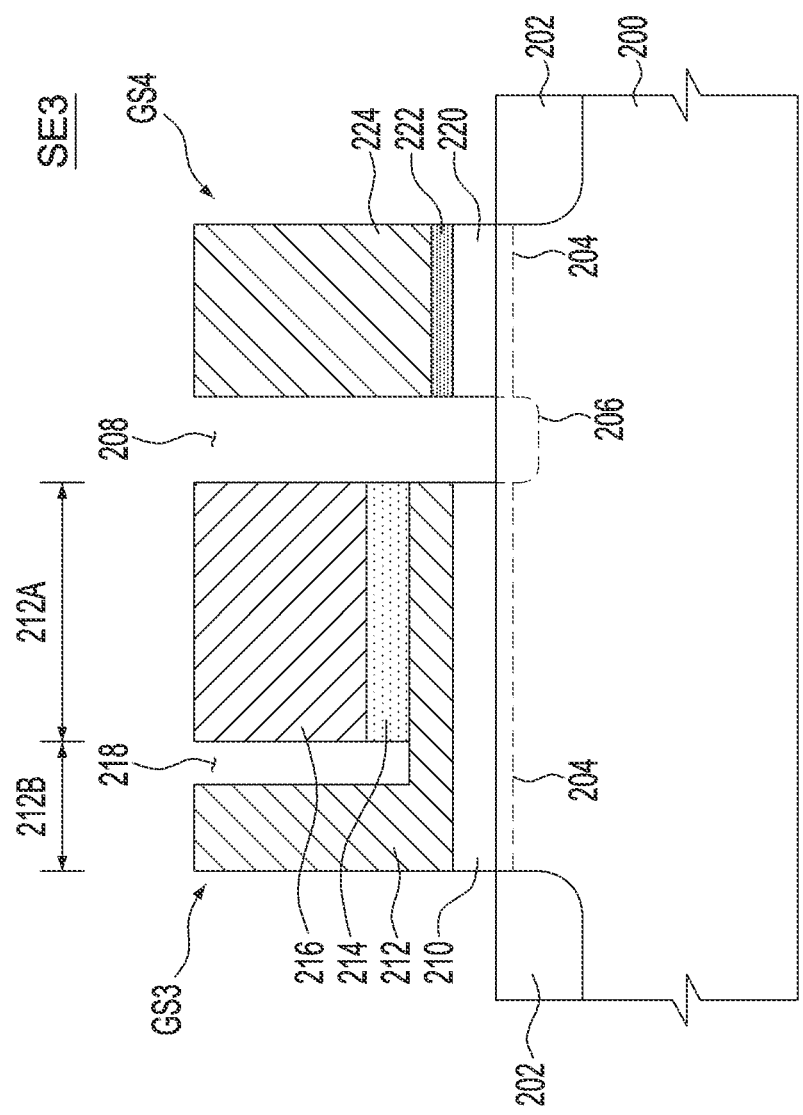
FIG. 5 is a cross-sectional view illustrating a switching element in accordance with an embodiment.

FIG. 5 is a cross-sectional view illustrating a switching element in accordance with an embodiment.

As illustrated in FIG. 5, a switching element SE3 in accordance with an embodiment may include a third gate stack GS3 and one or more fourth gate stacks GS4, which are formed on a substrate 200 and neighbor on each other. Furthermore, the switching element SE3 may include junction regions 202 formed in the substrate 200 to be adjacent to one side of the third gate stack GS3 and the other side of the fourth gate stack GS4, respectively. The substrate 200 may have a channel 204 formed at the surface thereof under the third and fourth gate stacks GS3 and GS4. The channel 204 may electrically couple the junction regions 202 in response to biases applied to the third and fourth gate stacks GS3 and GS4, respectively.

In the present embodiment, the case in which the switching element SE3 includes one fourth gate stack GS4 has been taken as an example. However, the present embodiment is not limited thereto. In a modification, the switching element SE3 may include a plurality of fourth gate stacks GS4.

Furthermore, the switching element SE3 may further include a coupling region 206 which is formed in the substrate 200 between the third and fourth gate stacks GS3 and GS4, and couples the channel 204 induced by the third gate stack GS3 to the channel 204 induced by the fourth gate stack GS4. The junction regions 202 and the coupling region 206 may be impurity regions formed by implanting impurities into the substrate 200. The coupling region 206 may be omitted when the channel 204 induced by the third gate stack GS3 and the channel 204 induced by the fourth gate stack GS4 can be electrically coupled to each other because a gap 208 between the third and fourth gate stacks GS3 and GS4 is small.

In the switching element SE3, each of the third and fourth gate stacks GS3 and GS4 may serve to improve the operation speed of the switching element SE3 using a negative capacitor effect. Therefore, each of the third and fourth gate stacks GS3 and GS4 may include a negative capacitor. Furthermore, the fourth gate stack GS4 may serve to improve the operation reliability of the switching element SE3 by controlling the surface potential level of the substrate 200 in which the channel 204 is formed. The line width of the third gate stack GS3 in the longitudinal direction of the channel may be equal to or larger than the line width of the fourth gate stack GS4. Furthermore, the line width of the gap 208 between the third and fourth gate stacks GS3 and GS4 in the longitudinal direction of the channel may be set so that a bias applied to the third gate stack GS3 has no influence on the threshold voltage of the fourth gate stack GS4.

The third gate stack GS3 may include a first gate dielectric layer 210, a second gate dielectric layer 214, a second gate electrode 216 and a first gate electrode 212. The first gate dielectric layer 210 may be formed on the substrate 200, the second gate dielectric layer 214 may be formed on the first gate dielectric layer 210 to overlap a part of the first gate dielectric layer 210, and include a ferroelectric material, the second gate electrode 216 may be formed on the second gate dielectric layer 214, and the first gate electrode 212 may include a first region 212A inserted between the first and second gate dielectric layers 210 and 214 and a second region 212B extended from the first region 212A to neighbor the second gate electrode 216 with a gap 218 provided therebetween, and control the second gate dielectric layer 214 to selectively have negative capacitance. The negative capacitor may include the first gate electrode 212, the second gate dielectric layer 214 and the second gate electrode 216, which overlap one another.

In the switching element SE3, the third gate stack GS3 may correspond to the gate stack GS illustrated in FIG. 1. In other words, the third gate stack GS3 in accordance with the present embodiment may have substantially the same configuration as the gate stack GS illustrated in FIG. 1. Therefore, the detailed descriptions of contents in each of the components of the third gate stack GS3, overlapping those of the gate stack GS, will be omitted herein.

In the third gate stack GS3, the second gate dielectric layer 214 may serve as a dielectric layer of the negative capacitor. The capacitance of the second gate dielectric layer 214 may be changed from positive capacitance to negative capacitance in response to a bias applied to the first gate electrode 212. In order to easily vary the capacitance and to stably maintain a fluorite structure, the second gate dielectric layer 214 may have a thickness of about 1 nm to about 20 nm.

One sidewall of the second gate electrode 216 may face the fourth gate stack GS4, and the other sidewall of the second gate electrode 216 may face the second region 212B of the first gate electrode 212. That is, the second region 212B of the first gate electrode 212 may be positioned adjacent to the junction region 202. This may be in order to prevent interference caused by a bias applied to the first gate electrode 212, when controlling the surface potential level of the substrate 200 having the channel 204 formed therein, in response to a bias applied to a third gate electrode 224 of the fourth gate stack GS4.

The fourth gate stack GS4 may include a third gate dielectric layer 220 formed on the substrate 200, a fourth gate dielectric layer 222 formed on the third gate dielectric layer 220 and including a ferroelectric material, and the third gate electrode 224 formed on the fourth gate dielectric layer 222. The negative capacitor may include the substrate 200 or the channel 204, the fourth gate dielectric layer 222 and the third gate electrode 224, which overlap one another.

In the switching element SE3, the fourth gate stack GS4 may correspond to the first gate stack GS1 illustrated in FIG. 3. In other words, the fourth gate stack GS4 in accordance with the present embodiment may have substantially the same configuration as the first gate stack GS1 illustrated in FIG. 3. Therefore, the detailed descriptions of contents in each of the components of the fourth gate stack GS4, overlapping those of the first gate stack GS1, will be omitted herein.

The fourth gate dielectric layer 222 may serve as a dielectric layer of the negative capacitor, and include a ferroelectric material having self-induced negative capacitance. That is, the fourth gate dielectric layer 222 may have negative capacitance in a thermal equilibrium state. In order to maintain a stable fluorite structure having the self-induced negative capacitance, the fourth gate dielectric layer 222 may have a smaller thickness than the second gate dielectric layer 214. For example, the fourth gate dielectric layer 222 may have a thickness of about 1 nm to about 10 nm.

In the present embodiment, the case in which each of the third and fourth gate stacks GS3 and GS4 is formed in a planar type with a planar channel has been taken as an example. However, the present embodiment is not limited thereto. In a modification, each of the third and fourth gate stacks GS3 and GS4 may have a recess-type or fin-type channel structure.

As described above, the switching element SE3 in accordance with the embodiment may include the third gate stack GS3 including the second gate dielectric layer 214 having negative capacitance in response to a bias applied to the first gate electrode 212, thereby improving the operation speed of the switching element SE3.

Furthermore, the switching element SE3 may include the fourth gate stack GS4 including the fourth gate dielectric layer 222 having self-induced negative capacitance in addition to the third gate stack GS3, thereby further improving the operation speed of the switching element SE3.

Furthermore, since the capacitance polarity and capacity of the second gate dielectric layer 214 and the potential level of the channel 204 can be selectively controlled through a bias applied to the first gate electrode 212, it may be possible to improve the operation reliability of the switching element SE3.

Furthermore, since each of the third and fourth gate stacks GS3 and GS4 can be independently controlled, it may be possible to provide the switching element SE3 capable of performing various operation modes.

Figure 6:
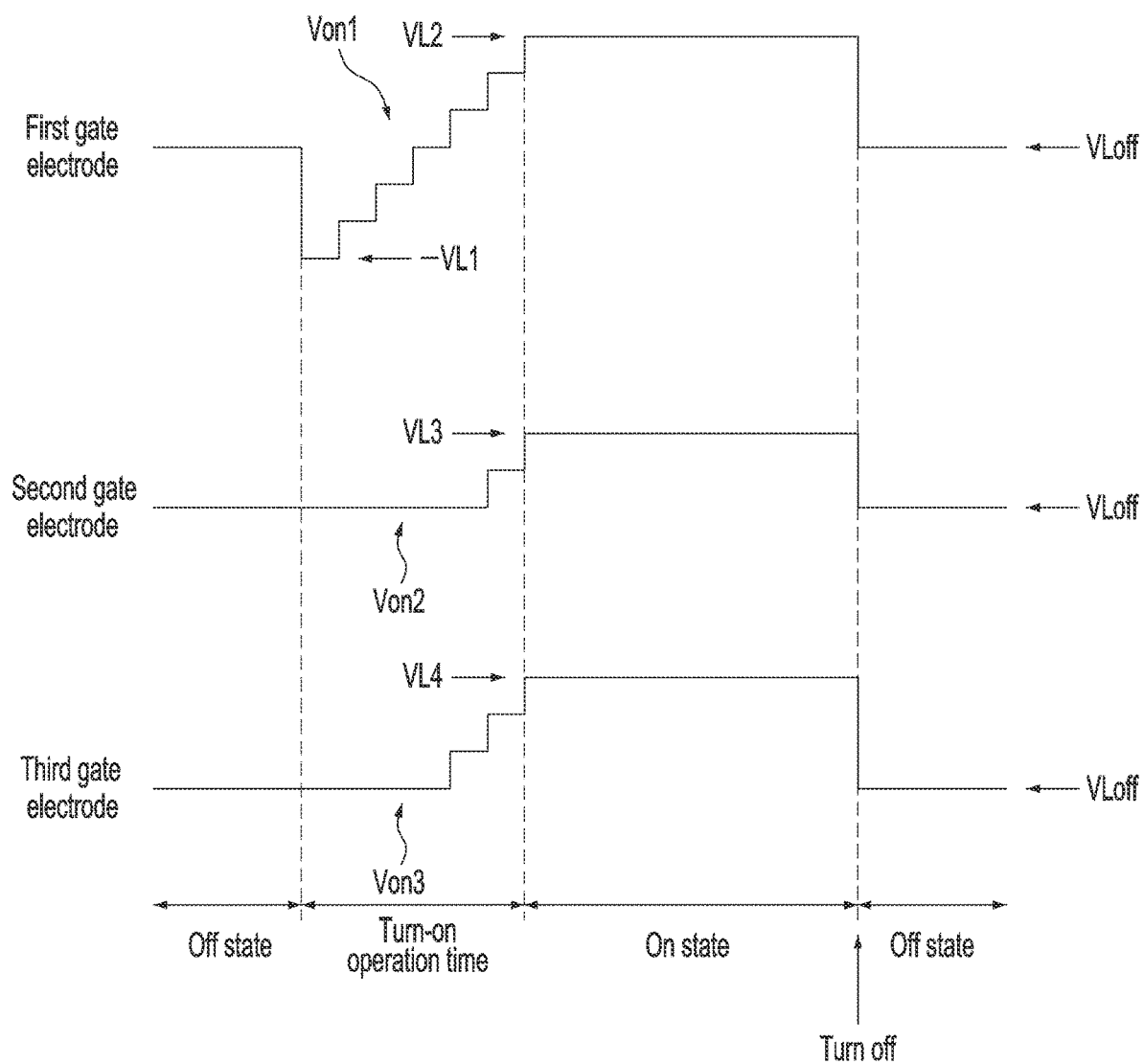
FIG. 6 is a diagram for describing a turn-on operation and turn-off operation of the switching element illustrated in FIG. 5.

FIG. 6 is a diagram for describing a turn-on operation and turn-off operation of the switching element illustrated in FIG. 5.

As illustrated in FIGS. 5 and 6, each of the first gate electrode 212, the second gate electrode 216 and the third gate electrode 224 may have an off-voltage level VLoff, while the switching element is turned off. The off-voltage level VLoff may be a ground potential. Therefore, while the switching element is turned off, the ground voltage may be applied to each of the first gate electrode 212, the second gate electrode 216 and the third gate electrode 224.

In a turn-on operation time for turning on the switching element SE3, a first turn-on voltage Von1, a second turn-on voltage Von2 and a third turn-on voltage Von3 may be applied to the first gate electrode 212, the second gate electrode 216 and the third gate electrode 224, respectively.

The first turn-on voltage Von1 may sweep from the off-voltage level VLoff to a first voltage level VL1. The sweep from the off-voltage level VLoff to the first voltage level VL1 may be performed at the start point of the turn-on operation time, and have a vertical profile. The first voltage level VL1 may be lower than the off-voltage level VLoff. That is, the first voltage level VL1 may have a negative polarity. Continuously, the first turn-on voltage Von1 may sweep from the first voltage level VL1 to a second voltage level VL2. At this time, the voltage level may be sequentially raised from the first voltage level VL1 to the second voltage level VL2 for a predetermined time. That is, the voltage level may be sequentially raised to have a stepwise profile or linear profile from the first voltage level VL1 to the second voltage level VL2 for the predetermined time. The predetermined time may correspond to the turn-on operation time. The second voltage level VL2 may be higher than the off-voltage level VLoff and have a polarity different from the first voltage level VL1. That is, the second voltage level VL2 may have a positive polarity.

The second turn-on voltage Von2 may sweep from the off-voltage level VLoff to a third voltage level VL3. At this time, the voltage level may be sequentially raised from the off-voltage level VLoff to the third voltage level VL3 for a predetermined time. That is, the voltage level may be sequentially raised to have a stepwise profile or linear profile from the off-voltage level VLoff to the third voltage level VL3 for the predetermined time. The predetermined time may be shorter than the turn-on operation time. Therefore, the point of time that the first turn-on voltage Von1 sweeps from the off-voltage level VLoff to the first voltage level VL1 may be earlier than the point of time that the second turn-on voltage Von2 sweeps from the off-voltage level VLoff to the third voltage level VL3. The third voltage level VL3 may be higher than the off-voltage level VLoff and have a polarity different from the first voltage level VL1. Therefore, the third voltage level VL3 may have a positive polarity.

In the present embodiment, the case in which the voltage level is sequentially raised for the predetermined time, when the second turn-on voltage Von2 sweeps from the off-voltage level VLoff to the third voltage level VL3, has been taken as an example. However, the present embodiment is not limited thereto. In a modification, the second turn-on voltage Von2 may sweep from the off-voltage level VLoff to the third voltage level VL3. In this case, however, the second turn-on voltage Von2 may be raised within a short time to have a vertical profile.

The third turn-on voltage Von3 may be swept from the off-voltage level VLoff to a fourth voltage level VL4. At this time, the voltage level may be sequentially raised from the off-voltage level VLoff to the fourth voltage level VL4 for a predetermined time. That is, the voltage level may be sequentially raised to have a stepwise profile or linear profile from the off-voltage level VLoff to the fourth voltage level VL4 for the predetermined time. The predetermined time may be shorter than the turn-on operation time. Therefore, the point of time that the first turn-on voltage Von1 sweeps from the off-voltage level VLoff to the first voltage level VL1 may be earlier than the point of time that the third turn-on voltage Von3 sweeps from the off-voltage level VLoff to the fourth voltage level VL4. Furthermore, the point of time that the third turn-on voltage Von3 sweeps from the off-voltage level VLoff to the fourth voltage level VL4 may be equal to or earlier than the point of time that the second turn-on voltage Von2 sweeps from the off-voltage level VLoff to the third voltage level VL3. The fourth voltage level VL4 may be higher than the off-voltage level VLoff and have a polarity different from the first voltage level VL1. That is, the fourth voltage level VL4 may have a positive polarity.

In the present embodiment, the case in which the voltage level is sequentially raised for the predetermined time, when the third turn-on voltage Von3 sweeps from the off-voltage level VLoff to the fourth voltage level VL4, has been taken as an example. However, the present embodiment is not limited thereto. In a modification, the third turn-on voltage Von3 may sweep from the off-voltage level VLoff to the fourth voltage level VL4. In this case, however, the third turn-on voltage Von3 may be raised within a short time to have a vertical profile.

While the switching element SE3 is turned on, the first to third gate electrodes 212, 216 and 224 may retain the second to fourth voltage levels VL2 to VL4, respectively. Then, when the first to third turn-on voltages Von1 to Von3 applied to the first to third gate electrodes 212, 216 and 224, respectively, are cut off at the same time, the switching element SE3 may be turned off. Then, while the switching element SE3 is turned off, each of the first to third gate electrodes 212, 216 and 224 may have the off-voltage level VLoff.

In the present embodiment, the turn-on operation time has been separated and described. However, since the switching element SE3 has a negative capacitor, the switching element SE3 may implement the subthreshold voltage swing value of 60 mV/dec (Boltzmann tyranny) or less, which is a theoretical limit. Therefore, the switching element SE3 may shorten the time required for the turn-on operation, compared to a typical switching element, for example, a transistor.

Hereafter, a semiconductor memory device including the above-described switching element and a method for fabricating the same will be described. The semiconductor memory device may include a nonvolatile semiconductor memory device having a 3D structure, for example, a 3D NAND memory device.

The semiconductor memory device may include selection transistors coupled in series to one sides and the other sides of a plurality of memory cells sharing a channel. The semiconductor memory device in accordance with the present embodiment, which will be described below, may include the above-described switching element applied as the selection transistor, in order to improve the operation speed and the operation reliability of the semiconductor memory device.

Figure 7:
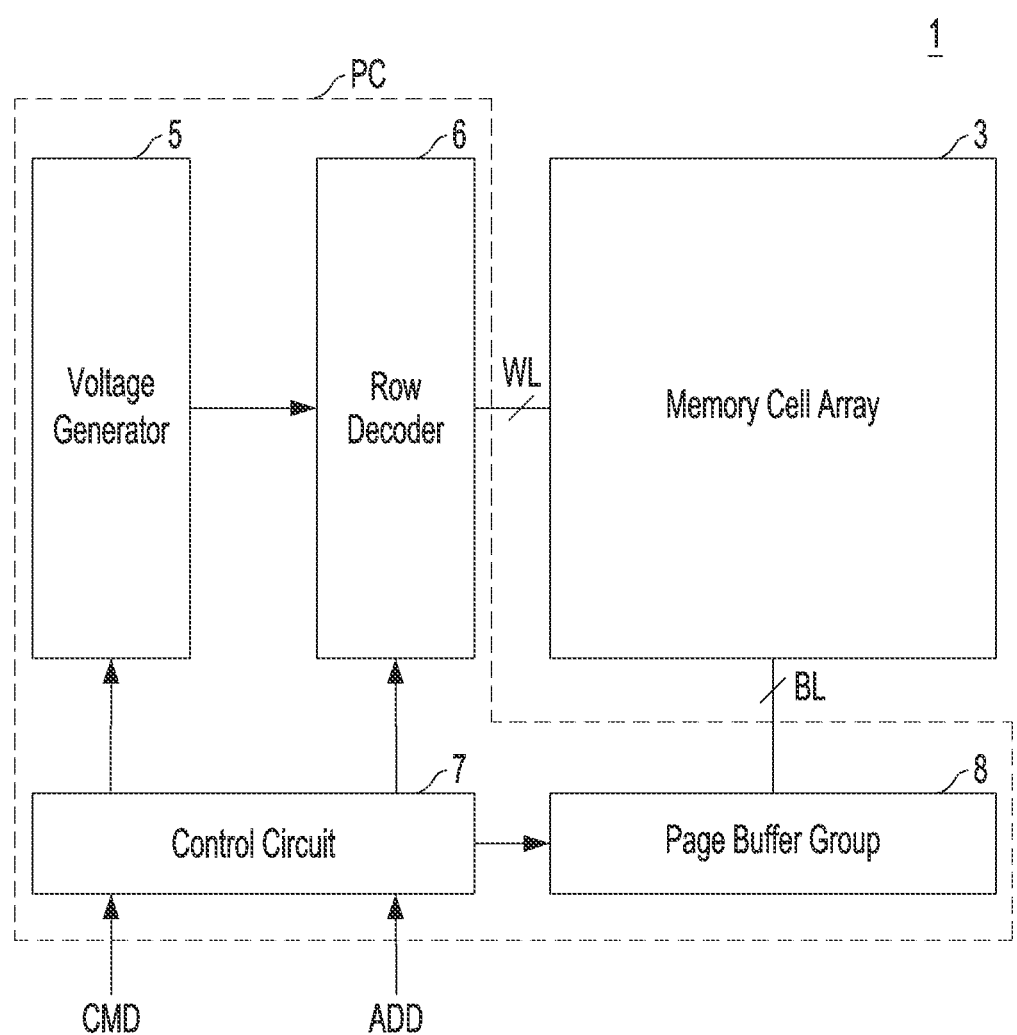
FIG. 7 is a block diagram illustrating a semiconductor memory device in accordance with an embodiment.

FIG. 7 is a block diagram illustrating a semiconductor memory device in accordance with an embodiment.

As illustrated in FIG. 7, a semiconductor memory device 1 may include a peripheral circuit PC and a memory cell array 3.

The peripheral circuit PC may be configured to control a program operation for storing data in the memory cell array 3, a read operation for outputting the data stored in the memory cell array 3, and an erase operation for erasing the data stored in the memory cell array 3. For example, the peripheral circuit PC may include a voltage generator 5, a row decoder 6, a control circuit 7 and a page buffer group 8.

The memory cell array 3 may include a plurality of memory blocks. The memory cell array 3 may be coupled to the row decoder 6 through word lines WL, and coupled to the page buffer group 8 through bit lines BL.

The control circuit 7 may control the peripheral circuit PC in response to a command CMD and an address ADD.

The voltage generator 5 may generate various operation voltages such as a pre-erase voltage, an erase voltage, a ground voltage, a program voltage, a verify voltage, a pass voltage and a read voltage, which are used for the program operation, the read operation and the erase operation, in response to control of the control circuit 7.

The row decoder 6 may select a memory block in response to control of the control circuit 7. The row decoder 6 may be configured to apply the operation voltages to the word lines WL coupled to the selected memory block.

The page buffer group 8 may be coupled to the memory cell array 3 through the bit lines BL. The page buffer group 8 may temporarily store data received from an input/output circuit (not illustrated) during the program operation, in response to control of the control circuit 7. The page buffer group 8 may sense voltages or currents of the bit lines BL during the read operation or the verify operation, in response to control of the control circuit 7. The page buffer group 8 may select the bit lines BL in response to control of the control circuit 7.

For example, the memory cell array 3 may be disposed in parallel to the peripheral circuit PC, or overlap a part of the peripheral circuit PC.

Figure 8:
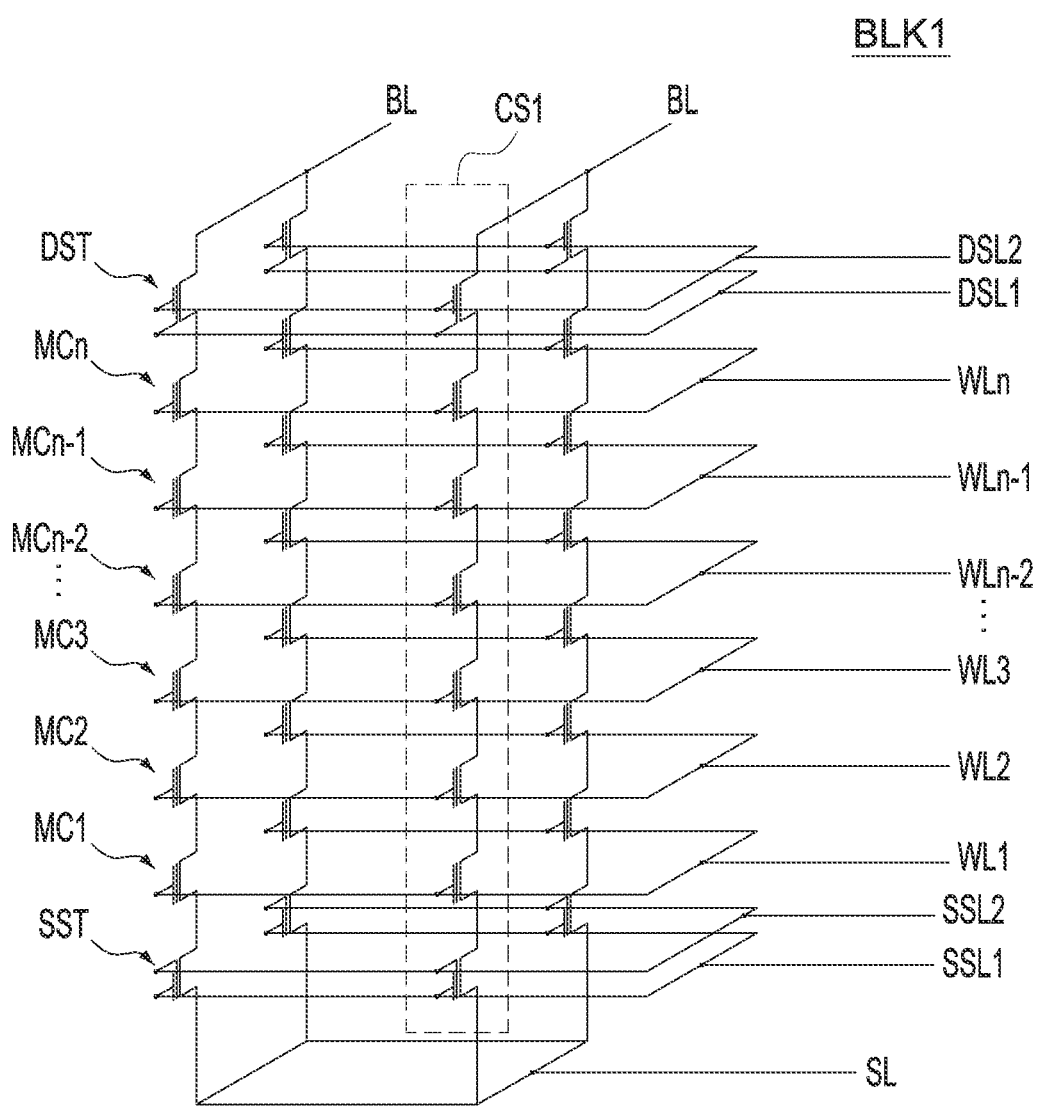
FIG. 8 is a circuit diagram illustrating a memory block of the semiconductor memory device in accordance with the present embodiment.

FIG. 8 is a circuit diagram illustrating a memory block of the semiconductor memory device in accordance with the present embodiment.

As illustrated in FIG. 8, a memory block BLK1 may include a source layer SL and a plurality of cell strings CS1 coupled to a plurality of word lines WL1 to WLn in common. The plurality of cell strings CS1 may be coupled to a plurality of bit lines BL.

Each of the cell strings CS1 may include a source select transistor SST coupled to the source layer SL, a drain select transistor DST coupled to the bit lines BL, and a plurality of memory cells MC1 to MCn coupled in series between the source select transistor SST and the drain select transistor DST. Each of the source select transistor SST and the drain select transistor DST may include two gates (or gate electrodes). Furthermore, each of the source select transistor SST and the drain select transistor DST may include a negative capacitor.

The gates of the plurality of memory cells MC1 to MCn may be coupled to the respective word lines WL1 to WLn which are stacked so as to be spaced apart from each other. The plurality of word lines WL1 to WLn may be disposed between source select lines SSL1 and SSL2 and drain select lines DSL1 and DSL2.

The first source select line SSL1 may be coupled to the second gate electrode of the source select transistor SST, and a second source select line SSL2 may be coupled to a first gate electrode of the source select transistor SST. The second source select line SSL2 may be positioned above the first source select line SSL1. The first gate electrode of the source select transistor SST may serve to control negative capacitance. The second gate electrode of the source select transistor SST may serve to control on/off of a channel.

The first drain select line DSL1 may be coupled to a first gate electrode of the drain select transistor DST, and the second drain select line DSL2 may be coupled to a second gate electrode of the drain select transistor DST. The first gate electrode of the drain select transistor DST may serve to control negative capacitance. The second gate electrode of the drain select transistor DST may serve to control on/off of the channel.

The source layer SL may be coupled to the source of the source select transistor SST. The drain of the drain select transistor DST may be coupled to the bit line BL corresponding to the drain of the drain select transistor DST.

Figure 9:
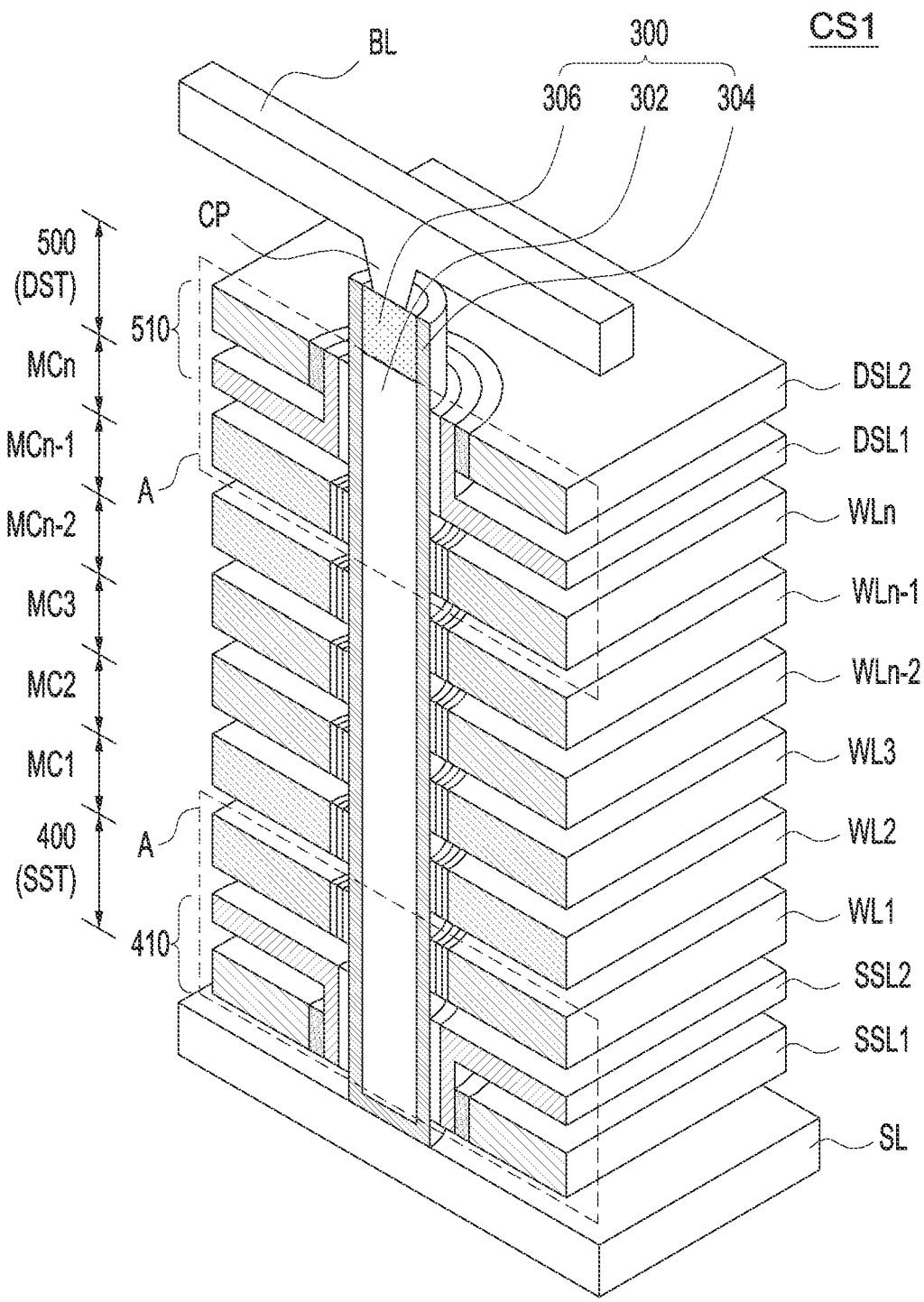
FIG. 9 is a perspective view illustrating a cell string of the semiconductor memory device in accordance with the present embodiment.
Figure 10:
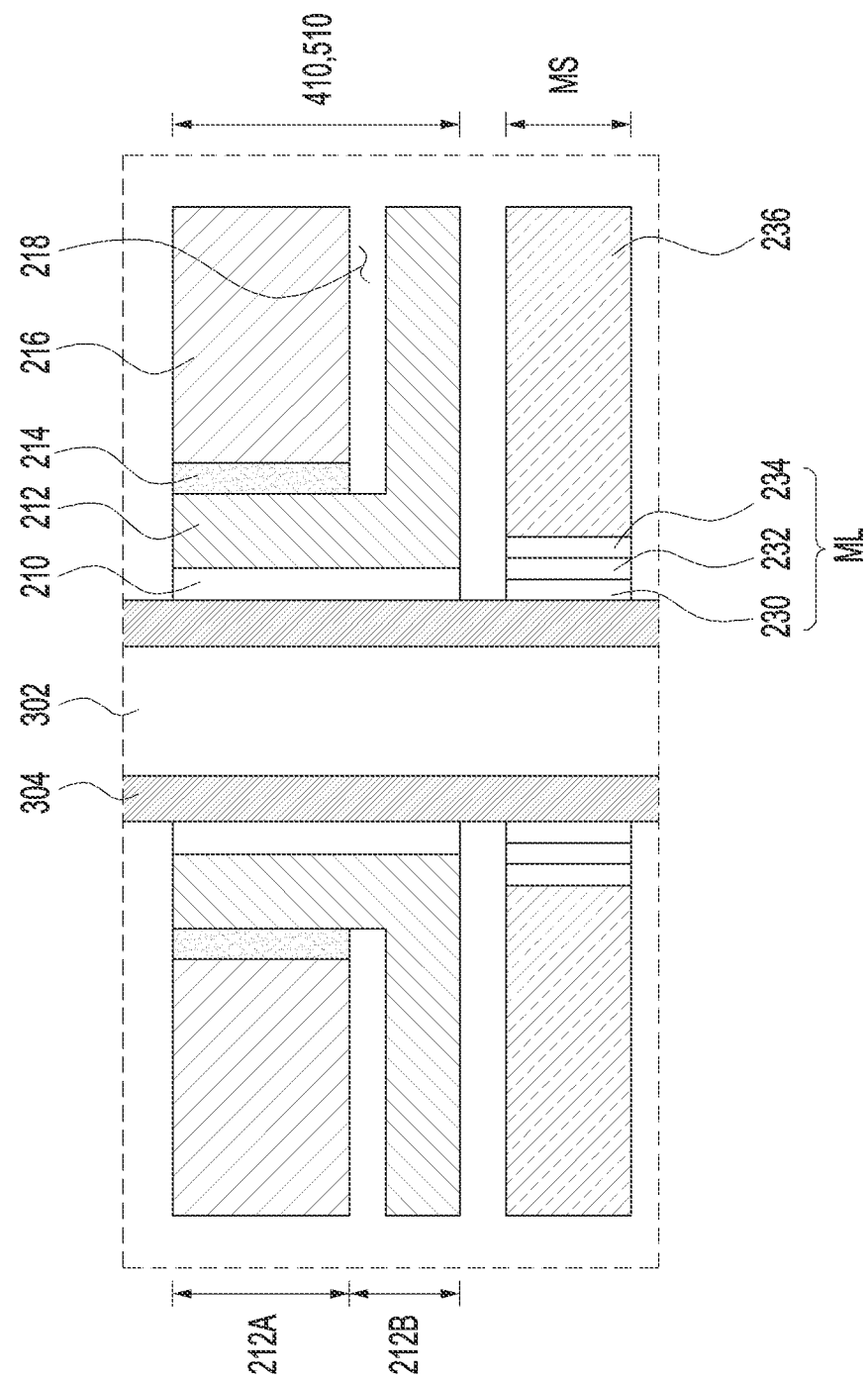
FIG. 10 is an expanded cross-sectional view of a region A illustrated in FIG. 9.

FIG. 9 is a perspective view illustrating a cell string of the semiconductor memory device in accordance with the present embodiment. FIG. 10 is an expanded cross-sectional view of a region A illustrated in FIG. 9.

As illustrated in FIGS. 8 to 10, the cell string CS1 in accordance with the present embodiment may include a channel structure 300, a plurality of memory cells MC1 to MCn, a first switching element 400 and a second switching element 500, which are positioned between the source layer SL and the bit line BL. The source layer SL may have a planar shape, and serve as the source of the source select transistor SST. The bit line BL may be electrically coupled to the channel structure 300 through a contact plug CP.

The channel structure 300 may couple the source layer SL and the bit line BL which are stacked so as to be spaced apart from each other, and have a pillar shape extended in a vertical direction. Therefore, one end and the other end of the channel structure 300 may be electrically coupled to the source layer SL and the bit line BL, respectively. The channel structure 300 may include a core pillar 302, a capping layer 306 and a channel layer 304. The core pillar 302 may have a cylindrical shape, and include a dielectric material. The capping layer 306 may be positioned between the core pillar 302 and the bit line BL, and include a doped semiconductor layer. For example, the doped semiconductor layer may include a silicon layer doped with an n-type impurity. The capping layer 306 may serve as the drain of the drain select transistor DST, and be coupled to the contact plug CP of the bit line BL. The channel layer 304 may surround the bottom and side surfaces of the core pillar 302, and be electrically coupled to the source layer SL. The channel layer 304 may be electrically coupled to the capping layer 306 while surrounding the side surfaces of the capping layer 306. The channel layer 304 may include a semiconductor layer. For example, the semiconductor layer may include a silicon layer.

The plurality of memory cells MC1 to MCn may be stacked so as to be spaced apart from each other, while surrounding the channel structure 300. Among the plurality of memory cells MC1 to MCn, the memory cells MC1 and MCn positioned adjacent to the first and second switching elements 400 and 500, respectively, may be used as dummy cells. Each of the memory cells MC1 to MCn may include a memory structure MS surrounding the channel structure 300. The memory structure MS may have substantially the same configuration as the second gate stack GS2 illustrated in FIG. 3. That is, the memory structure MS may include a tunnel dielectric layer 230 surrounding the channel layer 304, a charge trapping layer 232 surrounding the tunnel dielectric layer 230, a blocking layer 234 surrounding the charge trapping layer 232, and a gate electrode 236 surrounding the blocking layer 234 and having a planar shape. In the memory structure MS, the gate electrode 236 may serve as the word line WL. Since the memory structure MS has substantially the same configuration as the second gate stack GS2 illustrated in FIG. 3, additional detailed descriptions thereof will be omitted herein.

Each of the first and second switching elements 400 and 500 may include a negative capacitor. The first and second switching elements 400 and 500 may be positioned on one side and the other side of the memory cells MC1 to MCn, respectively, while sharing the channel structure 300. For example, the first switching element 400 may be positioned between the source layer SL and the memory cells MC1 to MCn, and the second switching element 500 may be positioned between the bit line BL and the memory cells MC1 to MCn. Therefore, the first switching element 400 may serve as the source select transistor SST, and the second switching element 500 may serve as the drain select transistor DST. The first and second switching elements 400 and 500 may have a symmetrical shape in the extension direction of the channel structure 300, i.e. the longitudinal direction of the channel.

The first and second switching elements 400 and 500 may include gate structures 410 and 510, respectively, which have a GAA (Gate All Around) structure to surround the channel structure 300. Each of the gate structures 410 and 510 may have substantially the same configuration as the gate stack GS illustrated in FIG. 1. That is, each of the gate structures 410 and 510 may include a first gate dielectric layer 210 surrounding the channel layer 304, a first gate electrode 212 surrounding the first gate dielectric layer 210, a second gate dielectric layer 214 surrounding a part of the first gate electrode 212 and including a ferroelectric material which selectively has negative capacitance, and a second gate electrode 216 surrounding the second gate dielectric layer 214 and have a planar shape. The first gate electrode 212 may include a first region 212A and a second region 212B. The first region 212A may be positioned between the first gate dielectric layer 210 and the second gate dielectric layer 214 so as to surround the first gate dielectric layer 210, and the second region 212B may be extended from the first region 212A so as to neighbor on a sidewall of the second gate electrode 216 with a gap 218 provided therebetween, and have a planar shape. The line width of the gap 218 in the longitudinal direction of the channel may be larger than at least the thickness of the first gate dielectric layer 210. The line width of the gap 218 in the longitudinal direction of the channel may be smaller than the distance between the memory structure MS and the gate structures 410 and 510.

The second region 212B of the first gate electrode 212 may be positioned between the memory structure MS and the second gate electrode 216 of the gate structure 410 or 510, in order to easily control a channel boosting effect. Such a structure can adjust the turn-on and turn-off operations through a bias applied to the first gate electrode 212, thereby preventing unnecessary interference with the adjacent memory cell MC1 or MCn. In other words, such a structure can adjust the potential level of the channel, induced by the first and second switching elements 400 and 500, through the bias applied to the first gate electrode 212, thereby improving the operation reliability of the adjacent memory cell MC1 or MCn.

In the gate structure 410 of the first switching element 400, the first and second gate electrodes 212 and 216 may serve as the second source select line SSL2 and the first source select line SSL1, respectively. In the gate structure 510 of the second switching element 500, the first and second gate electrodes 212 and 216 may serve as the first drain select line DSL1 and the second drain select line DSL2, respectively. Since each of the gate structures 410 and 510 has substantially the same configuration as the gate stack GS illustrated in FIG. 1, additional detailed descriptions thereof will be omitted herein.

The turn-on operations and turn-off operations of the first and second switching elements 400 and 500 may be performed in substantially the same manner as those illustrated in FIG. 2. Furthermore, a publicly known method may be used to perform a program operation, an erase operation and a read operation for the source layer SL, the bit line BL and the memory cells MC1 to MCn.

In the present embodiment, the case in which each of the first and second switching elements 400 and 500 includes a negative capacitor has been taken as an example. However, the present embodiment is not limited thereto. In a modification, only one of the first and second switching elements 400 and 500 may include a negative capacitor.

As described above, the semiconductor memory device in accordance with the present embodiment may include the first and second switching elements 400 and 500 each having the negative capacitor, thereby improving the operation speed and the operation reliability of the semiconductor memory device. In particular, since the semiconductor memory device can implement the subthreshold voltage switching swing value of 60 mV/dec or less which is a theoretical limit, the semiconductor memory device can improve the on/off response speed of the channel. Furthermore, during the erase operation for the memory cells MC1 to MCn, a turn-on slope of GIDL (Gate Induced Drain Leakage), i.e. a GIDL formation time can be shortened to improve the erase speed. The GIDL formation time may indicate the turn-on operation time of each of the first and second switching elements 400 and 500. Since the GIDL formation time can be shortened during the erase operation, it may be possible to fundamentally prevent a problem which occurs while holes are generated in the channel when the erase operation is temporarily stopped. For reference, when the subthreshold voltage swing values of the source select transistor SST and the drain select transistor DST exceed 60 mV/dec, the GIDL formation time may increase during the erase operation. Thus, when an erase temporary stop command is applied while the GIDL is formed (i.e. during the turn-on operation time), the erase operation may be stopped in response to the erase temporary stop command, while the holes are generated in the channel. In this case, the holes may be accumulated in the channel, and cause an error during the erase operation.

FIGS. 11A to 11H are cross-sectional views illustrating a method for fabricating a semiconductor memory device in accordance with an embodiment. For reference, FIGS. 11A to 11H are cross-sectional views for describing an example of the method for fabricating a semiconductor memory device, illustrated in FIGS. 8 to 10. For reasons in process, the cross-sectional shapes of FIGS. 11A to 11H may be partially different from that of FIG. 9.

Figure 11A:
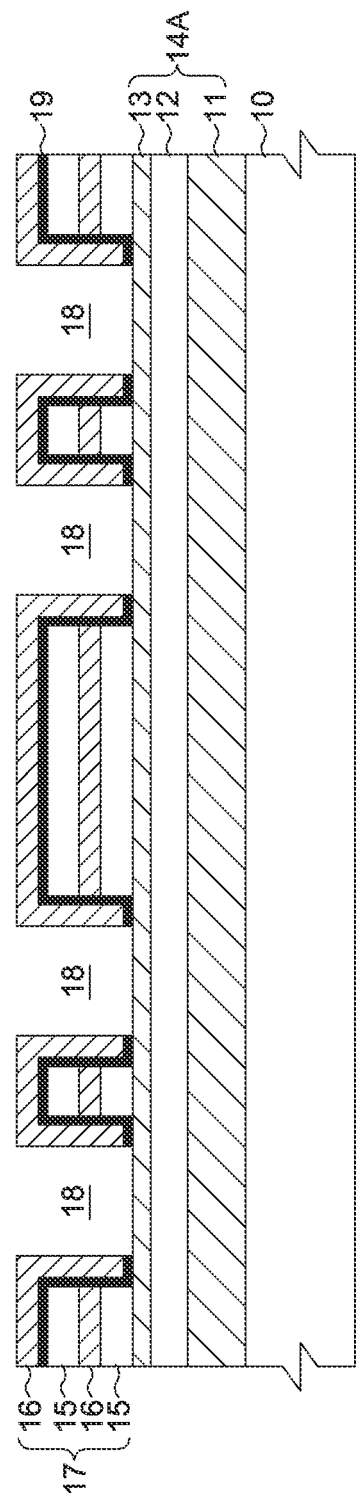
FIGS. 11A, 11B, 11C, 11D, 11E, 11F, 11G, and 11H are cross-sectional views illustrating a method for fabricating a semiconductor memory device in accordance with an embodiment.

As illustrated in FIG. 11A, a pre-source layer 14A is formed on a substrate 10 having a predetermined structure, for example, a peripheral circuit formed thereon. The pre-source layer 14A may be formed in such a shape that a first victim layer 12 is inserted between semiconductor layers doped with an impurity. For example, the pre-source layer 14A may be formed as a multilayer in which a first silicon layer 11 doped with an n-type impurity, the first victim layer 12, and a second silicon layer 13 doped with an n-type impurity are sequentially stacked.

Although not illustrated, an isolation dielectric layer may be formed between the pre-source layer 14A and the substrate 10, before the pre-source layer 14A is formed. The isolation dielectric layer may serve to electrically isolate the pre-source layer 14A and the substrate 10 from each other, and prevent damage to the substrate 10 between processes.

Then, a first stacked body 17 in which one or more first material layers 15 and one or more second material layers 16 are alternately stacked is formed, and a first opening 18 is then formed by etching the first stacked body 17 until the pre-source layer 14A is exposed. The first stacked body 17 and the first opening 18 are used to form a first select transistor, i.e. a source select transistor. At the lowermost and uppermost layers of the first stacked body 17, the first material layer 15 may be positioned. Through a subsequent process, the first material layer 15 may serve as an interlayer dielectric layer to isolate stacked gate conductive layers from each other, and the second material layer 16 may serve as a victim layer for forming a gate conductive layer. For this structure, the first material layer 15 may be formed of a material having an etch selectivity with the second material layer 16. For example, the first material layer 15 may include oxide, and the second material layer 16 may include nitride.

Then, a first ferroelectric material layer 19 and the second material layer 16 are sequentially formed along the surface of the first stacked body 17 having the first opening 18 formed therein, and then selectively etched until the pre-source layer 14A is exposed so that the first ferroelectric material layer 19 and the second material layer 16 remain on the sidewall of the first opening 18. The first ferroelectric material layer 19 is a dielectric body of the negative capacitor, and may correspond to the second gate dielectric layer 214 in the gate structure 410 of the first switching element 400 illustrated in FIG. 9.

The first ferroelectric material layer 19 may include a ferroelectric material which selectively has negative capacitance. The ferroelectric material may include a metal oxide with a fluorite structure, which has one or more stable composition regions selected among a cubic system, a tetragonal system and a monoclinic system. For example, the first ferroelectric material layer 19 may be formed of hafnium oxide. The first ferroelectric material layer 19 may be formed to have a thickness of 20 nm or less, in order to easily vary capacitance and to stably maintain a fluorite structure. For example, the first ferroelectric material layer 19 may be formed to have a thickness of about 1 nm to about 20 nm.

The first ferroelectric material layer 19 may be formed through ALD (Atomic Layer Deposition). This is in order to implement a stable crystalline structure and composition, and to prevent a reduction in negative capacitor effect, caused by traps formed at an interface. Hereafter, the case in which the first ferroelectric material layer 19 is formed of hafnium oxide will be taken as an example of the method for forming the first ferroelectric material layer 19.

The ALD may be repeatedly performed through a plurality of unit cycles each including a precursor supply step, a precursor purge step, an oxidizer supply step and an oxidizer purge step which are sequentially performed. While the plurality of unit cycles are repeatedly performed, the inside of a chamber may be controlled to have a temperature of 300 degrees Celsius (° C.) or less, for example, a range of 180° C. to 300° C. The internal temperature of the chamber may have an influence on the crystalline structure of hafnium oxide, and hafnium oxide needs to be deposited at a temperature of 300° C. or less in order to form the hafnium oxide with a stable fluorite structure.

In the supply precursor step, bis(methyl-η5-cyclopentadienyl) dimethylhafnium, tetrakis(dimethylamido) hafnium, tetrakis(ethylmethylamido) hafnium, bis(methyl-η5-cyclopentadienyl) methoxymethylhafnium, tbutoxytris(ethylmethylamido) hafnium or the like may be used as a hafnium precursor. The hafnium precursor may be chemically adsorbed onto the surface of a basal layer, and formed as a monoatomic layer. Then, purge gas may be supplied to the chamber to purge the precursor, remaining in the chamber, to the outside. As the purge gas, argon gas or nitrogen gas may be used.

In the oxidizer supply step, oxygen gas may be used as the oxidizer. At this time, a plasma atmosphere may be created at the same time as the oxidizer is supplied. Furthermore, the plasma atmosphere may be created after the oxidizer is supplied to adsorb oxygen onto the hafnium precursor adsorbed onto the basal layer. Then, the purge gas may be supplied to the chamber to purge the oxidizer, remaining in the chamber, to the outside.

After the thin film deposition is completed, an anneal process may be performed in order to heal a defect at the interface of the first ferroelectric material layer 19, and to stabilize the crystalline structure. The anneal process may be performed at a temperature of 400° C. to 900° C. under an oxygen atmosphere. The reason why the anneal process is performed under an oxygen atmosphere is in order to suppress an imbalance in composition ratio of the thin film, and to improve the quality of the film by binding oxygen with the defect within the thin film. In particular, as the thin film is formed through the ALD, a point defect formed in the thin film and having a positive charge can be removed.

Figure 11B:
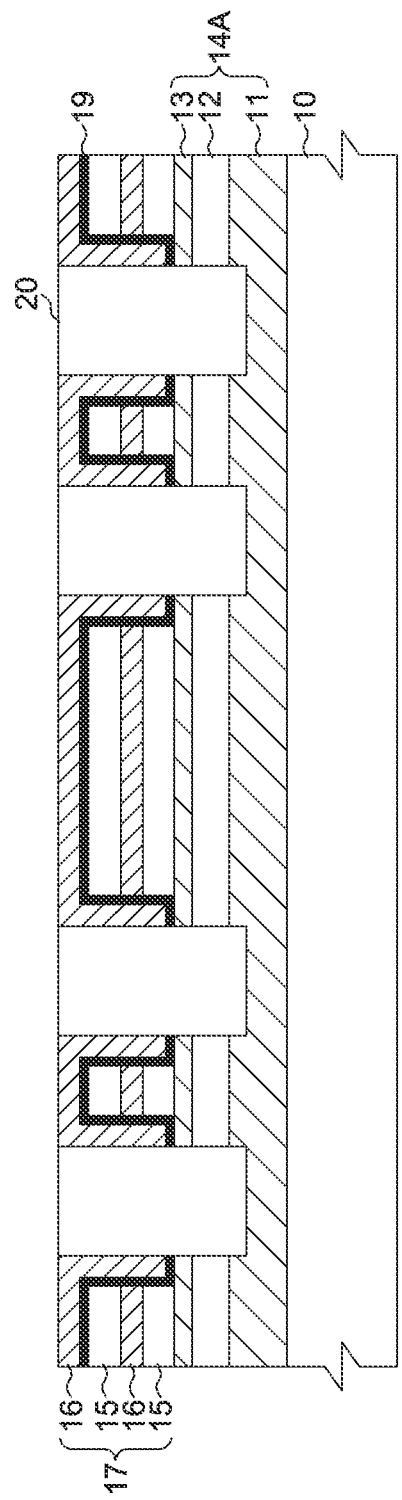

As illustrated in FIG. 11B, the pre-source layer 14A exposed to the bottom surface of the first opening 18 is etched to expand the first opening 18. In this case, the etching process is performed so that the expanded first opening 18 is formed through the first victim layer 12. This is in order to electrically couple a channel layer and a source layer which will be formed through subsequent processes.

Then, a second victim layer 20 is formed to gap-fill the expanded first opening 18. The second victim layer 20 may be formed of a material having an etching selectivity with the first victim layer 12.

Figure 11C:
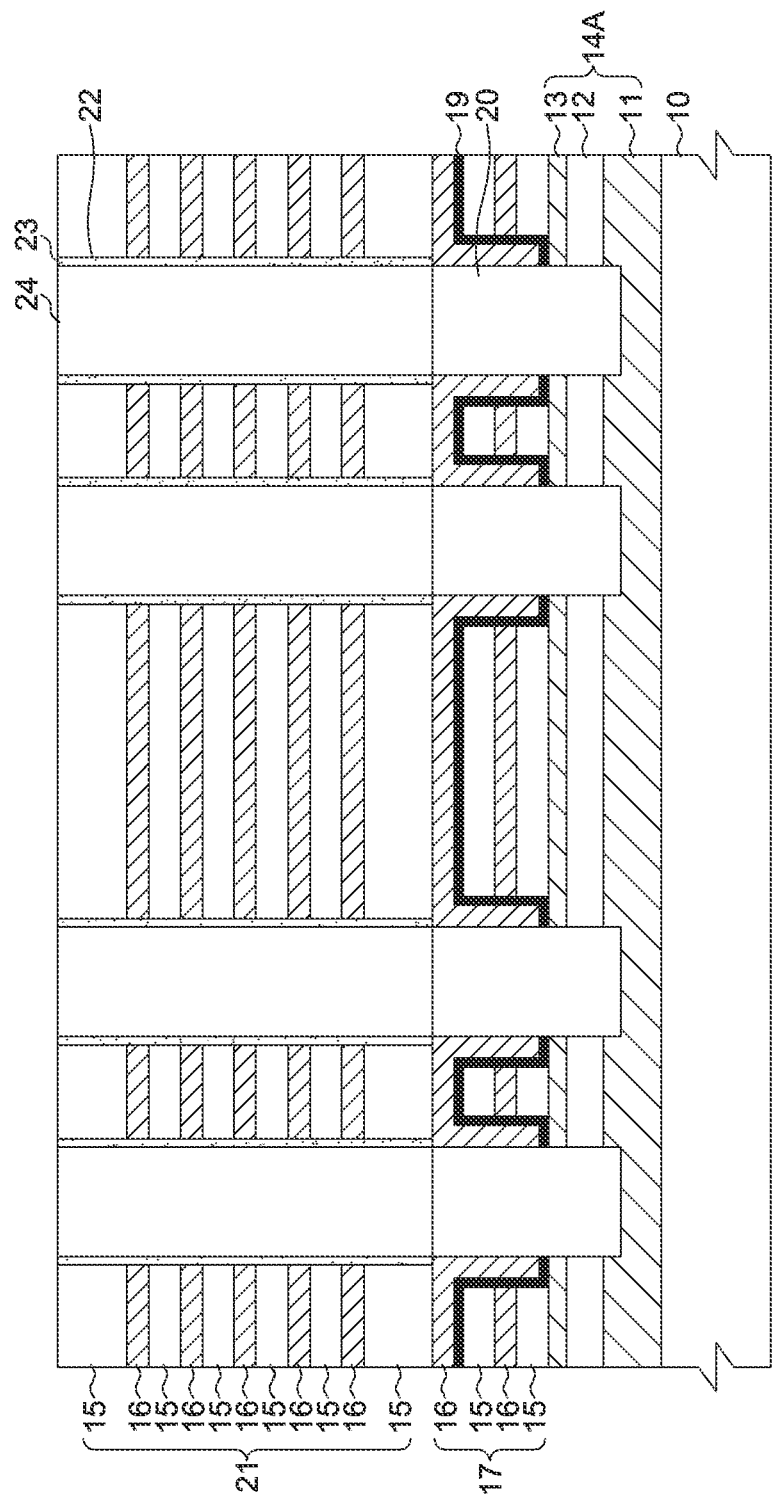

As illustrated in FIG. 11C, a second stacked body 21 in which a plurality of first material layers 15 and a plurality of second material layers 16 are alternately stacked is formed on the first stacked body 17. At the lowermost and uppermost layers of the second stacked body 21, the first material layer 15 may be positioned. The first material layer 15 positioned at the lowermost and uppermost layers may have a relatively large thickness. In other words, the first material layer 15 positioned at the lowermost and uppermost layers may have a relatively larger thickness as compared to the first material layers 15 located between the lowermost and uppermost layers.

Then, by selectively etching the second stacked body 21 until the second victim layer 20 is exposed, a second opening 22 is formed through the second stacked body 21. The second stacked body 21 and the second opening 22 are used to form a plurality of memory cells.

Then, a memory layer 23 is formed on the sidewall of the second opening 22. The memory layer 23 may be formed as a charge trapping layer or a multilayer in which a charge trapping layer and a blocking layer are stacked. The charge trapping layer may include nitride, and the blocking layer may include oxide.

Then, a third victim layer 24 is formed to gap-fill the second opening 22 in which the memory layer 23 is formed. The third victim layer 24 may be formed of the same material as the second victim layer 20.

Figure 11D:
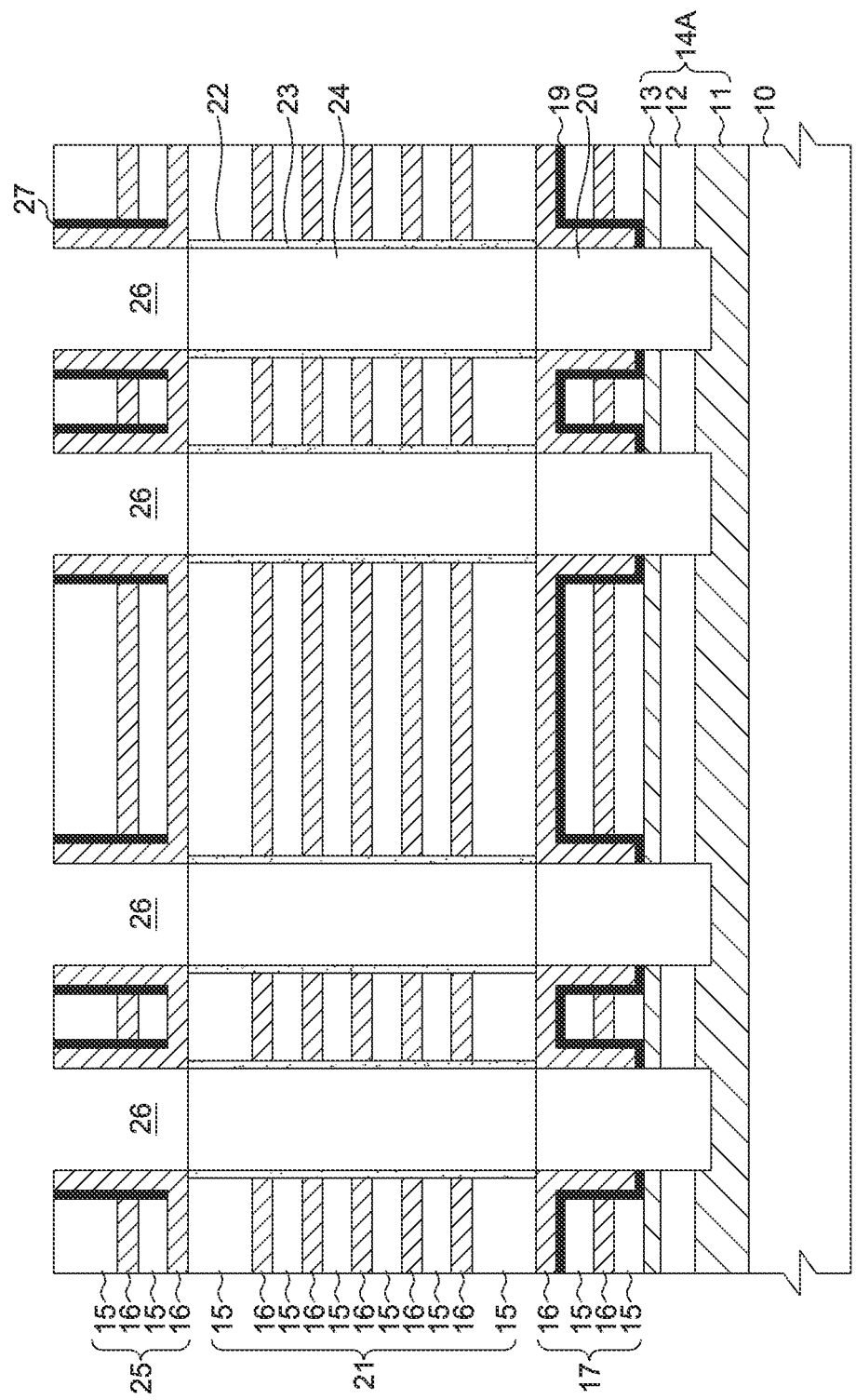

As illustrated in FIG. 11D, a third stacked body 25 in which one or more first material layers 15 and one or more second material layer 16 are alternately stacked is formed on the second stacked body 21. At the lowermost layer of the third stacked body 25, the second material layer 16 may be positioned. At the uppermost layer of the third stacked body 25, the first material layer 15 may be positioned. The first material layer 15 positioned at the uppermost layer of the third stacked body 25 may have a relatively large thickness than the first material layer 15 positioned below it. This is in order to secure a space for forming a capping layer during a subsequent process.

Then, a third opening 26 is formed by selectively etching the third stacked body 25 until the second material layer 16 positioned at the lowermost layer of the third stacked body 25 is exposed, and a second ferroelectric material layer 27 is then formed on the sidewall of the third opening 26. The second ferroelectric material layer 27 is a dielectric body of the negative capacitor, and may correspond to the second gate dielectric layer 214 in the gate structure 510 of the second switching element 500 illustrated in FIG. 9. The second ferroelectric material layer 27 may be formed through the same method as the first ferroelectric material layer 19.

Then, the second material layer 16 is formed on the sidewall of the third opening 26 having the second ferroelectric material layer 27 formed thereon, and the third opening 26 is then expanded by etching the second material layer 16 positioned at the lowermost layer of the third stacked body 25 until the third victim layer 24 is exposed. The third stacked body 25 and the third opening 26 are used to form a drain select transistor.

Figure 11E:
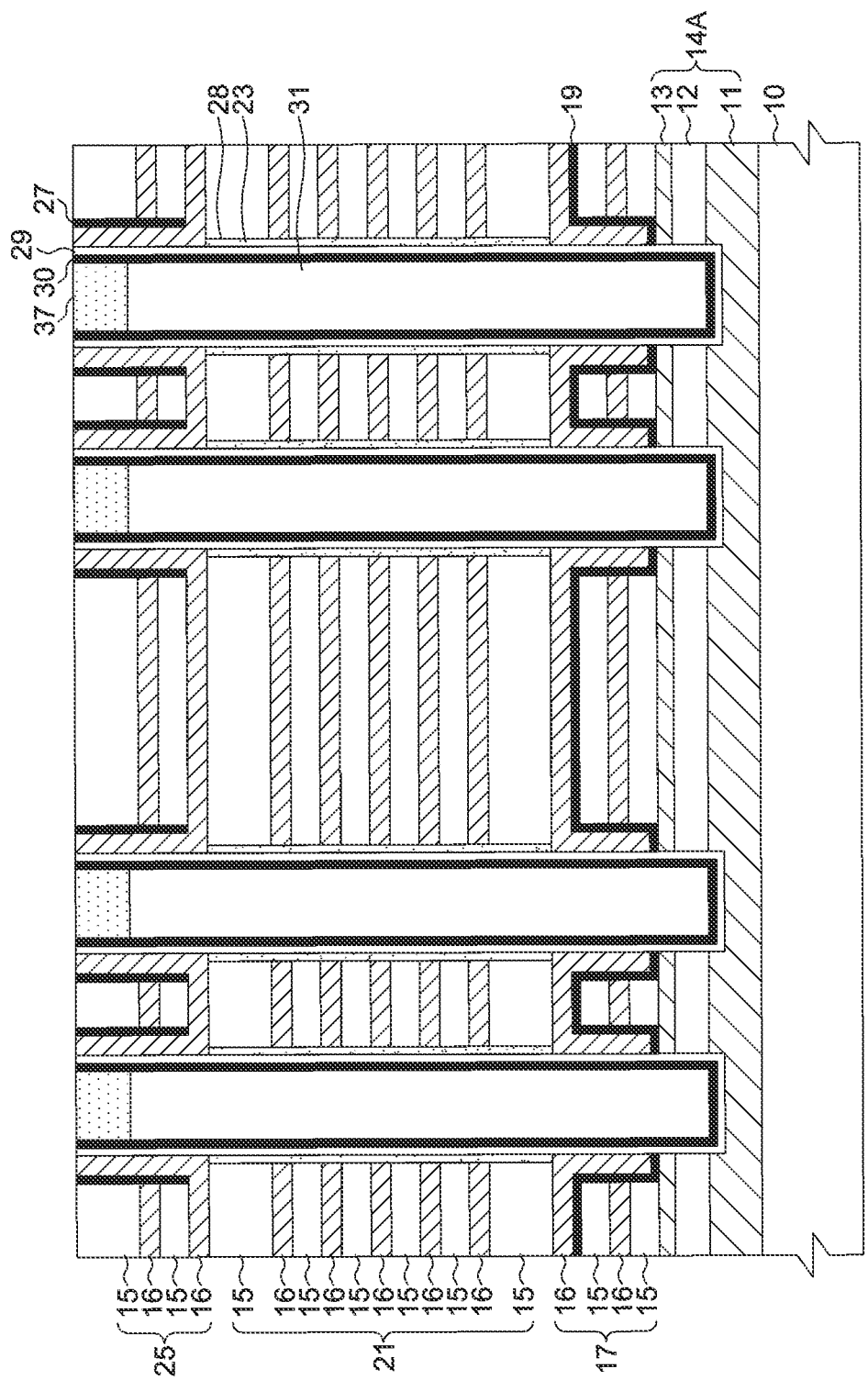

As illustrated in FIG. 11E, a channel hole 28 is formed by sequentially removing the third victim layer 24 and the second victim layer 20 through the third opening 26. As a result, the first opening 18, the second opening 22 and the third opening 26 are connected to one another through the channel hole 28.

Then, a tunnel dielectric layer 29 and a channel layer 30 are sequentially formed along the surface of the channel hole 28. The surface of the channel hole 28 may indicate side and bottom surfaces of the channel hole 28, the tunnel dielectric layer 29 may include oxide, and the channel layer 30 may include a semiconductor layer. The semiconductor layer used as the channel layer 30 may be a silicon layer doped with no impurity. The tunnel dielectric layer 29 formed in the first stacked body 17 may be used as the first gate dielectric layer 210 in the gate structure 410 of the first switching element 400 illustrated in FIG. 9. The tunnel dielectric layer 29 formed in the third stacked body 25 may be used as the first gate dielectric layer 210 in the gate structure 510 of the second switching element 500 illustrated in FIG. 9.

Then, a core pillar 31 is formed on the channel layer 30 so as to gap-fill the channel hole 28. The core pillar 31 may include oxide.

Then, the core pillar 31 is recessed by a predetermined thickness, and a capping layer 37 is formed in the recessed space so as to abut with the channel layer 30. The capping layer 37 may be formed of a semiconductor layer doped with an impurity, for example, a silicon layer doped with an n-type impurity. The capping layer 37 may serve as the drain of a drain select transistor.

Figure 11F:
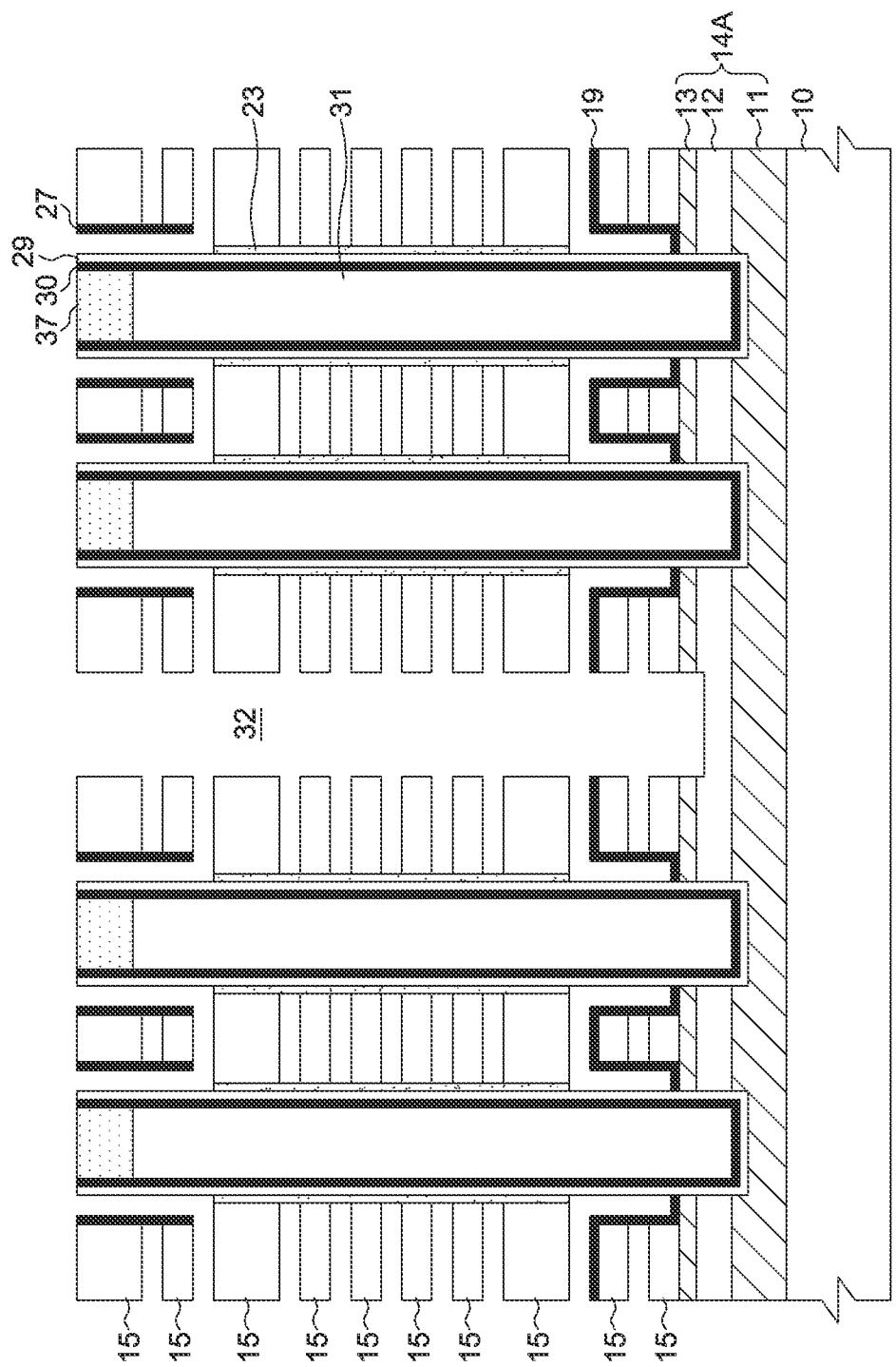

As illustrated in FIG. 11F, a fourth opening 32 is formed through the first to third stacked bodies 17, 21 and 25 so as to expose the first victim layer 12 of the pre-source layer 14A. The fourth opening 32 may be used to form a common source line 36 or a support structure. The fourth opening 32 may have a slit shape when seen from the top.

Then, an etch process is performed to remove the second material layers 16 from the first to third stacked bodies 17, 21 and 25 through the fourth opening 32. Through the etch process of selectively removing the second material layers 16, it may be possible to secure a space in which a plurality of gate conductive layers are to be formed.

Figure 11G:
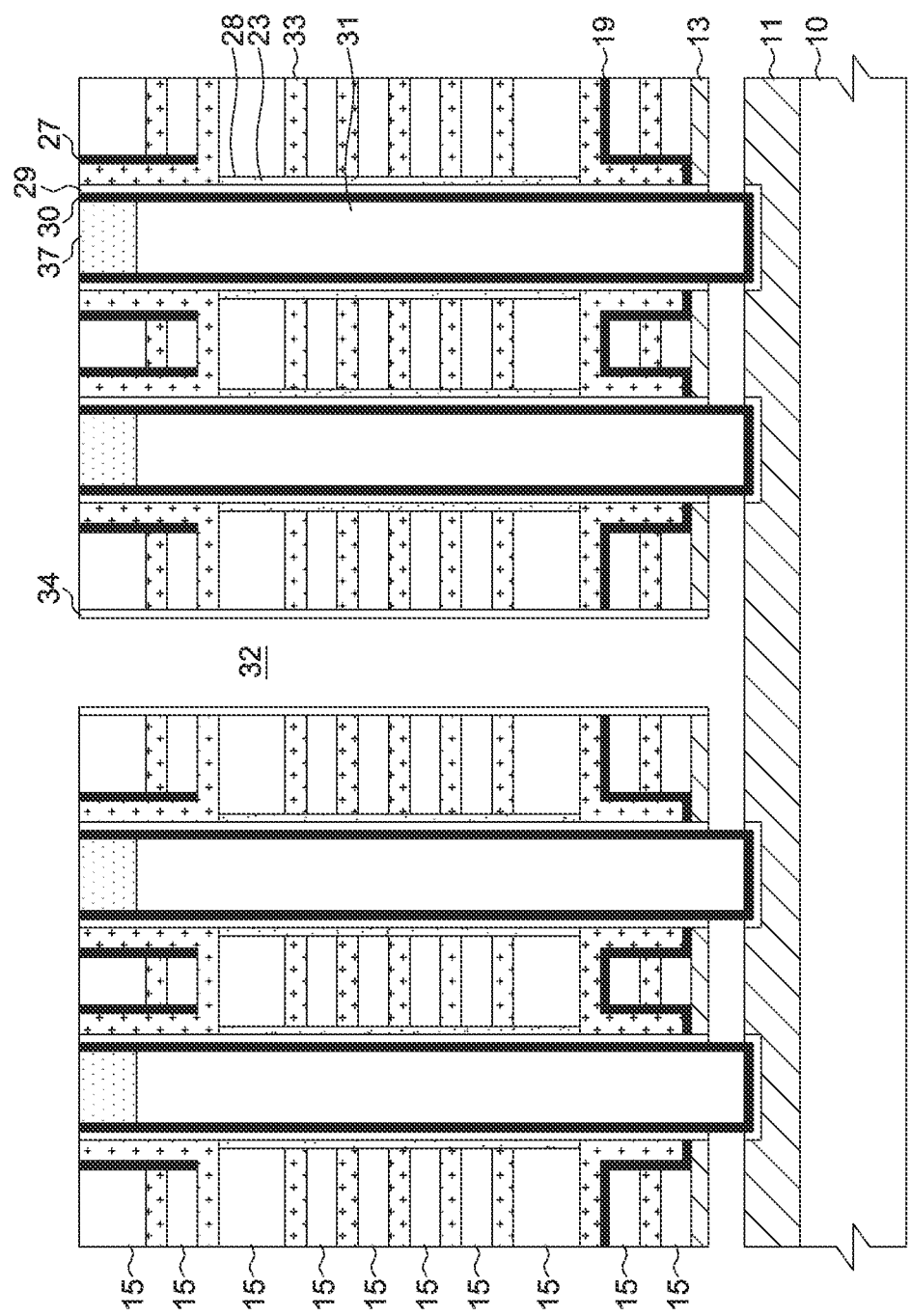

As illustrated in FIG. 11G, a plurality of gate conductive layers 33 are formed by gap-filling the space, from which the second material layers 16 are removed, with a conductive material. As the conductive material for forming the plurality of gate conductive layers 33, a metallic material may be used. The gate conductive layer 33 formed in the first stacked body 17 may be used as the first and second gate electrodes 212 and 216 in the gate structure 410 of the first switching element 400 illustrated in FIG. 9. The gate conductive layer 33 formed in the second stacked body 21 may be used as the gate electrodes 236 of the respective memory cells MC1 to MCn illustrated in FIG. 9. The gate conductive layer 33 formed in the third stacked body 25 may be used as the first and second gate electrodes 212 and 216 in the gate structure 510 of the second switching element 500 illustrated in FIG. 9.

Then, an isolation process for isolating the plurality of stacked gate conductive layers 33 from each other, for example, an etch-back process is performed, and a spacer 34 is then formed on the sidewall of the fourth opening 32. The spacer 34 may be formed as a single layer of any one element selected from the group consisting of oxide, nitride and oxynitride or a stacked layer of two or more elements selected from the group.

Then, an etch process for removing the first victim layer 12 exposed through the fourth opening 32 is performed. Continuously, the tunnel dielectric layer 29, which is exposed as the first victim layer 12 is removed, is selectively etched to expose the channel layer 30.

Figure 11H:
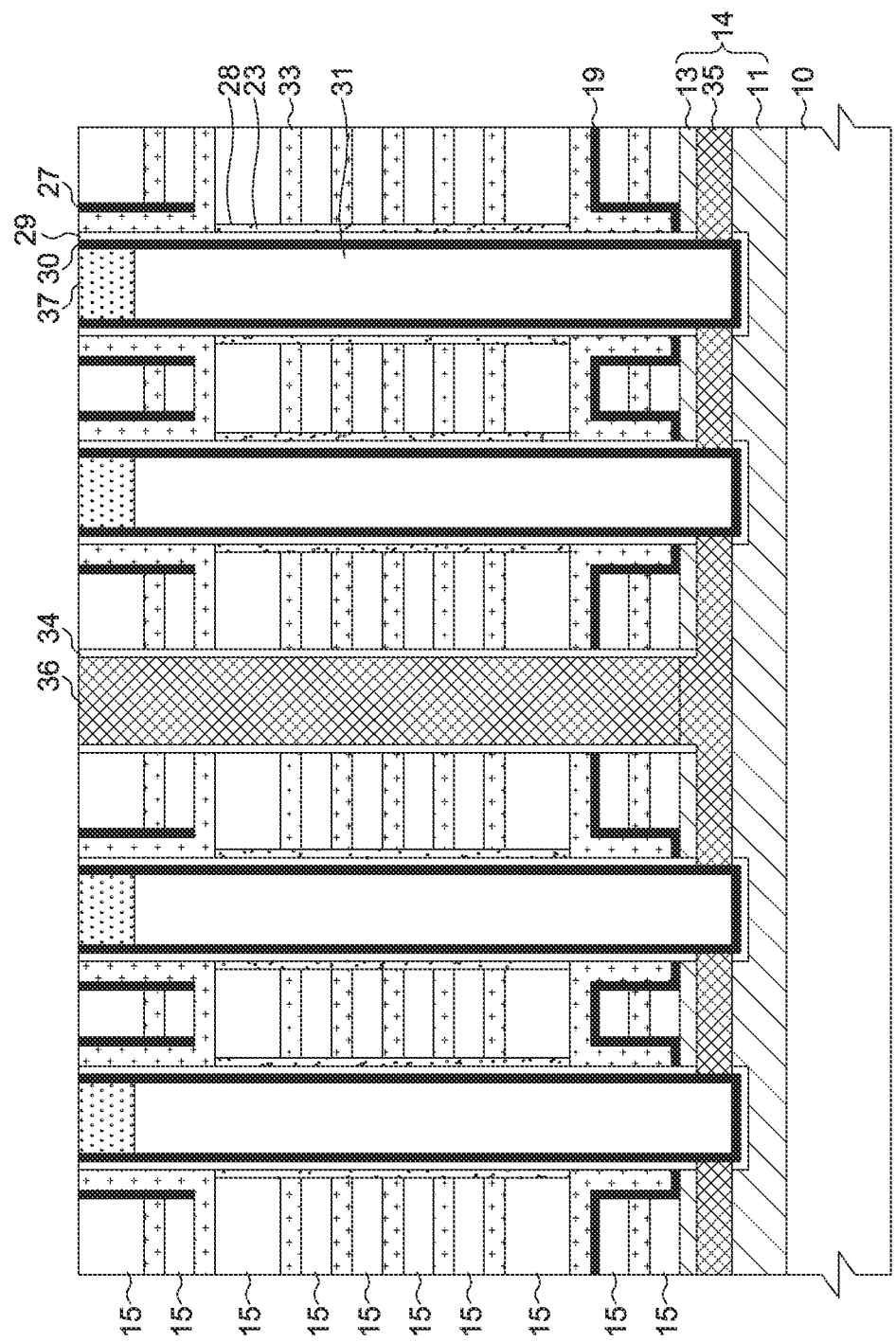

As illustrated in FIG. 11H, a conductive layer is formed to gap-fill the space from which the first victim layer 12 is removed. The conductive layer to gap-fill the space from which the first victim layer 12 is removed may be formed of a semiconductor layer, for example, a third silicon layer 35 doped with an n-type impurity. The third silicon layer 35 may abut on the channel layer 30, and the impurity doping concentration of the third silicon layer 35 may be higher than the impurity doping concentrations of the first and second silicon layers 11 and 13.

Thus, a source layer 14 may be formed, which includes the first to third silicon layers 11, 13 and 35 and abuts on the channel layer 30.

Then, the common source line 36 is formed to gap-fill the fourth opening 32 and to abut on the source layer 14. The common source line 36 may be formed of a semiconductor layer or a multilayer in which a semiconductor layer and a metallic layer are stacked. The semiconductor layer may be formed of a silicon layer doped with an n-type impurity, and formed together during the process for forming the third silicon layer 35 of the source line, doped with an n-type impurity.

In the present embodiment, the case in which the common source line 36 is formed in the fourth opening 32 has been taken as an example. However, the present embodiment is not limited thereto. In a modification, the fourth opening 32 may be gap-filled with a dielectric material to form a support structure which supports the first to third stacked bodies 17, 21 and 25.

Figure 12:
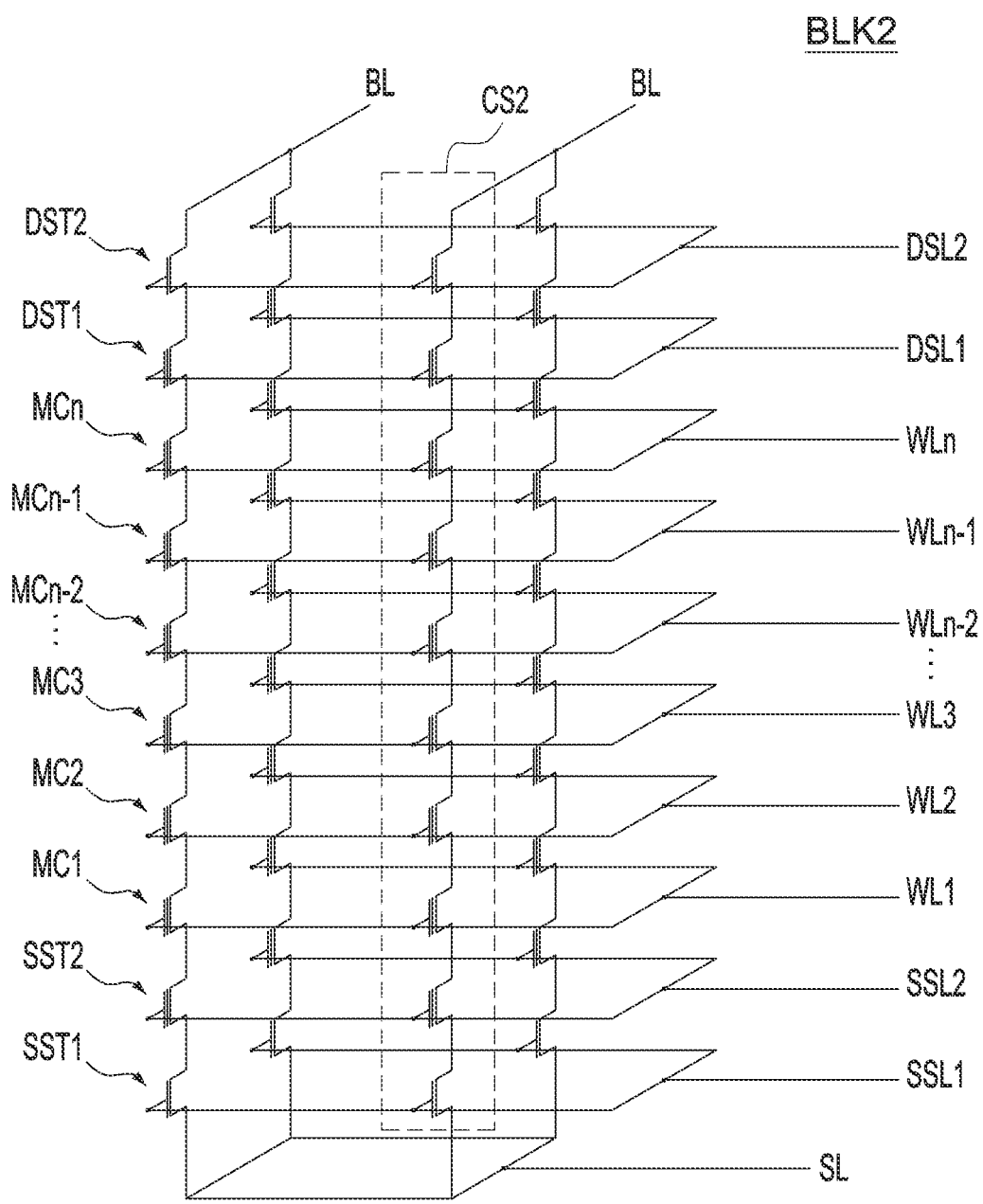
FIG. 12 is a circuit diagram illustrating a memory block of a semiconductor memory device in accordance with an embodiment.

FIG. 12 is a circuit diagram illustrating a memory block of a semiconductor memory device in accordance with an embodiment.

As illustrated in FIG. 12, a memory block BLK2 may include a source layer SL and a plurality of cell strings CS2 coupled to a plurality of word lines WL1 to WLn in common. The plurality of cell strings CS2 may be coupled to a plurality of bit lines BL.

Each of the cell strings CS2 may include source select transistors SST1 and SST2 coupled to the source layer SL, drain select transistors DST1 and DST2 coupled to the bit line BL, and a plurality of memory cells MC1 to MCn coupled in series between the source select transistors SST1 and SST2 and the drain select transistors DST1 and DST2. Each of the first source select transistor SST1 coupled to the source layer SL and the second drain select transistor DST2 coupled to the bit line BL may have a negative capacitor.

The gates of the plurality of memory cells MC1 to MCn may be coupled to the respective word lines WL1 to WLn which are stacked so as to be spaced apart from each other. The plurality of word lines WL1 to WLn may be disposed between source select lines SSL1 and SSL2 and drain select lines DSL1 and DSL2.

The first source select line SSL1 may be coupled to a gate electrode of the first source select transistor SST1, and the second source select line SSL2 may be coupled to a first gate electrode of the second source select transistor SST2, respectively. The source and drain of the first source select transistor SST1 may be coupled to the source layer SL and the source of the second source select transistor SSTS2. The drain of the second source select transistor SST2 may be coupled to the memory cell MC1. The second source select line SSL2 may be positioned above the first source select line SSL1.

The first drain select line DSL1 may be coupled to a gate electrode of the first drain select transistor DST1, and the second drain select line DSL2 may be coupled to a second gate electrode of the second drain select transistor DST2. The source and drain of the first drain select transistor DST1 may be coupled to the memory cell MCn and the source of the second drain select line DSL2, respectively. The drain of the second drain select line DSL2 may be coupled to the bit line BL. The second drain select line DSL2 may be positioned above the first drain select line DSL1.

Figure 13:
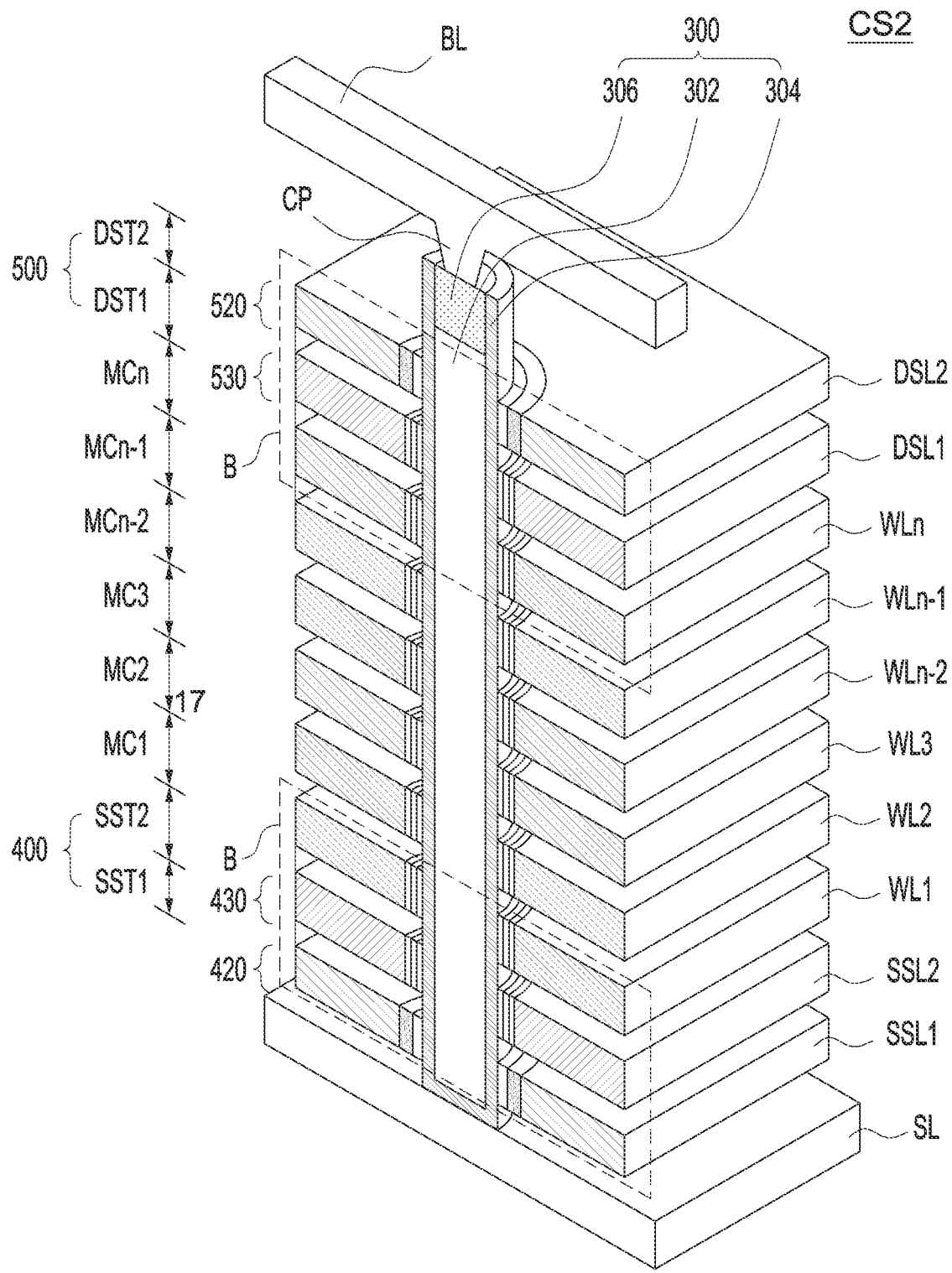
FIG. 13 is a perspective view illustrating a cell string of the semiconductor memory device in accordance with the present embodiment.
Figure 14:
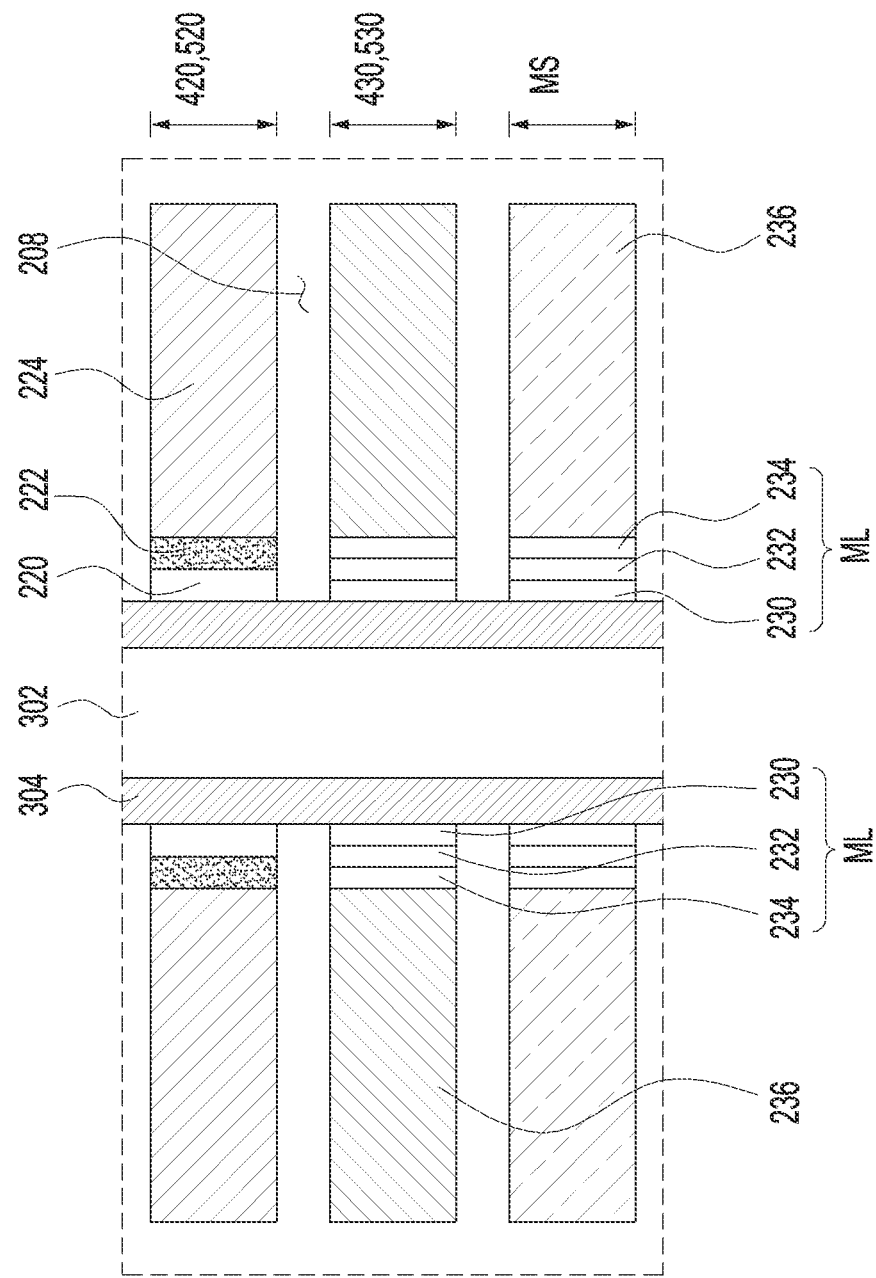
FIG. 14 is an expanded cross-sectional view of a region B illustrated in FIG. 13.

FIG. 13 is a perspective view illustrating a cell string of the semiconductor memory device in accordance with the present embodiment. FIG. 14 is an expanded cross-sectional view of a region B illustrated in FIG. 13.

As illustrated in FIGS. 12 to 14, the cell string CS2 in accordance with the present embodiment may include a channel structure 300, a plurality of memory cells MC1 to MCn, a first switching element 400 and a second switching element 500, which are positioned between the source layer SL and the bit line BL.

The channel structure 300 may couple the source layer SL and the bit line BL which are stacked so as to be spaced apart from each other, and have a pillar shape extended in a vertical direction. The channel structure 300 may include a core pillar 302, a capping layer 306 and a channel layer 304. The channel structure 300 may have substantially the same configuration and shape as the channel structure 300 illustrated in FIG. 9. Therefore, additional detailed descriptions of the channel structure 300 will be omitted herein.

The plurality of memory cells MC1 to MCn may be stacked so as to be spaced apart from each other, while surrounding the channel structure 300. Among the plurality of memory cells MC1 to MCn, the memory cells MC1 and MCn positioned adjacent to the first and second switching elements 400 and 500, respectively, may be used as dummy cells. Each of the memory cells MC1 to MCn may include a memory structure MS surrounding the channel structure 300. The memory structure MS may have substantially the same configuration as the second gate stack GS2 illustrated in FIG. 3. Furthermore, the memory structure MS may have substantially the same configuration and shape as the memory structure MS illustrated in FIGS. 9 and 10. Therefore, additional detailed descriptions of the memory structure MS will be omitted herein.

The first switching element 400 may include first and second gate structures 420 and 430, and the second switching element 500 may include first and second gate structures 420 and 530. Each of the first and second gate structures 420 and 520 may include a negative capacitor, and the second gate structures 430 and 530 may neighbor on the first gate structures 420 and 520, respectively, with a gap 208 provided therebetween. The first and second switching elements 400 and 500 may be positioned on one side and the other side of the memory cells MC1 to MCn, respectively, while sharing the channel structure 300. For example, the first switching element 400 may be positioned between the source layer SL and the memory cells MC1 to MCn, and the second switching element 500 may be positioned between the bit line BL and the memory cells MC1 to MCn. Therefore, the first switching element 400 may serve as the source select transistor SST, and the second switching element 500 may serve as the drain select transistor DST. The first and second switching elements 400 and 500 may have a symmetrical shape in the extension direction of the channel structure 300, i.e. the longitudinal direction of the channel.

The first and second switching elements 400 and 500 may include the first and second gate structures 420 and 520 and the first and second gate structures 430 and 530, respectively, which have a GAA (Gate All Around) structure to surround the channel structure 300.

Each of the first gate structures 420 and 520 may have substantially the same configuration as the first gate stack GS1 illustrated in FIG. 3. That is, each of the first gate structures 420 and 520 may include a first gate dielectric layer 220, a second gate dielectric layer 222 and a first gate electrode 224. The first gate dielectric layer 220 may surround the channel layer 304, the second gate dielectric layer 222 may surround the first gate dielectric layer 220, and include a ferroelectric material having self-induced negative capacitance, and the first gate electrode 224 may surround the second gate dielectric layer 222 and have a planar shape. Since each of the first gate structures 420 and 520 has substantially the same configuration as the first gate stack GS1 illustrated in FIG. 3, additional detailed descriptions thereof will be omitted herein.

Each of the second gate structures 430 and 530 may have substantially the same configuration as the second gate stack GS2 illustrated in FIG. 3. Furthermore, each of the second gate structures 430 and 530 may have substantially the same configuration as the memory structures MS of the respective memory cells MC1 to MCn. That is, each of the second gate structures 430 and 530 may include a tunnel dielectric layer 230 surrounding the channel layer 304, a charge trapping layer 232 surrounding the tunnel dielectric layer 230, a blocking layer 234 surrounding the charge trapping layer 232, and a second gate electrode 236 surrounding the blocking layer 234 and having a planar shape. Since each of the second gate structures 430 and 530 has substantially the same configuration as the second gate stack GS2 illustrated in FIG. 3, additional detailed descriptions thereof will be omitted herein.

In the first and second gate structures 420 and 430 of the first switching element 400, the first and second gate electrodes 224 and 236 may serve as the first and second source select lines SSL1 and SSL2, respectively. Thus, the first and second gate structures 420 and 430 of the first switching element 400 may serve as the gates of the first and second source select transistors SST1 and SST2, respectively.

In the first and second gate structures 520 and 530 of the second switching element 500, the first and second gate electrodes 224 and 236 may serve as the second and first drain select lines DSL2 and DSL1, respectively. Thus, the first and second gate structures 520 and 530 of the second switching element 500 may serve as the gates of the second and first drain select transistors DST2 and DST1, respectively.

The turn-on operations and turn-off operations of the first and second switching elements 400 and 500 may be performed in substantially the same manner as those illustrated in FIG. 4. Furthermore, a publicly known method may be used to perform a program operation, an erase operation and a read operation for the source layer SL, the bit line BL and the memory cells MC1 to MCn. In the present embodiment, the case in which each of the first and second switching elements 400 and 500 includes a negative capacitor has been taken as an example. However, the present embodiment is not limited thereto. In a modification, only one of the first and second switching elements 400 and 500 may include a negative capacitor.

As described above, the semiconductor memory device in accordance with the present embodiment may include the first and second switching elements 400 and 500 each having the negative capacitor, thereby improving the operation speed and the operation reliability of the semiconductor memory device.

FIGS. 15A to 15I are cross-sectional views illustrating a method for fabricating a semiconductor memory device in accordance with an embodiment. For reference, FIGS. 15A to 15I are cross-sectional views for describing an example of the method for fabricating the semiconductor memory device illustrated in FIGS. 12 to 14. For reasons in process, the cross-sectional shapes of FIGS. 15A to 15I may be partially different from that of FIG. 13.

As illustrated in FIG. 15A, a pre-source layer 54A is formed on a substrate 50 having a predetermined structure, for example, a peripheral circuit formed therein. The pre-source layer 54A may be formed in such a shape that a first victim layer 52 is inserted between semiconductor layers doped with impurities. For example, the pre-source layer 54A may be formed as a stacked layer in which a first silicon layer 51 doped with an n-type impurity, the first victim layer 52, and a second silicon layer 53 doped with an n-type impurity are sequentially stacked.

Although not illustrated, an isolation dielectric layer may be formed between the pre-source layer 54A and the substrate 50, before the pre-source layer 54A is formed. The isolation dielectric layer may serve to electrically isolate the pre-source layer 54A and the substrate 50 from each other, and prevent damage to the substrate 50 between processes.

Then, a first stacked body 57 in which one or more first material layers 55 and one or more second material layers 56 are alternately stacked is formed, and a first opening 58 is then formed through the first stacked body 57 and the first victim layer 52 of the pre-source layer 54A. The first stacked body 57 and the first opening 58 are used to form a source select transistor. At the lowermost and uppermost layers of the first stacked body 57, the first material layer 55 may be positioned. Through a subsequent process, the first material layer 55 may serve as an interlayer dielectric layer to isolate stacked gate conductive layers from each other, and the second material layer 56 may serve as a victim layer for forming a gate conductive layer. For this structure, the first material layer 55 may be formed of a material having an etch selectivity with the second material layer 56. For example, the first material layer 55 may include oxide, and the second material layer 56 may include nitride.

Figure 15B:
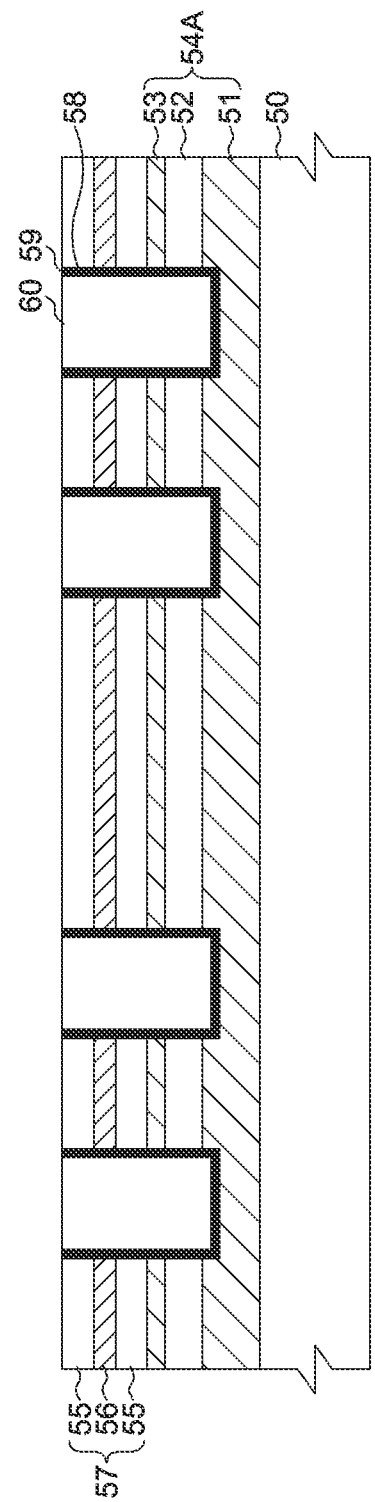

As illustrated in FIG. 15B, a first ferroelectric material layer 59 is formed along the surface of the first opening 58. The surface of the first opening 58 may indicate the side and bottom surfaces of the first opening 58. The first ferroelectric material layer 59 is a dielectric material of the negative capacitor, and may serve as the second gate dielectric layer of a first select transistor. The first ferroelectric material layer 59 may be formed at a temperature of 300° C. or less through ALD. After the thin film deposition is completed, an anneal process may be performed at a temperature of 400° C. to 900° C.

Then, a second victim layer 60 is formed on the first ferroelectric material layer 59 so as to gap-fill the first opening 58. The second victim layer 60 may serve to protect the first ferroelectric material layer 59 between subsequent processes.

As illustrated in FIG. 15C, a second stacked body 61 in which a plurality of first material layers 55 and a plurality of second material layers 56 are alternately stacked is formed. At the lowermost layer of the second stacked body 61, the second material layer 56 may be positioned, and at the uppermost layer of the second stacked body 61, the first material layer 55 may be positioned. The first material layer 55 positioned at the uppermost layer may have a relatively large thickness than the first material layer 55 positioned below it. This is in order to secure a space for forming a capping layer during a subsequent process.

Then, the second stacked body 61 is selectively etched to form a second opening 62 which exposes the second victim layer 60, and a memory layer 63 is formed on the sidewall of the second opening 62. The memory layer 63 may be formed as a charge trapping layer or a stacked layer in which a charge trapping layer and a blocking layer are stacked. The charge trapping layer may include nitride, and the blocking layer may include oxide.

As illustrated in FIG. 15D, the second victim layer 60 exposed through the second opening 62 is removed to form a channel hole through which the first and second openings 58 and 62 are connected to each other, and a tunnel dielectric layer 64 and a channel layer 65 are sequentially formed on the surface of the channel hole. The tunnel dielectric layer 64 may include oxide, and the channel layer 65 may include a semiconductor layer. The tunnel dielectric layer 64 formed on the first stacked body 57 may serve as a gate dielectric layer of the source select transistor.

Then, a core pillar 66 is formed on the channel layer 65 so as to gap-fill the channel hole. The core pillar 66 may include oxide.

Then, the second stacked body 61, the memory layer 63, the tunnel dielectric layer 64, the channel layer 65 and the core pillar 66 are partially and selectively etched to form a third opening 67. The third opening 67 may be used to form a second select transistor, and formed through at least the second material layer 56 positioned at the uppermost layer among the second material layers 56 of the second stacked body 61.

Figure 15E:
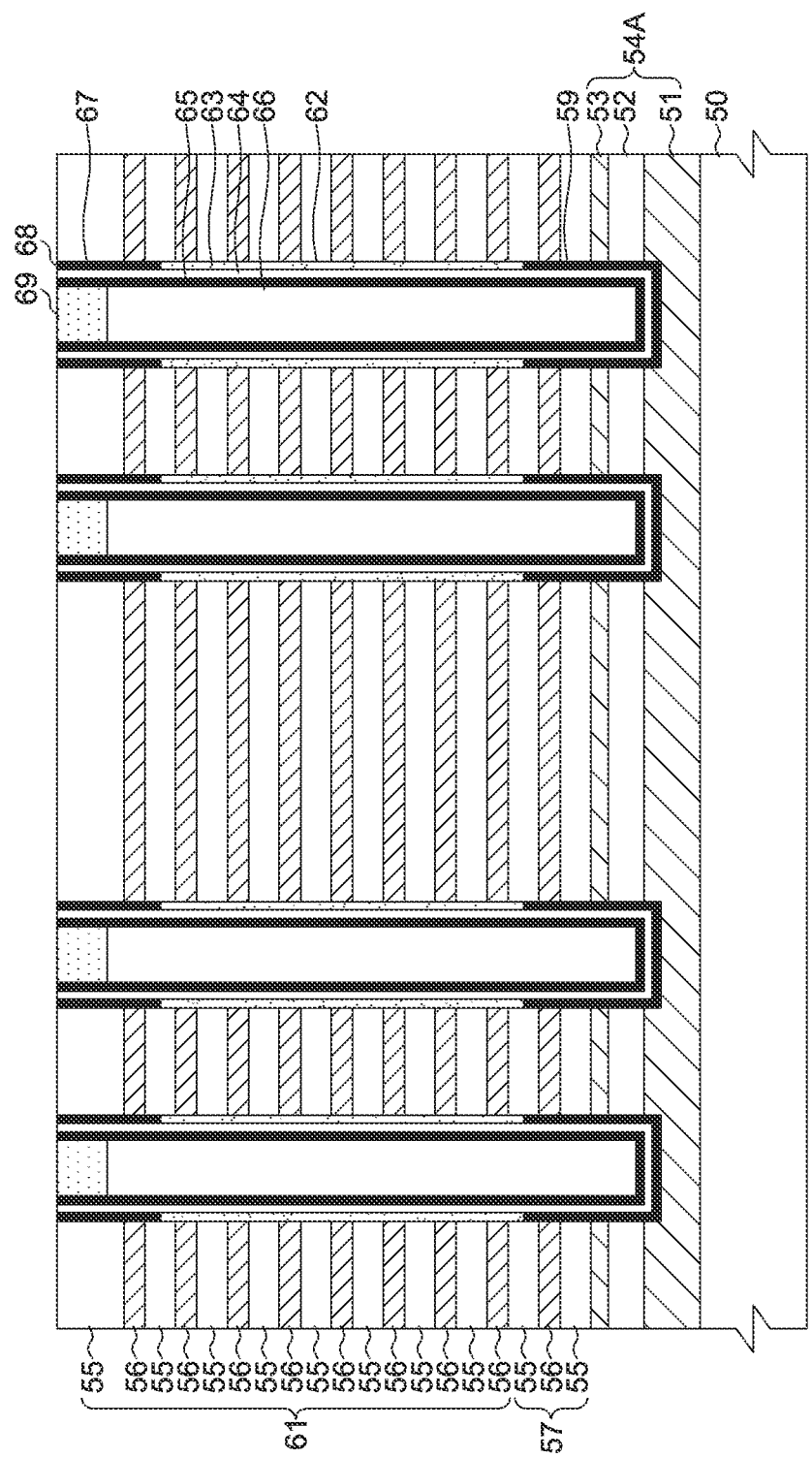

As illustrated in FIG. 15E, a second ferroelectric material layer 68 is formed on the sidewall of the third opening 67. The second ferroelectric material layer 68 may include a ferroelectric material having self-induced negative capacitance as a dielectric material of the negative capacitor.

Then, the tunnel dielectric layer 64, the channel layer 65 and the core pillar 66 are sequentially formed on the sidewall of the third opening 67 having the second ferroelectric material layer 68 formed thereon. The tunnel dielectric layer 64 may serve as a gate dielectric layer of a drain select transistor.

In the present embodiment, the case in which the tunnel dielectric layer 64, the channel layer 65 and the core pillar 66 are formed again after the third opening 67 and the second ferroelectric material layer 68 are formed has been taken as an example. However, the present embodiment is not limited thereto. In a modification, the third opening 67 may not be formed, and a victim layer may be used to form the tunnel dielectric layer 64, the channel layer 65 and the core pillar 66 at once across the first to third openings 58, 62 and 67. For example, after the second opening 62 is formed, a victim layer may be formed to partially fill the second opening 62, and the second ferroelectric material layer 68 may be formed on the top sidewall of the second opening 62. Then, the victim layer within the first and second openings 58 and 62 may be removed, and the tunnel dielectric layer 64, the channel layer 65 and the core pillar 66 may be sequentially formed.

Then, the core pillar 66 is recessed by a predetermined thickness, and a capping layer 69 is formed in the recessed space so as to abut on the channel layer 65. The capping layer 69 may be formed of a semiconductor layer doped with an impurity, for example, a silicon layer doped with an n-type impurity. The capping layer 69 may serve as a junction region of the second select transistor, for example, a drain.

Figure 15F:
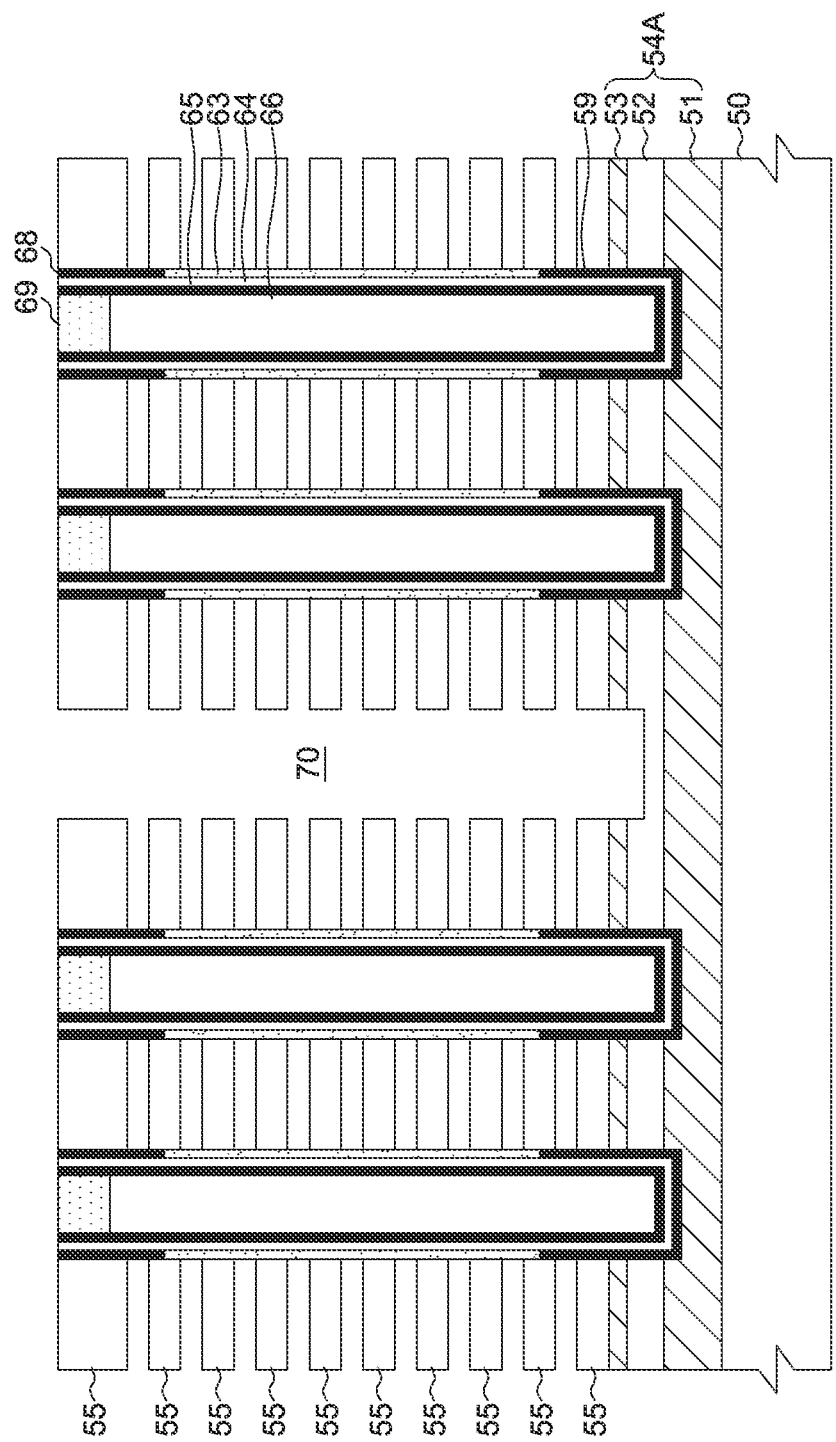

As illustrated in FIG. 15F, a fourth opening 70 is formed through the first and second stacked bodies 57 and 61 so as to expose the first victim layer 52 of the pre-source layer 54A. The fourth opening 70 may be used to form a common source line 74 or a support structure. The fourth opening 70 may have a slit shape when seen from the top.

Then, the second material layers 56 are removed from the first and second stacked bodies 57 and 61 through the fourth opening 70. Through an etch process of selectively removing the second material layers 56, it may be possible to secure a space in which a gate conductive layer is to be formed.

Figure 15G:
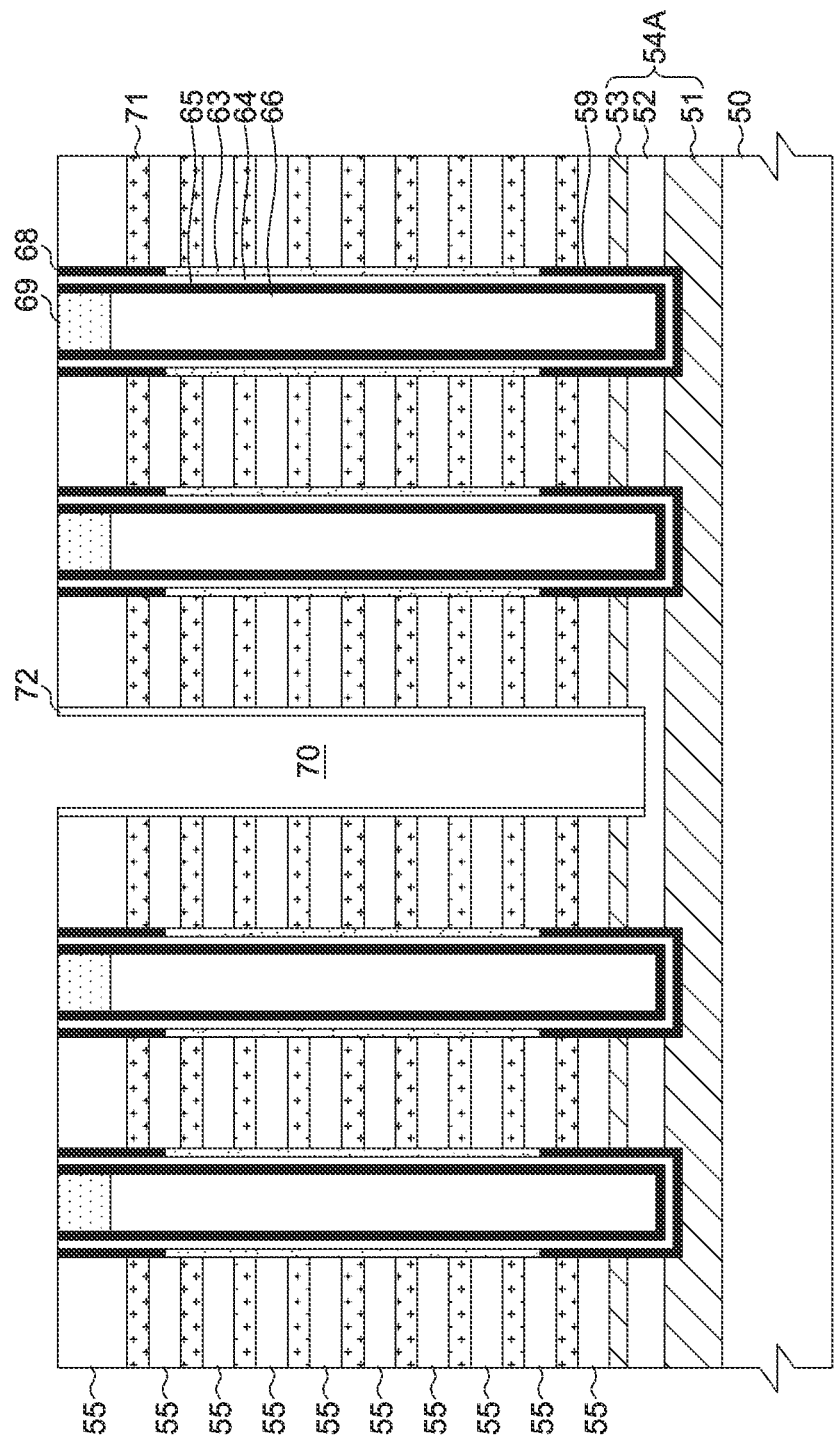

As illustrated in FIG. 15G, a plurality of gate conductive layers 71 are formed by gap-filling the space, from which the second material layers 56 are removed, with a conductive material. As the conductive material for forming the gate conductive layers, a metallic material may be used.

Then, an isolation process for isolating the plurality of stacked gate conductive layers 71 from each other, for example, an etch-back process is performed, and a spacer 72 is then formed on the sidewall of the fourth opening 70. The spacer 72 may be formed as a single layer formed of any one element selected from the group consisting of oxide, nitride and oxynitride or a stacked layer of two or more elements selected from the group.

Figure 15H:
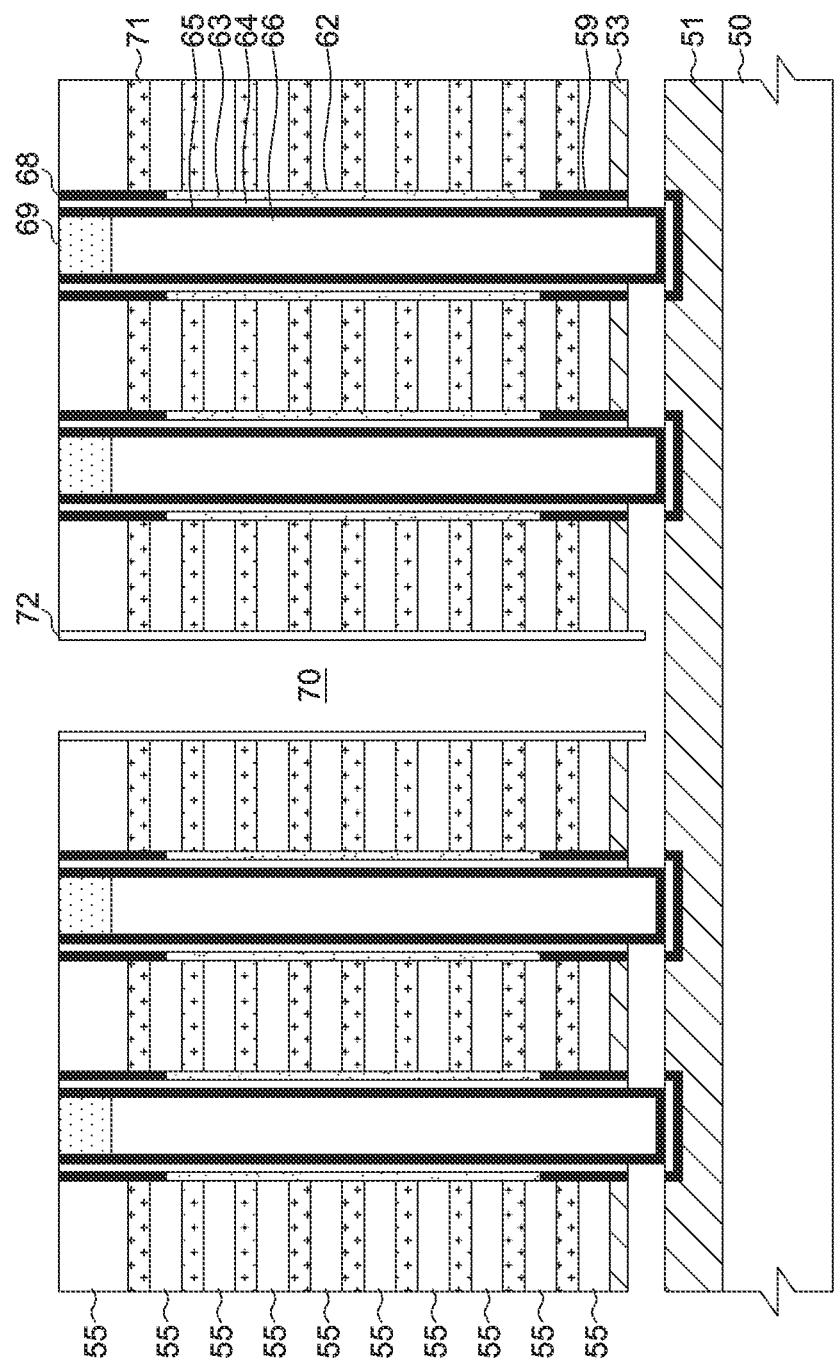

As illustrated in FIG. 15H, the first victim layer 52 of the pre-source layer 54A exposed through the fourth opening 70 is removed, and the tunnel dielectric layer 64 and the first ferroelectric material layer 59, which are exposed as the first victim layer 52 is removed, are sequentially removed to expose the channel layer 65.

Figure 15I:
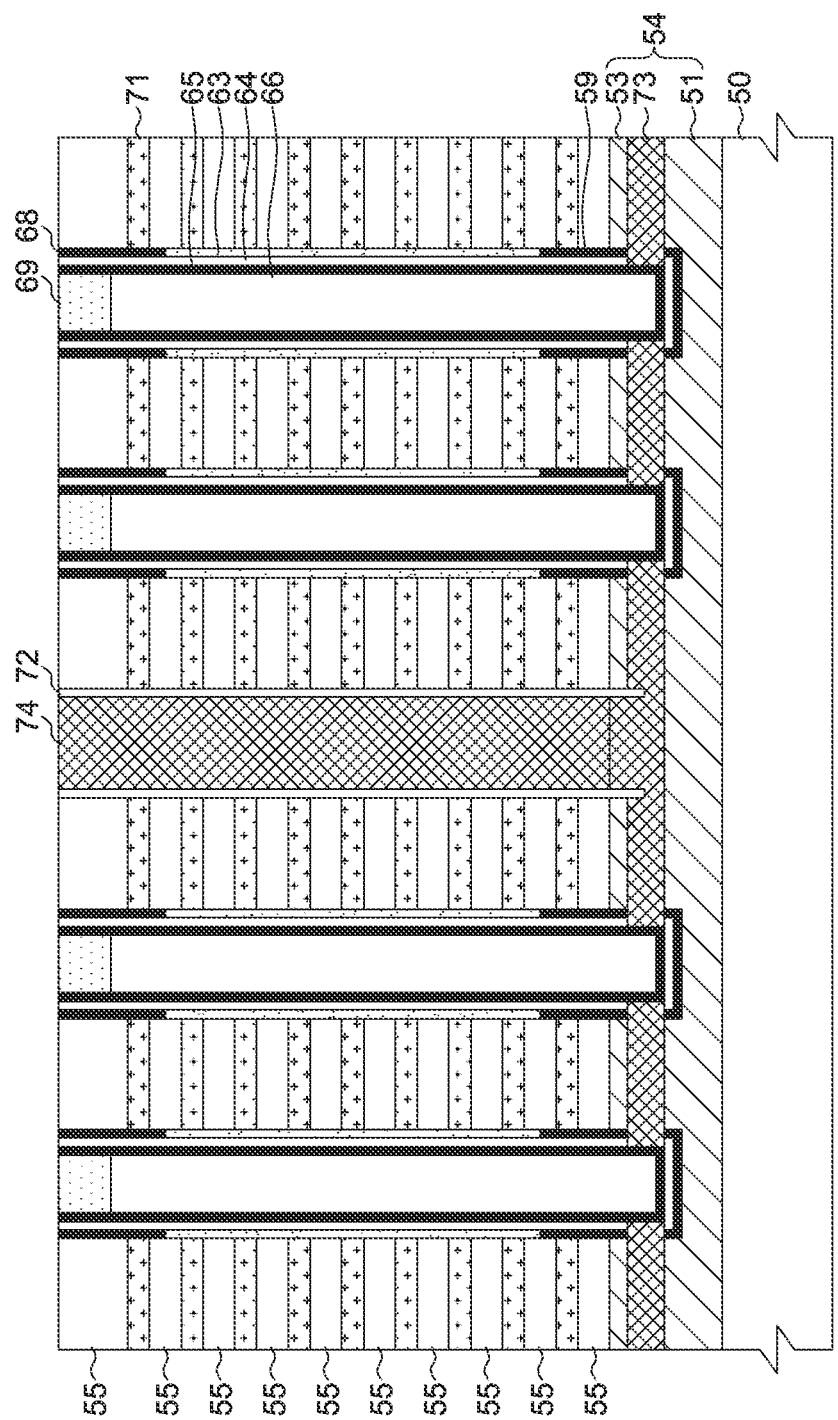

As illustrated in FIG. 15I, a conductive layer is formed to gap-fill the space from which the first victim layer 52 is removed. The conductive layer to gap-fill the space from which the first victim layer 52 is removed may be formed of a semiconductor layer, for example, a third silicon layer 73 doped with an n-type impurity. The third silicon layer 73 may abut on the channel layer 65, and the impurity doping concentration of the third silicon layer 73 may be higher than the impurity doping concentrations of the first and second silicon layers 51 and 53.

Thus, a source layer 54 may be formed, which includes the first to third silicon layers 51, 53 and 73 and abuts on the channel layer 65.

Then, the common source line 74 is formed, which gap-fills the fourth opening 70 and abuts on the source layer 54. The common source line 74 may be formed of a semiconductor layer or a stacked layer in which a semiconductor layer and a metallic layer are stacked. The semiconductor layer may be formed of a silicon layer doped with an n-type impurity, and formed together during the process for forming the third silicon layer 73 of the source line, doped with an n-type impurity.

In the present embodiment, the case in which the common source line 74 is formed in the fourth opening 70 has been taken as an example. However, the present embodiment is not limited thereto. In a modification, the fourth opening 70 may be gap-filled with a dielectric material to form a support structure which supports the first and second stacked bodies 57 and 61.

Figure 16:
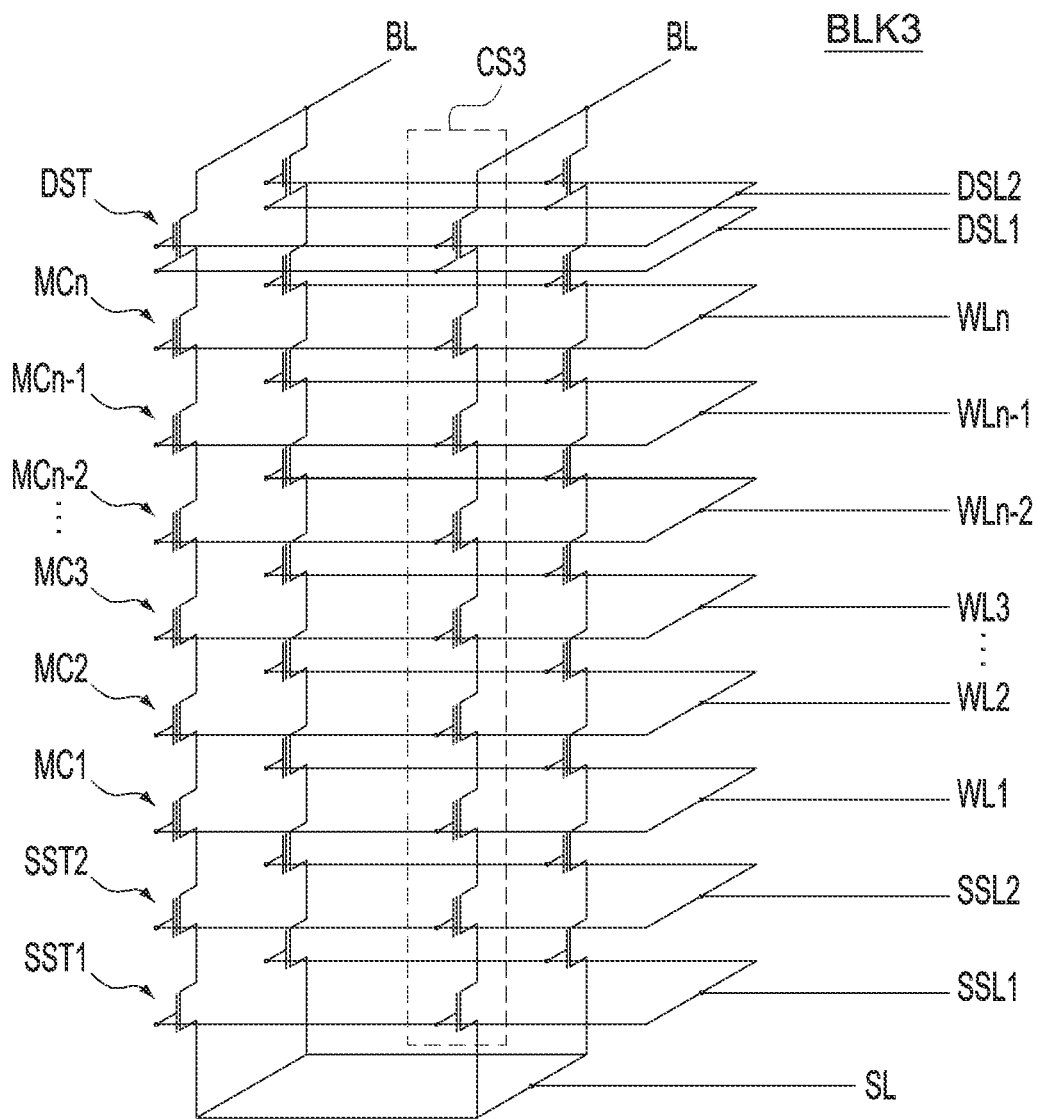
FIG. 16 is a circuit diagram illustrating a memory block of a semiconductor memory device in accordance with an embodiment.

FIG. 16 is a circuit diagram illustrating a memory block of a semiconductor memory device in accordance with an embodiment.

As illustrated in FIG. 16, a memory block BLK3 may include a source layer SL and a plurality of cell strings CS3 coupled to a plurality of word lines WL1 to WLn in common. The plurality of cell strings CS3 may be coupled to a plurality of bit lines BL.

Each of the cell strings CS3 may include source select transistors SST1 and SST2 coupled to the source layer SL, a drain select transistor DST coupled to the bit line BL, and a plurality of memory cells MC1 to MCn coupled in series between the source select transistors SST1 and SST2 and the drain select transistor DST. Each of the first source select transistor SST1 coupled to the source layer SL and the drain select transistor DST coupled to the bit line BL may have a negative capacitor.

The gates of the plurality of memory cells MC1 to MCn may be coupled to the respective word lines WL1 to WLn which are stacked so as to be spaced apart from each other. The plurality of word lines WL1 to WLn may be disposed between source select lines SSL1 and SSL2 and drain select lines DSL1 and DSL2.

The first source select line SSL1 may be coupled to a gate electrode of the first source select transistor SST1, and the second source select line SSL2 may be coupled to a first gate electrode of the second source select transistor SST2. The source and drain of the first source select transistor SST1 may be coupled to the source layer SL and the source of the second source select transistor SSTS2, respectively. The drain of the second source select transistor SST2 may be coupled to the memory cell MC1. The second source select line SSL2 may be positioned above the first source select line SSL1.

The first drain select line DSL1 may be coupled to a first gate electrode of the drain select transistor DST, and the second drain select line DSL2 may be coupled to a second gate electrode of the drain select transistor DST. The first gate electrode of the drain select transistor DST may serve to control negative capacitance. The second gate electrode of the drain select transistor DST may serve to control on/off of a channel.

Figure 17:
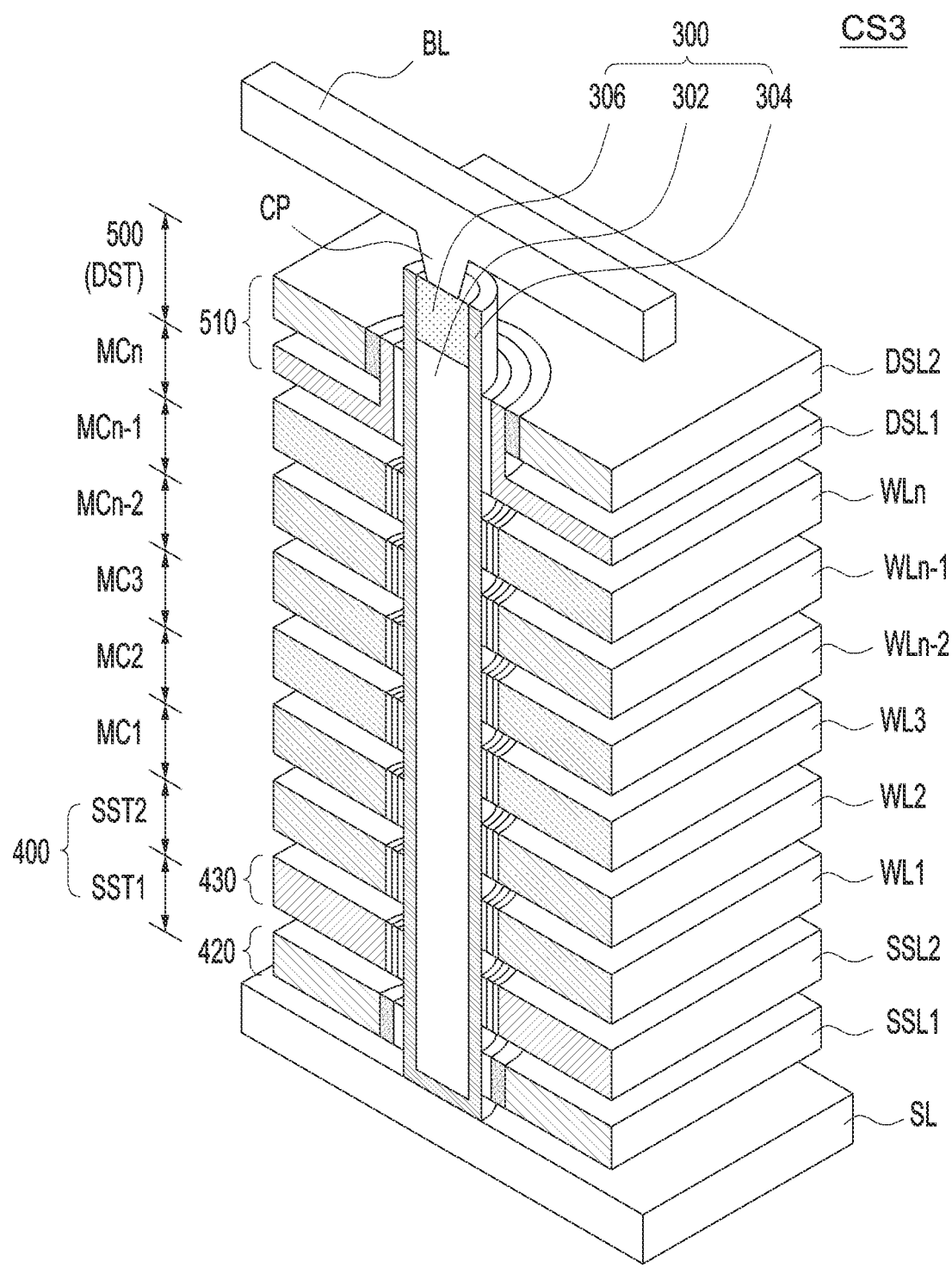
FIG. 17 is a perspective view illustrating a cell string of the semiconductor memory device in accordance with the present embodiment.

FIG. 17 is a perspective view illustrating a cell string of the semiconductor memory device in accordance with the present embodiment.

As illustrated in FIGS. 16 and 17, the cell string CS3 in accordance with the present embodiment may include a channel structure 300, a plurality of memory cells MC1 to MCn, a first switching element 400 and a second switching element 500, which are positioned between the source layer SL and the bit line BL.

The channel structure 300 may connect the source layer SL and the bit line BL which are stacked so as to be spaced apart from each other, and have a pillar shape extended in a vertical direction. The channel structure 300 may include a core pillar 302, a capping layer 306 and a channel layer 304. The channel structure 300 may have substantially the same configuration and shape as the channel structure 300 illustrated in FIG. 9. Therefore, additional detailed descriptions of the channel structure 300 will be omitted herein.

The plurality of memory cells MC1 to MCn may be stacked so as to be spaced apart from each other, while surrounding the channel structure 300. Among the plurality of memory cells MC1 to MCn, the memory cells MC1 and MCn positioned adjacent to the first and second switching elements 400 and 500, respectively, may be used as dummy cells. Each of the memory cells MC1 to MCn may include a memory structure MS surrounding the channel structure 300. The memory structure MS may have substantially the same configuration as the second gate stack GS2 illustrated in FIG. 3. Furthermore, the memory structure MS may have substantially the same configuration and shape as the memory structure MS illustrated in FIGS. 9 and 10. Therefore, additional detailed descriptions of the memory structure MS will be omitted herein.

The first switching element 400 may include a first source select transistor SST1 and a second source select transistor SST2. The first switching element 400 may include a first gate structure 420 including a negative capacitor and a second gate structure 430 neighboring on the first gate structure 420 with a gap provided therebetween. The first gate structure 420 may include a ferroelectric material having self-induced negative capacitance. The first switching element 400 may have substantially the same configuration as the switching element SE2 illustrated in FIG. 3. The first switching element 400 may have substantially the same configuration and shape as the first switching element 400 illustrated in FIGS. 13 and 14. Therefore, additional detailed descriptions of the first switching element 400 will be omitted herein.

The second switching element 500 may include a drain select transistor DST. The second switching element 500 may include a gate structure 510 including a negative capacitor. The gate structure 510 may include a ferroelectric material which selectively has negative capacitance. The second switching element 500 may have substantially the same configuration as the switching element SE1 illustrated in FIG. 1. The second switching element 500 may have substantially the same configuration and shape as the second switching element 500 illustrated in FIGS. 9 and 10. Therefore, additional detailed descriptions of the second switching element 500 will be omitted herein.

The turn-on operation and turn-off operation of the first switching element 400 may be performed in substantially the same manner as those illustrated in FIG. 4. The turn-on operation and turn-off operation of the second switching element 500 may be performed in substantially the same manner as those illustrated in FIG. 2. Furthermore, a publicly known method may be used to perform a program operation, an erase operation and a read operation for the source layer SL, the bit line BL and the memory cells MC1 to MCn.

As described above, the semiconductor memory device in accordance with the present embodiment may include the first and second switching elements 400 and 500 each having the negative capacitor, thereby improving the operation speed and the operation reliability of the semiconductor memory device.

The first switching element 400 may include a ferroelectric material having self-induced negative capacitance as a dielectric layer of the negative capacitor, and include the first and second gate structures 420 and 430 which can be independently controlled, which makes it possible to control the plurality of cell strings CS3 at high speed without increasing the number of stacked source select transistors SST1 and SST2.

Furthermore, the second switching element 500 may include a ferroelectric material, which selectively has negative capacitance, as a dielectric layer of the negative capacitor, and selectively control the capacitance polarity and the potential level of the capacity channel, using a bias applied to the gate structure 510, thereby improving the operation speed and the operation reliability of the semiconductor memory device. In particular, the second switching element 500 may improve the reliability of the erase operation.

Figure 18:
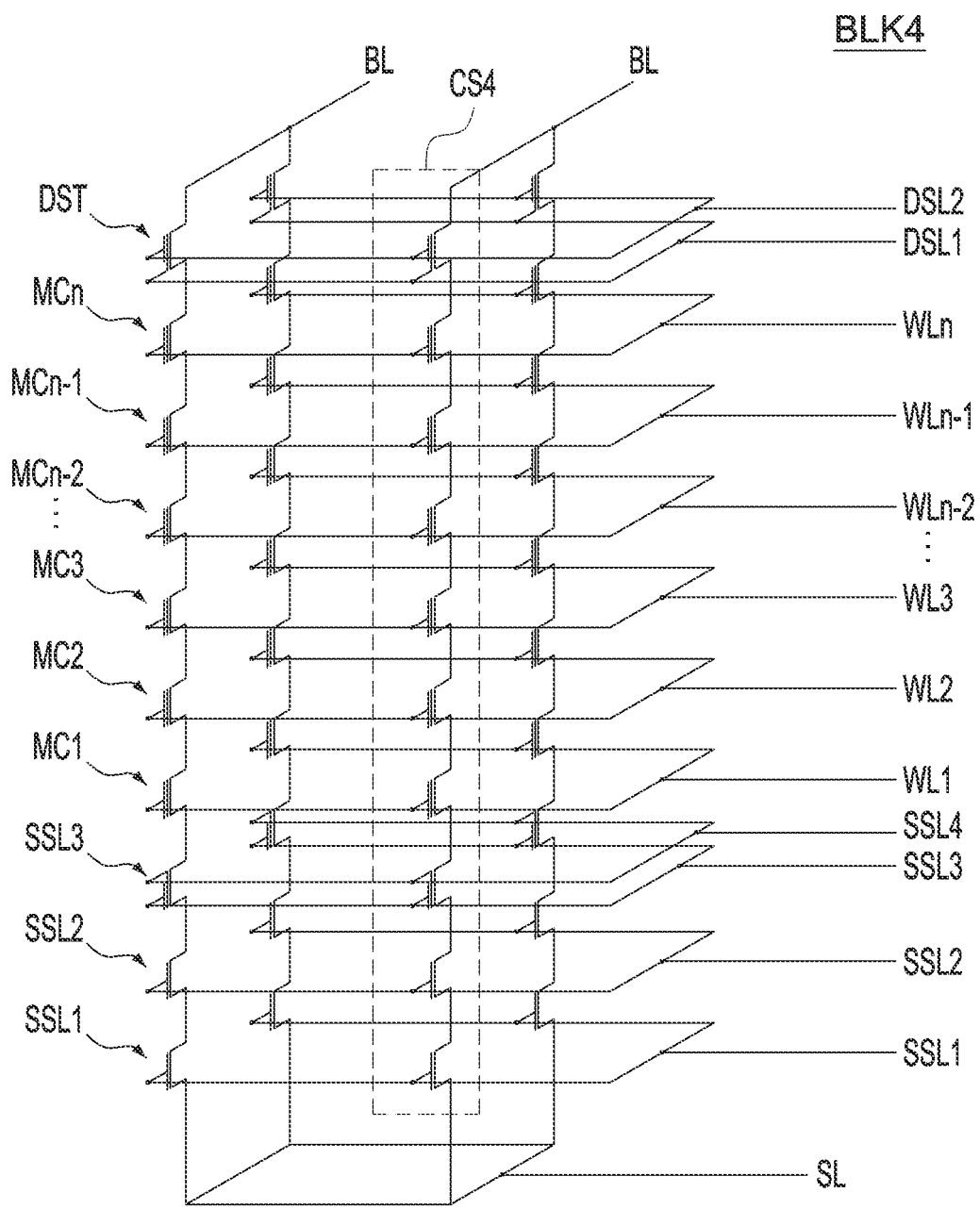
FIG. 18 is a circuit diagram illustrating a memory block of a semiconductor memory device in accordance with an embodiment.

FIG. 18 is a circuit diagram illustrating a memory block of a semiconductor memory device in accordance with an embodiment.

As illustrated in FIG. 18, a memory block BLK4 may include a source layer SL and a plurality of cell strings CS4 coupled to a plurality of word lines WL1 to WLn in common. The plurality of cell strings CS4 may be coupled to a plurality of bit lines BL.

Each of the cell strings CS4 may include source select transistors SST1 to SST3 coupled to the source layer SL, a drain select transistor DST coupled to the bit line BL, and a plurality of memory cells MC1 to MCn coupled in series between the source select transistors SST1 to SST3 and the drain select transistor DST. Each of the source select transistors SST1 to SST3 and the drain select transistor DST may include a negative capacitor.

The gates of the plurality of memory cells MC1 to MCn may be coupled to the respective word lines WL1 to WLn which are stacked so as to be spaced apart from each other. The plurality of word lines WL1 to WLn may be disposed between source select lines SSL1 to SSL4 and drain select lines DSL1 and DSL2.

The first source select line SSL1 may be coupled to a gate electrode of the first source select transistor SST1, and the second source select line SSL2 may be coupled to a gate electrode of the second source select transistor SST2. The third source select line SSL3 and the fourth source select line SSL4 may be coupled to first and second gate electrodes of the third source select transistor SST3, respectively. The first to third source select transistors SST1 to SST3 may be coupled in series, one side of the first source select transistor SST1 may be coupled to the source layer SL, and the other side of the third source select transistor SST3 may be coupled to the memory cell MC1.

The first drain select line DSL1 may be coupled to a first gate electrode of the drain select transistor DST, and the second drain select line DSL2 may be coupled to a second gate electrode of the drain select transistor DST.

Figure 19:
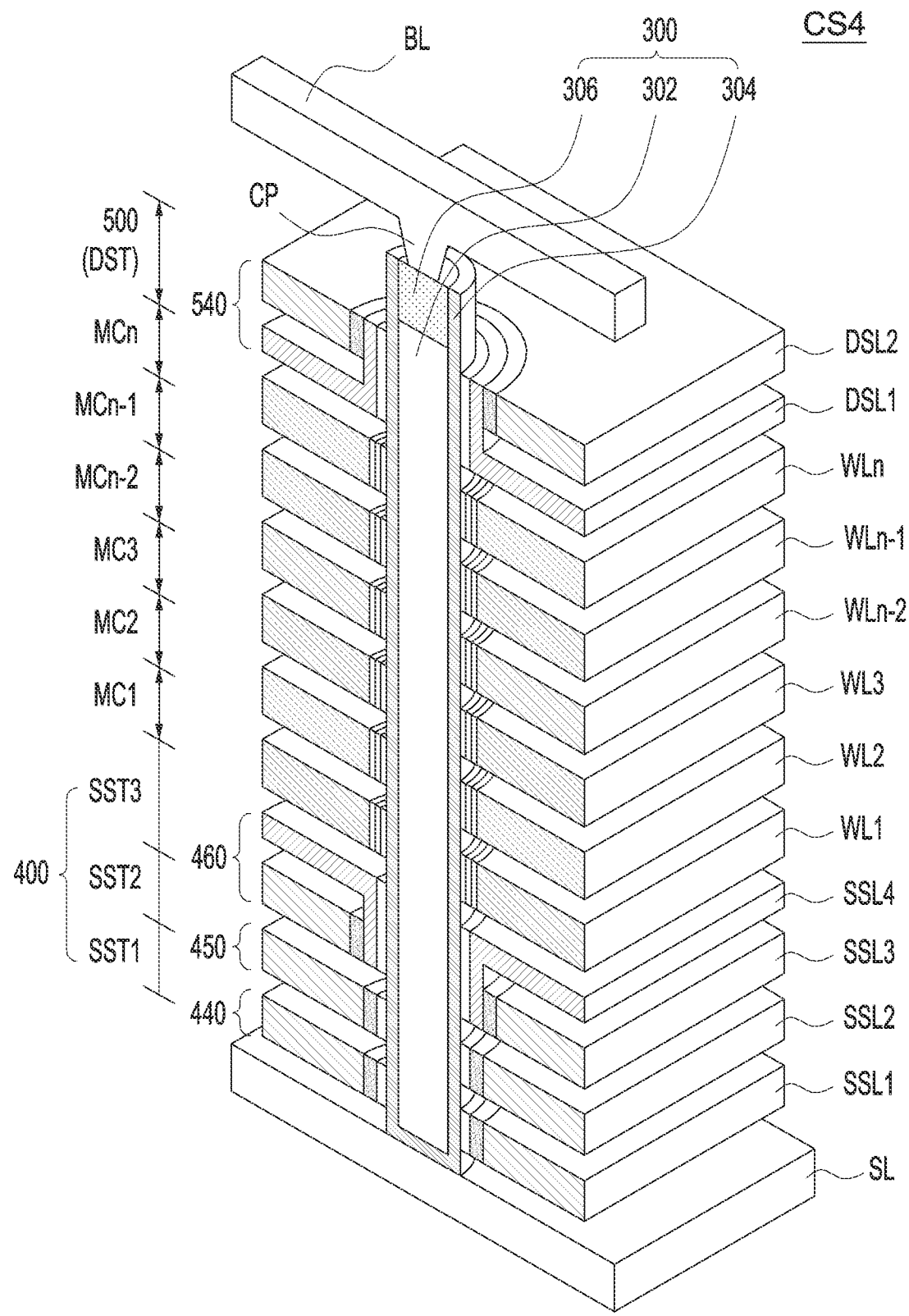
FIG. 19 is a perspective view illustrating a cell string of the semiconductor memory device in accordance with the present embodiment.

FIG. 19 is a perspective view illustrating a cell string of the semiconductor memory device in accordance with the present embodiment.

As illustrated in FIGS. 18 and 19, the cell string CS4 in accordance with the present embodiment may include a channel structure 300, a plurality of memory cells MC1 to MCn, a first switching element 400 and a second switching element 500, which are positioned between the source layer SL and the bit line BL.

The channel structure 300 may connect the source layer SL and the bit line BL which are stacked so as to be spaced apart from each other, and have a pillar shape extended in a vertical direction. The channel structure 300 may include a core pillar 302, a capping layer 306 and a channel layer 304. The channel structure 300 may have substantially the same configuration and shape as the channel structure 300 illustrated in FIG. 9. Therefore, additional detailed descriptions of the channel structure 300 will be omitted herein.

The plurality of memory cells MC1 to MCn may be stacked so as to be spaced apart from each other, while surrounding the channel structure 300. Among the plurality of memory cells MC1 to MCn, the memory cells MC1 and MCn positioned adjacent to the first and second switching elements 400 and 500, respectively, may be used as dummy cells. Each of the memory cells MC1 to MCn may include a memory structure MS surrounding the channel structure 300. The memory structure MS may have substantially the same configuration as the second gate stack GS2 illustrated in FIG. 3. Furthermore, the memory structure MS may have substantially the same configuration as the memory structure MS illustrated in FIGS. 9 and 10. Therefore, additional detailed descriptions of the memory structure MS will be omitted herein.

The second switching element 500 may include a drain select transistor DST. The second switching element 500 may include a gate structure 540 including a negative capacitor. The gate structure 540 may include a ferroelectric material which selectively has negative capacitance. The second switching element 500 may have substantially the same configuration as the switching element SE1 illustrated in FIG. 1. The second switching element 500 may have substantially the same configuration and shape as the second switching element 500 illustrated in FIGS. 9 and 10. Therefore, additional detailed descriptions of the second switching element 500 will be omitted herein.

The first switching element 400 may include first to third source select transistors SST1 to SST3. The first switching element 400 may include first to third gate structures 440, 450 and 460 which are stacked so as to be spaced apart from each other, and each have a negative capacitor. Each of the first and second gate structures 440 and 450 may have substantially the same configuration as the first gate stack GS1 illustrated in FIG. 3. Therefore, each of the first and second gate structures 440 and 450 may include a ferroelectric material having self-induced negative capacitance. Each of the first and second gate structures 440 and 450 may have substantially the same configuration and shape as the second gate structure 430 of the first switching element 400 illustrated in FIG. 13. Therefore, additional detailed descriptions of the first and second gate structures 440 and 450 of the first switching element 400 will be omitted herein.

In the first switching element 400, the third gate structure 460 may have substantially the same configuration as the gate stack GS illustrated in FIG. 1. Thus, the third gate structure 460 may include a ferroelectric material which selectively has negative capacitance. Furthermore, the third gate structure 460 may have substantially the same configuration and shape as the gate structure 410 of the first switching element 400 illustrated in FIG. 9. Therefore, additional detailed descriptions of the third gate structure 460 of the first switching element 400 will be omitted herein.

The reason why the first switching element 400 is configured to include the first to third source select transistors SST1 to SST3 which are stacked so as to be spaced apart from each other, while the second switching element 500 is configured to include one drain select transistor DST, results from the shape of the channel structure 300. For example, due to reasons in process, the channel structure 300 has a structure in which the lower end at which the first switching element 400 is positioned inevitably has a smaller diameter than the upper end at which the second switching element 500 is positioned. Therefore, when the first switching element 400 is configured to include more transistors than the second switching element 500, the configuration may reduce an influence on the memory cell MC1 adjacent to the first switching element 400. Furthermore, since the threshold voltages of the transistors positioned at the lower end having a relatively small diameter in the channel structure 300 react more sensitively to a bias applied to the gate electrodes, the operation characteristic may be improved. That is, when the first switching element 400 is configured to include more transistors than the second switching element 500, it may be possible to improve the operation reliability of the semiconductor memory device.

The turn-on operations and turn-off operations of the first and second gate structures 440 and 450 in the first switching element 400 may be performed in substantially the same manner as those illustrated in FIG. 4. The turn-on operation and turn-off operation of the third gate structure 460 in the first switching element 400 and the turn-on operation and turn-off operation of the second switching element 500 may be performed in substantially the same manner as those illustrated in FIG. 2. Furthermore, a publicly known method may be used to perform a program operation, an erase operation and a read operation for the source layer SL, the bit line BL and the memory cells MC1 to MCn.

As described above, the semiconductor memory device in accordance with the present embodiment may include the first and second switching elements 400 and 500 each having the negative capacitor, thereby improving the operation speed and the operation reliability of the semiconductor memory device.

The first switching element 400 may include a ferroelectric material having self-induced negative capacitance as a dielectric layer of the negative capacitor, and include the first and second gate structures 440 and 450 which can be independently controlled, which makes it possible to control the plurality of cell strings CS4 at high speed without increasing the number of stacked source select transistors SST1 to SST3.

Furthermore, the first switching element 400 may include the third gate structure 460 including a ferroelectric material, which selectively has negative capacitance, as a dielectric layer of the negative capacitor, and thus selectively control the capacitance polarity and the potential level of the capacity channel, using a bias applied to the third gate structure 460, thereby improving the operation speed and the operation reliability of the semiconductor memory device.

Figure 20:
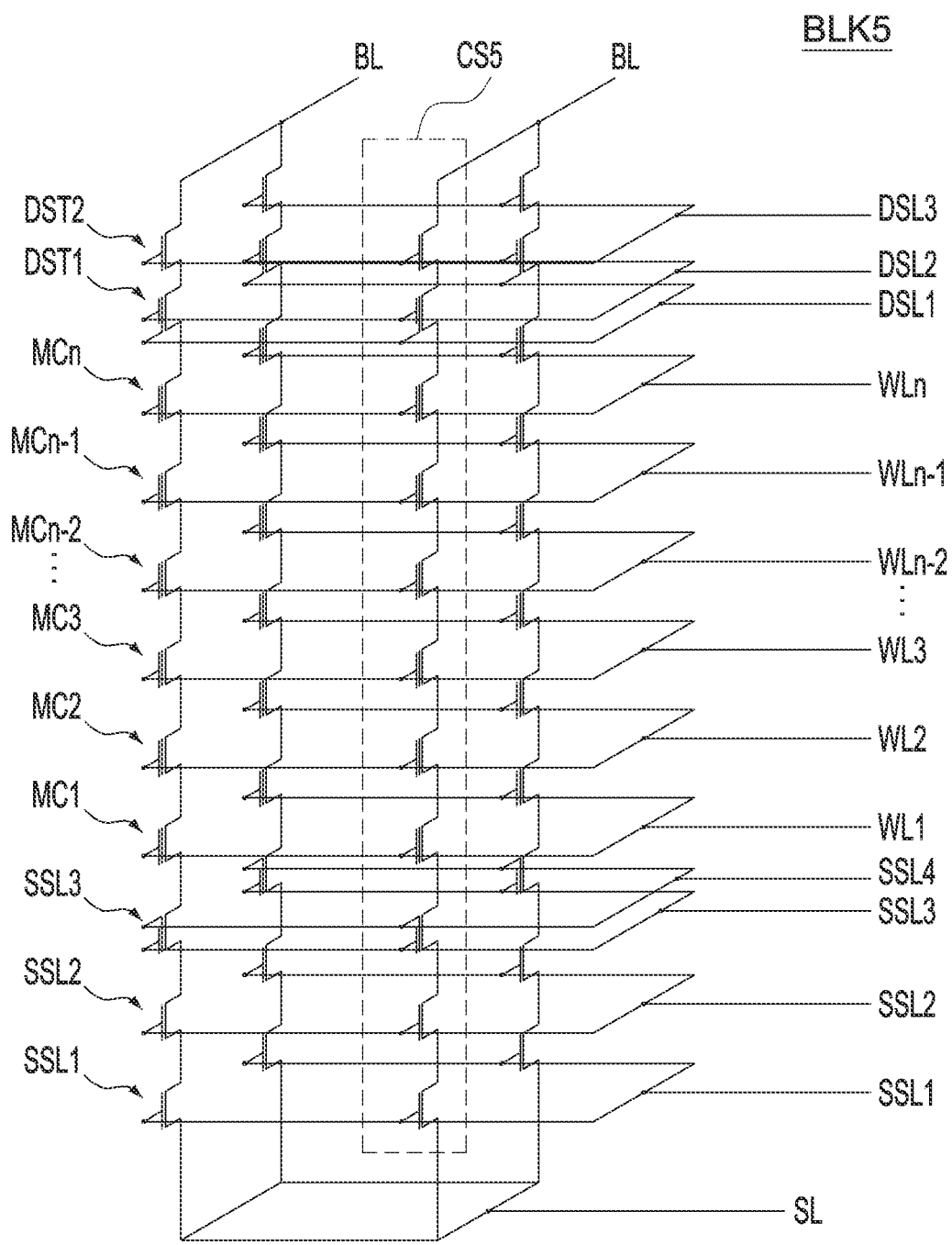
FIG. 20 is a circuit diagram illustrating a memory block of a semiconductor memory device in accordance with an embodiment.

FIG. 20 is a circuit diagram illustrating a memory block of a semiconductor memory device in accordance with an embodiment.

As illustrated in FIG. 20, a memory block BLK5 may include a source layer SL and a plurality of cell strings CS5 coupled to a plurality of word lines WL1 to WLn in common. The plurality of cell strings CS5 may be coupled to a plurality of bit lines BL.

Each of the cell strings CS5 may include source select transistors SST1 to SST3 coupled to the source layer SL, drain select transistors DST1 and DST2 coupled to the bit line BL, and a plurality of memory cells MC1 to MCn coupled in series between the source select transistors SST1 to SST3 and the drain select transistors DST1 and DST2. Each of the source select transistors SST1 to SST3 and the drain select transistors DST1 and DST2 may include a negative capacitor.

The gates of the plurality of memory cells MC1 to MCn may be coupled to the respective word lines WL1 to WLn which are stacked so as to be spaced apart from each other. The plurality of word lines WL1 to WLn may be disposed between source select lines SSL1 to SSL4 and drain select lines DSL1 to DSL3.

The first source select line SSL1 may be coupled to a gate electrode of the first source select transistor SST1, and the second source select line SSL2 may be coupled to a gate electrode of the second source select transistor SST2. The third source select line SSL3 and the fourth source select line SSL4 may be coupled to first and second gate electrodes of the third source select transistor SST3, respectively. The first to third source select transistors SST1 to SST3 may be coupled in series, one side of the first source select transistor SST1 may be coupled to the source layer SL, and the other side of the third source select transistor SST3 may be coupled to the memory cell MC1.

The first and second drain select lines DSL1 and DSL2 may be coupled to first and second gate electrodes of the first drain select transistor DST1, respectively. The third drain select line DSL3 may be coupled to a gate electrode of the second drain select transistor DST2. The first and second drain select transistors DST1 and DST2 may be coupled in series, one side of the first drain select transistor DST1 may be coupled to the memory cell MCn, and the other side of the second drain select transistor DST2 may be coupled to the bit line BL.

Figure 21:
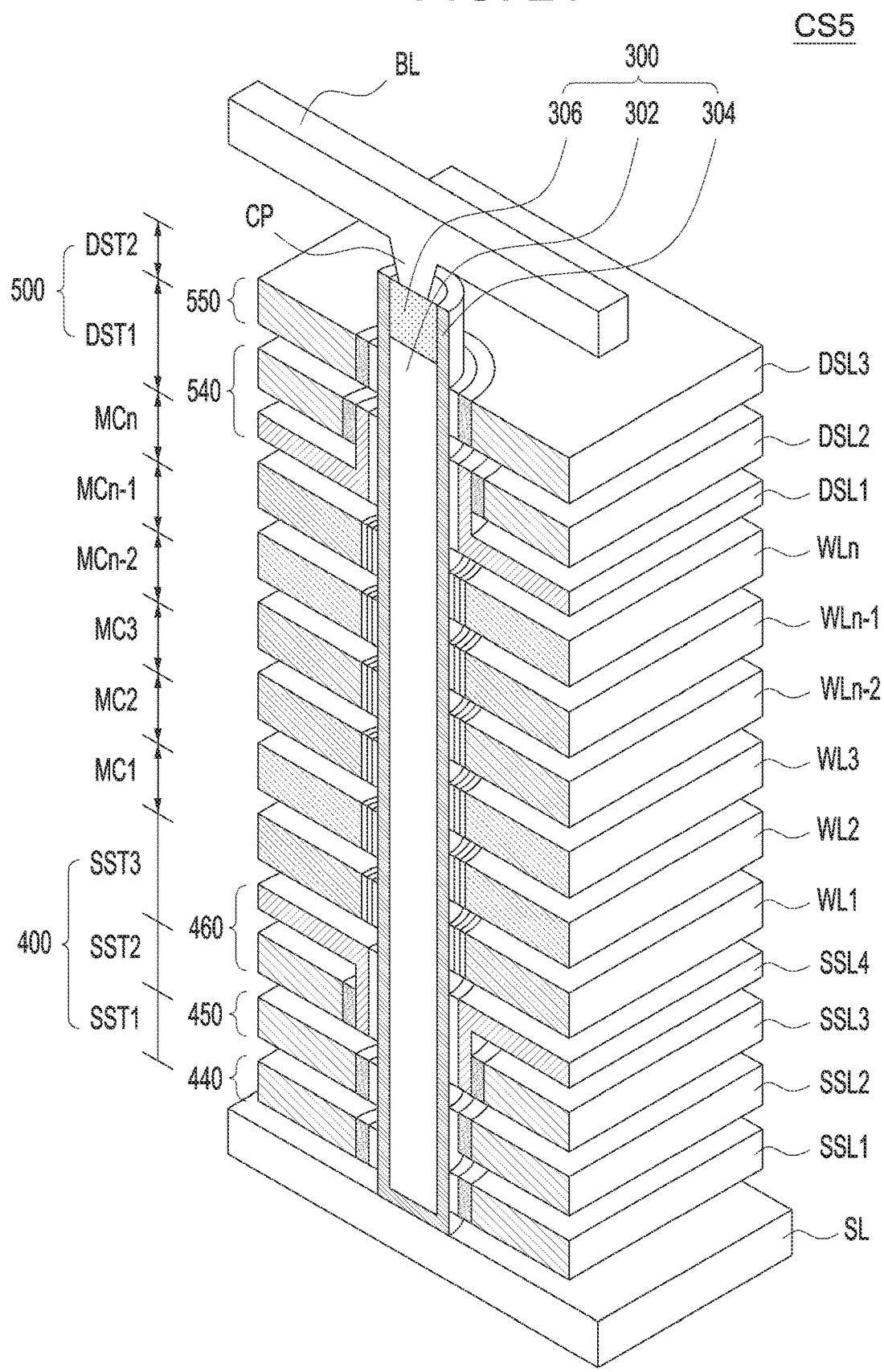
FIG. 21 is a perspective view illustrating a cell string of the semiconductor memory device in accordance with the present embodiment.

FIG. 21 is a perspective view illustrating a cell string of the semiconductor memory device in accordance with the present embodiment.

As illustrated in FIGS. 20 and 21, a cell string CS5 in accordance with an embodiment may include a channel structure 300, a plurality of memory cells MC1 to MCn, a first switching element 400 and a second switching element 500, which are positioned between the source layer SL and the bit line BL. The channel structure 300, the plurality of memory cells MC1 to MCn and the first switching element 400 may have substantially the same configurations and shapes as the channel structure 300, the plurality of memory cells MC1 to MCn and the first switching element 400, respectively, which are illustrated in FIG. 19. Therefore, additional detailed descriptions thereof will be omitted herein.

The second switching element 500 may include a first drain select transistor DST1 and a second drain select transistor DST2. The second switching element 500 may include first and second gate structures 540 and 550 each having a negative capacitor.

In the second switching element 500, the first gate structure 540 may have substantially the same configuration as the gate stack GS illustrated in FIG. 1. Thus, the first gate structure 540 may include a ferroelectric material which selectively has negative capacitance. Furthermore, the first gate structure 540 may have substantially the same configuration and shape as the gate structure 510 of the second switching element 500 illustrated in FIG. 9. Therefore, additional detailed descriptions of the first gate structure 540 of the second switching element 500 will be omitted herein.

In the second switching element 500, the second gate structure 550 may have substantially the same configuration as the first gate stack GS1 illustrated in FIG. 3. Thus, the second gate structure 550 may include a ferroelectric material which has self-induced negative capacitance. Furthermore, the second gate structure 550 may have substantially the same configuration and shape as the second gate structure 530 of the second switching element 500 illustrated in FIG. 13. Therefore, additional detailed descriptions of the second gate structure 550 of the second switching element 500 will be omitted herein.

The turn-on operations and turn-off operations of the first and second gate structures 440 and 450 in the first switching element 400 may be performed in substantially the same manner as those illustrated in FIG. 4. The turn-on operation and turn-off operation of the second gate structure 550 in the second switching element 500 may be performed in substantially the same manner as those illustrated in FIG. 4. The turn-on operation and turn-off operation of the third gate structure 460 in the first switching element 400 and the turn-on operation and turn-off operation of the first gate structure 540 in the second switching element 500 may be performed in substantially the same manner as those illustrated in FIG. 2. Furthermore, a publicly known method may be used to perform a program operation, an erase operation and a read operation for the source layer SL, the bit line BL and the memory cells MC1 to MCn.

As described above, the semiconductor memory device in accordance with the present embodiment may include the first and second switching elements 400 and 500 each having the negative capacitor, thereby improving the operation speed and the operation reliability of the semiconductor memory device.

Furthermore, the second switching element 500 may include the first gate structure 540 including a ferroelectric material, which selectively has negative capacitance, as a dielectric layer of the negative capacitor, and thus selectively control the capacitance polarity and the potential level of the capacity channel, using a bias applied to the first gate structure 540, thereby improving the operation speed and the operation reliability of the semiconductor memory device.

Furthermore, the second switching element 500 may include the second gate structure 550 including a ferroelectric material which has self-induced negative capacitance, as a dielectric layer of the negative capacitor, thereby improving the operation speed and the operation reliability of the semiconductor memory device. In particular, the second switching element 500 may improve the reliability of the erase operation.

Figure 22:
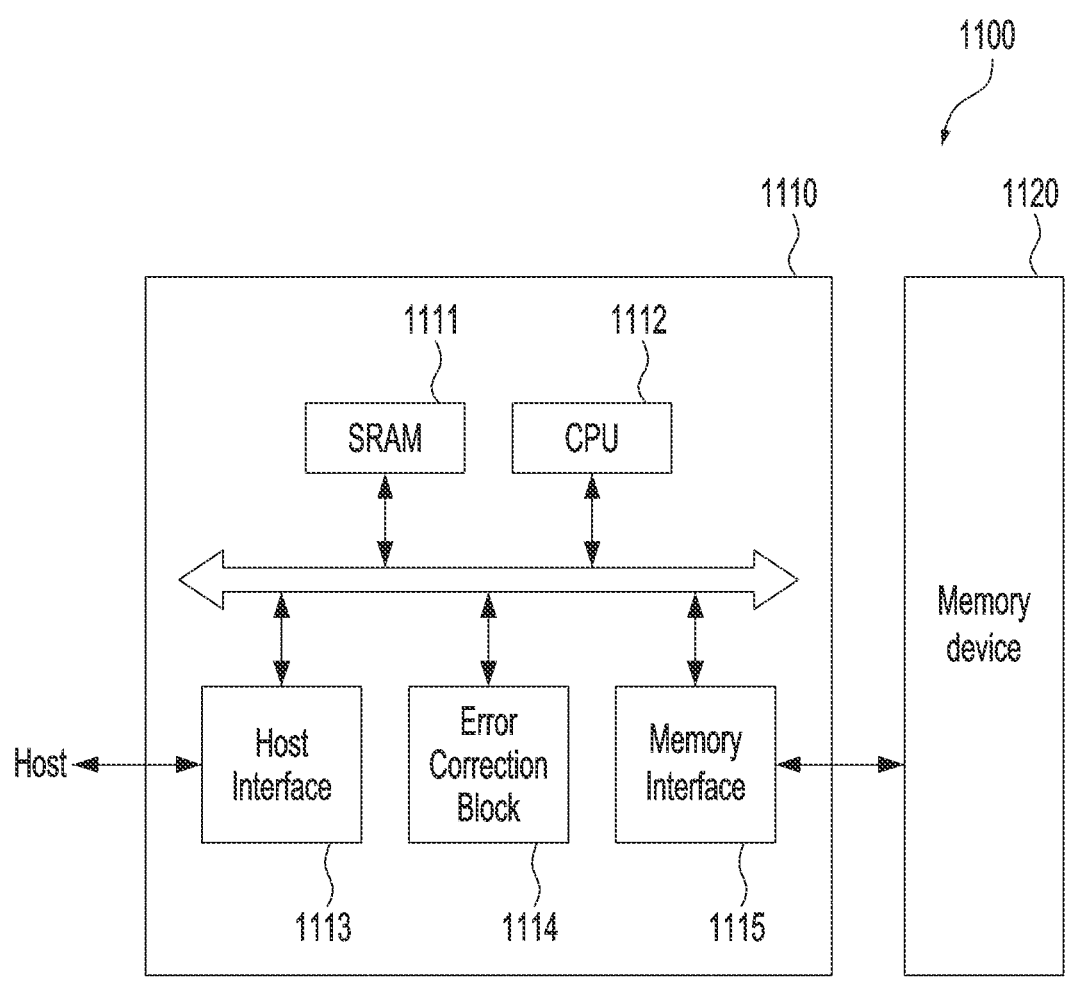
FIG. 22 is a block diagram illustrating a configuration of a memory system in accordance with an embodiment.

FIG. 22 is a block diagram illustrating a configuration of a memory system in accordance with an embodiment.

As illustrated in FIG. 22, a memory system 1100 includes a memory device 1120 and a memory controller 1110.

The memory device 1120 may include a plurality of memory cells sharing a channel structure and a first switching element which is coupled to one sides of the memory cells while sharing the channel structure, and includes a negative capacitor. The first switching element may include a first gate dielectric layer surrounding the channel structure, a first gate electrode surrounding the first gate dielectric layer, a second gate dielectric layer surrounding a part of the first gate electrode and including a ferroelectric material having negative capacitance in response to a bias applied to the first gate electrode, and a second gate electrode surrounding the second gate dielectric layer and having a planar shape.

The memory device 1120 may include a plurality of memory cells sharing the channel structure and a first switching element which is coupled to one sides of the memory cells while sharing the channel structure, and includes a negative capacitor. The first switching element may include first and second gate structures which are stacked so as to be spaced apart from each other. The first gate structure may include a first gate dielectric layer surrounding the channel structure, a second gate dielectric layer surrounding the first gate dielectric layer and including a ferroelectric material having self-induced negative capacitance, and a first gate electrode surrounding the second gate dielectric layer and having a planar shape. The second gate structure may include a memory layer and a second gate electrode. The memory layer may surround the channel structure and include a charge trapping layer, and the second gate electrode may surround the memory layer and have a planar shape.

The memory device 1120 may include a switching element including a negative capacitor, thereby improving the operation speed and operation reliability of the memory device 1120.

The memory device 1120 may be a multi-chip package including a plurality of flash memory chips.

The memory controller 1110 may be configured to control the memory device 1120, and include an SRAM (Static Random Access Memory) 1111, a CPU (Central Processing Unit) 1112, a host interface 1113, an error correction block 1114 and a memory interface 1115. The SRAM 1111 is used as a working memory of the CPU 1112, the CPU 1112 performs overall control operations for data exchange of the memory controller 1110, and the host interface 1113 includes a data exchange protocol of a host connected to the memory system 1100. The error correction block 1114 detects and corrects an error included in data read from the memory device 1120, and the memory interface 1115 performs interfacing with the memory device 1120. In addition, the memory controller 1110 may further include a ROM (Read Only Memory) to store data for interfacing with a host.

Figure 23:
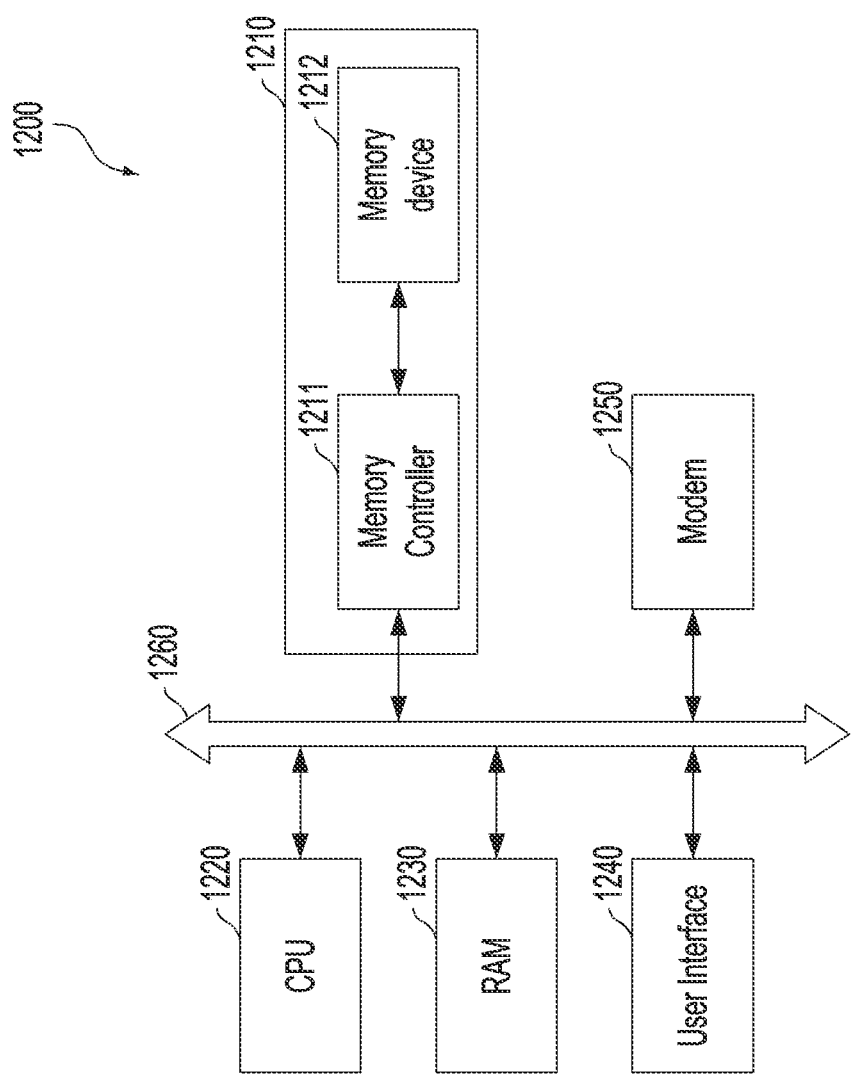
FIG. 23 is a block diagram illustrating a configuration of a computing system in accordance with an embodiment.

FIG. 23 is a block diagram illustrating a configuration of a computing system in accordance with an embodiment.

As illustrated in FIG. 23, a computing system 1200 may include a CPU 1220, a RAM 1230, a user interface 1240, a modem 1250 and a memory system 1210, which are electrically coupled to a system bus 1260. The computing system 1200 may be a mobile device.

The memory system 1210 may include a plurality of memory cells sharing a channel structure and a first switching element which is coupled to one sides of the memory cells while sharing the channel structure, and includes a negative capacitor. The first switching element may include a first gate dielectric layer surrounding the channel structure, a first gate electrode surrounding the first gate dielectric layer, a second gate dielectric layer surrounding a part of the first gate electrode and including a ferroelectric material having negative capacitance in response to a bias applied to the first gate electrode, and a second gate electrode surrounding the second gate dielectric layer and having a planar shape.

The memory system 1210 may include a plurality of memory cells sharing the channel structure and a first switching element which is coupled to one sides of the memory cells while sharing the channel structure and includes a negative capacitor. The first switching element may include first and second gate structures which are stacked so as to be spaced apart from each other. The first gate structure may include a first gate dielectric layer surrounding the channel structure, a second gate dielectric layer surrounding the first gate dielectric layer and including a ferroelectric material having self-induced negative capacitance, and a first gate electrode surrounding the second gate dielectric layer and having a planar shape. The second gate structure may include a memory layer and a second gate electrode. The memory layer may surround the channel structure and include a charge trapping layer, and the second gate electrode may surround the memory layer and have a planar shape.

The memory system 1210 may include a switching element including a negative capacitor, thereby improving the operation speed and operation reliability of the memory system 1210.

While various embodiments have been described above, it will be understood to those skilled in the art that the embodiments described are examples only. Accordingly, the operating method of a data storage device described herein should not be limited based on the described embodiments.

What is claimed is:

1. A switching element comprising:
a first gate stack formed over a substrate;
a second gate stack formed over the substrate and neighboring the first gate stack with a gap between the first gate stack and the second gate stack;
a first junction region formed in the substrate corresponding to a first side of the first gate stack;
a second junction region formed in the substrate corresponding to a second side of the second gate stack; and
a coupling region formed in the substrate corresponding to the gap and including impurities,
wherein the first gate stack comprises a first gate dielectric layer, a second gate dielectric layer, and a first gate electrode, which are sequentially stacked over the substrate, the second gate dielectric layer including a ferroelectric material having self-induced negative capacitance,
wherein the second gate stack comprises a memory layer and a second gate electrode, which are sequentially stacked over the substrate, the memory layer including a charge trapping layer, and
wherein a channel is formed between the first junction region and the second junction region through the coupling region, when a first turn-on voltage is applied to the first gate electrode and a second turn-on voltage is applied to the second gate electrode.

2. The switching element according to claim 1, wherein the second gate dielectric layer comprises a metal oxide with a fluorite structure, which has one or more stable composition regions selected among the group of a cubic system, a tetragonal system, and a monoclinic system.

3. The switching element according to claim 2, wherein the second gate dielectric layer has a thickness of 1 nm to 10 nm.

4. The switching element according to claim 1, wherein the second gate stack varies a threshold voltage value within a predetermined range by injecting charges into the charge trapping layer or removing the injected charges.

5. The switching element according to claim 1, wherein the memory layer comprises a tunnel dielectric layer located between the substrate and the charge trapping layer and a blocking layer located between the charge trapping layer and the second gate electrode,
wherein the tunnel dielectric layer and the blocking layer comprise oxide, and the charge trapping layer comprises nitride.

6. The switching element according to claim 1, wherein the first gate stack has a line width equal to or larger than the line width of the second gate stack.

7. The switching element according to claim 1, wherein at least one of the first turn-on voltage and the second turn-on voltage is raised from an off-voltage level to an on-voltage level with a stepwise type.

* * * * *